(12) United States Patent
Myles

(10) Patent No.: US 11,320,850 B1
(45) Date of Patent: May 3, 2022

(54) VOLTAGE SELECTION CIRCUIT

(71) Applicant: Dialog Semiconductor B.V., s-Hertogenbosch (NL)

(72) Inventor: Andrew John Myles, Edinburgh (GB)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 17/167,550

(22) Filed: Feb. 4, 2021

(51) Int. Cl.
 *G05F 3/26* (2006.01)
 *H03K 19/20* (2006.01)
 *H03K 17/00* (2006.01)

(52) U.S. Cl.
 CPC ............. *G05F 3/26* (2013.01); *H03K 19/20* (2013.01)

(58) Field of Classification Search
 CPC .. H03K 17/693; H03K 17/005; H03K 17/162; H03K 17/302; H03K 2217/0036; H02J 1/10; H02J 9/061; H02J 3/382; G06F 1/26; G06F 1/263
 USPC ............................. 327/407, 408, 530; 307/80
 See application file for complete search history.

(56) References Cited

U.S. PATENT DOCUMENTS

| | | | | |
|---|---|---|---|---|
| 6,566,935 | B1 * | 5/2003 | Renous ...................... | G05F 1/59 327/408 |
| 7,626,444 | B2 | 12/2009 | Clewett et al. | |
| 9,966,793 | B2 * | 5/2018 | Batra ....................... | H02J 9/061 |
| 2019/0187738 | A1 * | 6/2019 | Neri .......................... | H02J 1/10 |

FOREIGN PATENT DOCUMENTS

EP 2 110 936 A1 10/2009

OTHER PUBLICATIONS

The Art of Electronics, Second Edition, Paul Horowitz and Winfield Hill, Copyright, Cambridge University Press, NY, 1989, ISBN 0-521-37095-7, Figure 1.83.
"Precision rectifier," WikipediA, 3 pages, Retrieved from: https://en.wikipedia.org/w/index.php?title=Precision_rectifier&oldid=990593232.
Electronics Weekly.com, "An Engineer in Wonderland," by Steve Bush, Jun. 6, 2013, pp. 1-5, found: https://www.electonicsweeklu.com/blogs/engineer-in-wonderland/bipolar-active-bridge-patented-after-years-of-use-the-cheek-ot-it-2013-06/.
"Max-Supply Selector Using a Supply Voltage Comparator," by Mandal et al., International Conference, MIXDES 2006 Gdynia, Poland, Jun. 22-24, 2006, pp. 327-331.
"1-V Power Supply CMOS Cascode Amplifier," IEEE Journal of Solid-State Circuits, vol. 36, No. 7, Jul. 2001, pp. 1082-1086.

* cited by examiner

*Primary Examiner* — Quan Tra
(74) *Attorney, Agent, or Firm* — Saile Ackerman LLC; Stephen B. Ackerman

(57) ABSTRACT

A voltage selection circuit for selecting a voltage from a plurality of input voltages comprising a plurality of diodes, each diode having a first terminal coupled to one of the input voltages, and a current sensor configured to sense a current flow through each diode, wherein the selected voltage is dependent on the sensed current flow. In operation, the circuit functions as a comparator to detect the maximum among the input voltages. The comparator decision is used to close one or more of the power switches to ensure that the load is powered from the highest input voltage.

17 Claims, 38 Drawing Sheets

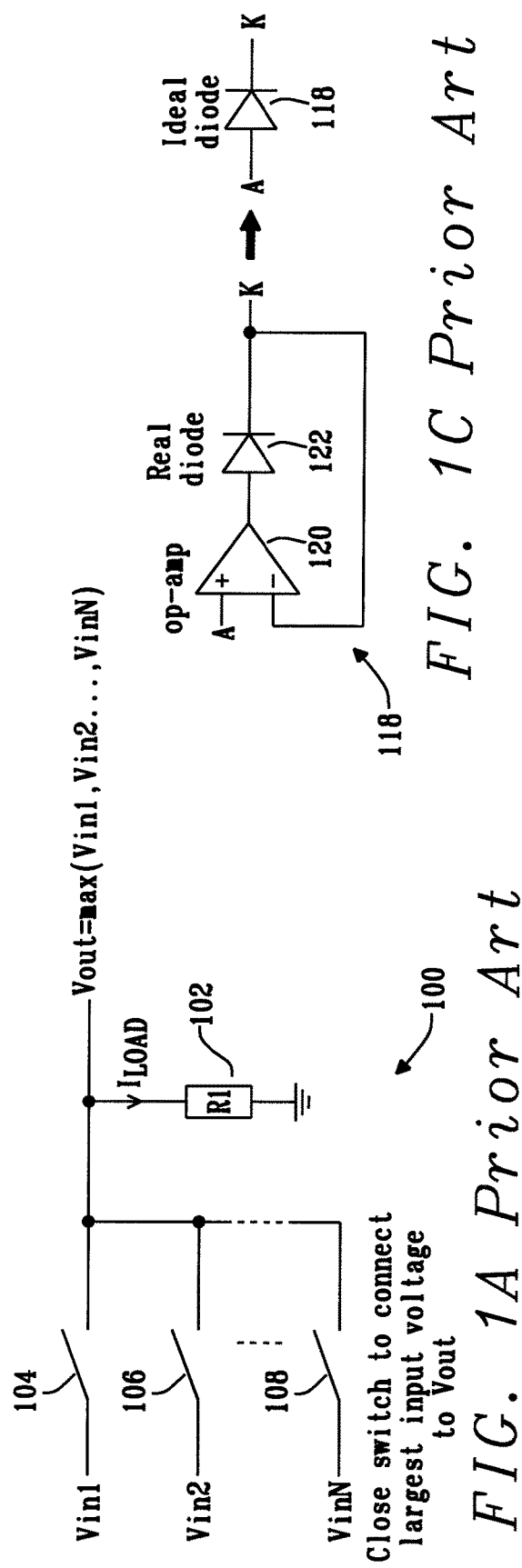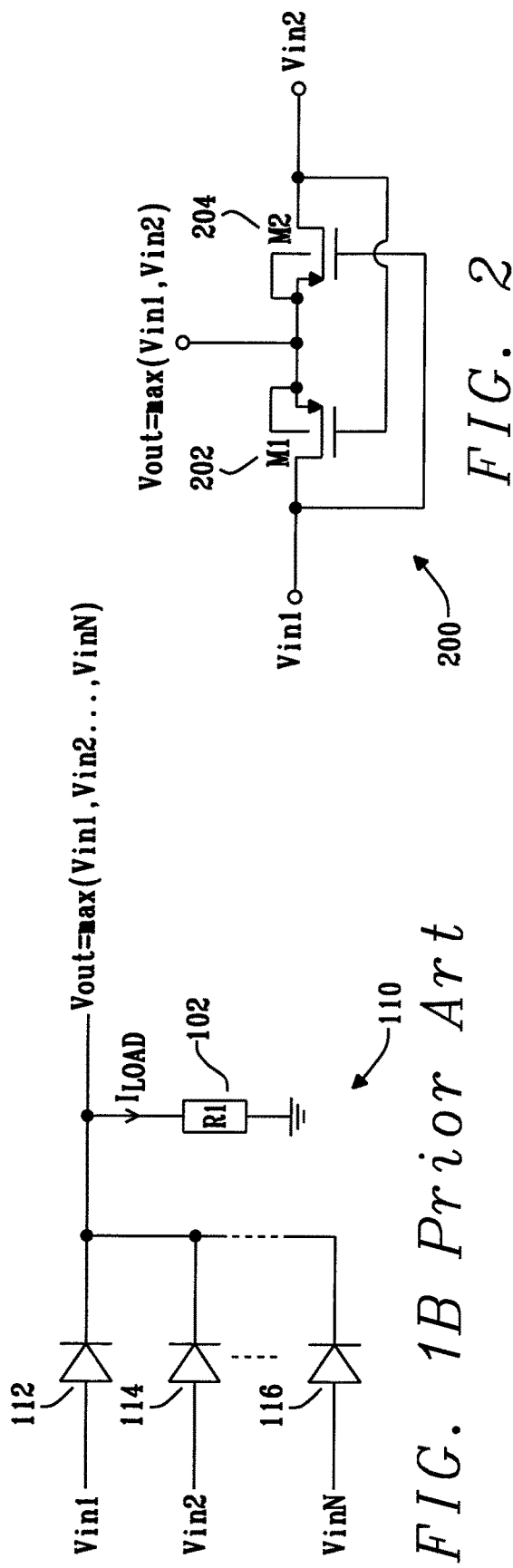

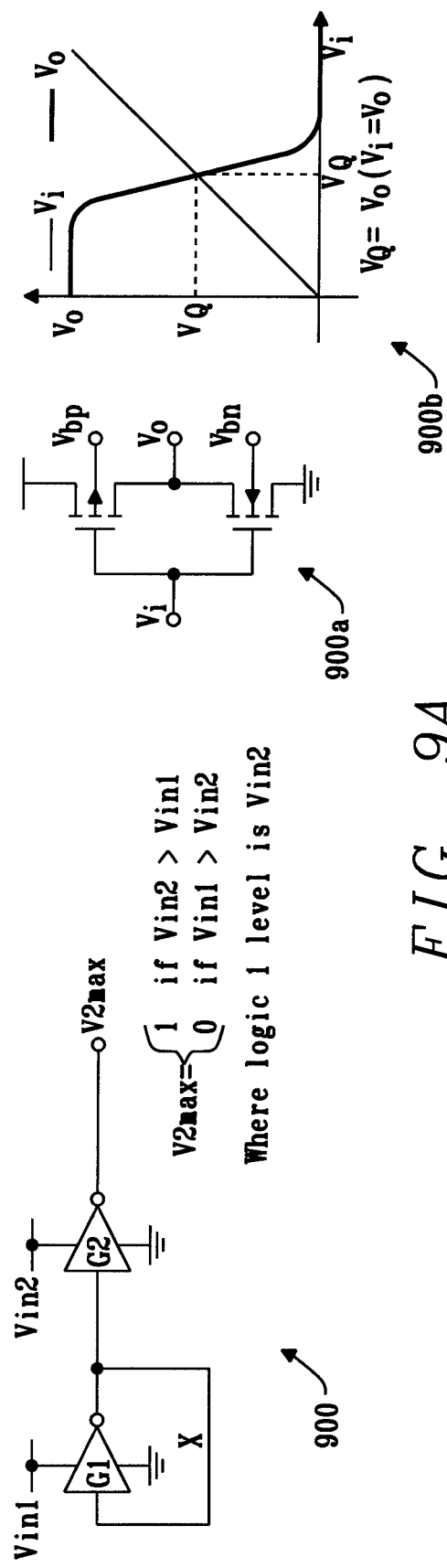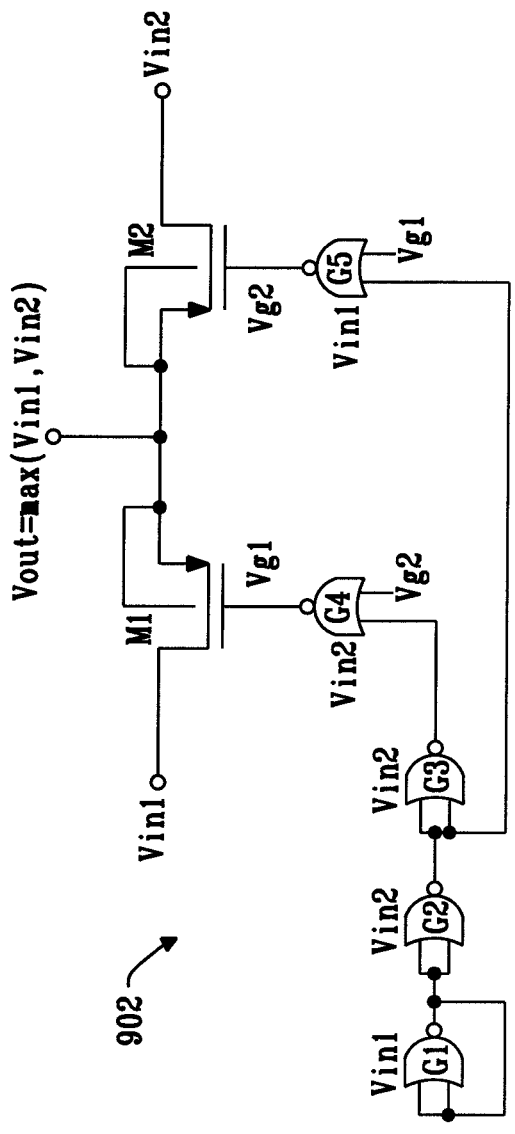
FIG. 9A
FIG. 9B

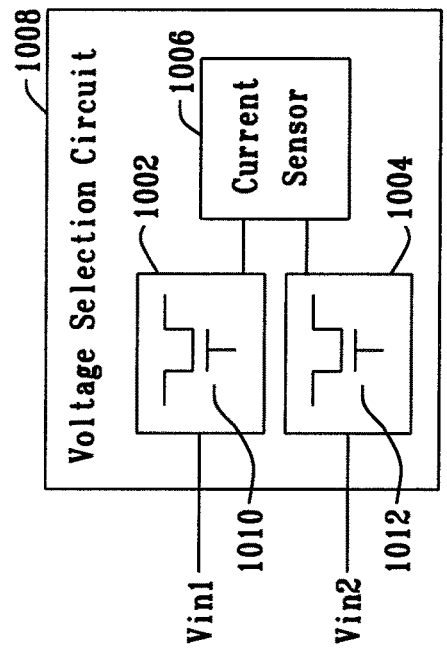
FIG. 10A
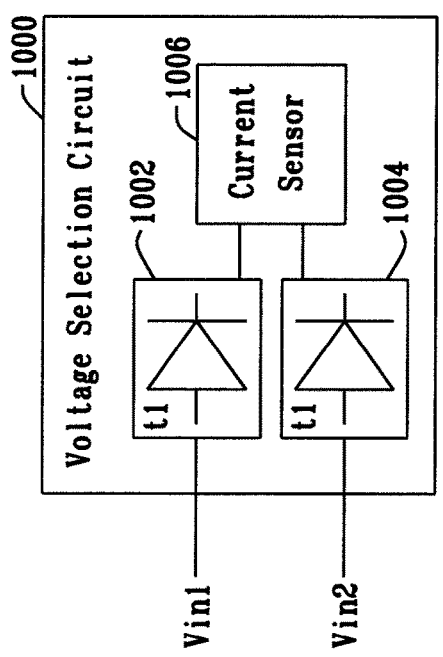
FIG. 10B
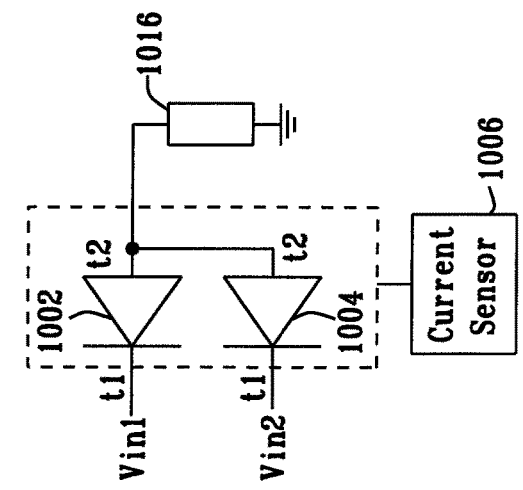
FIG. 10E
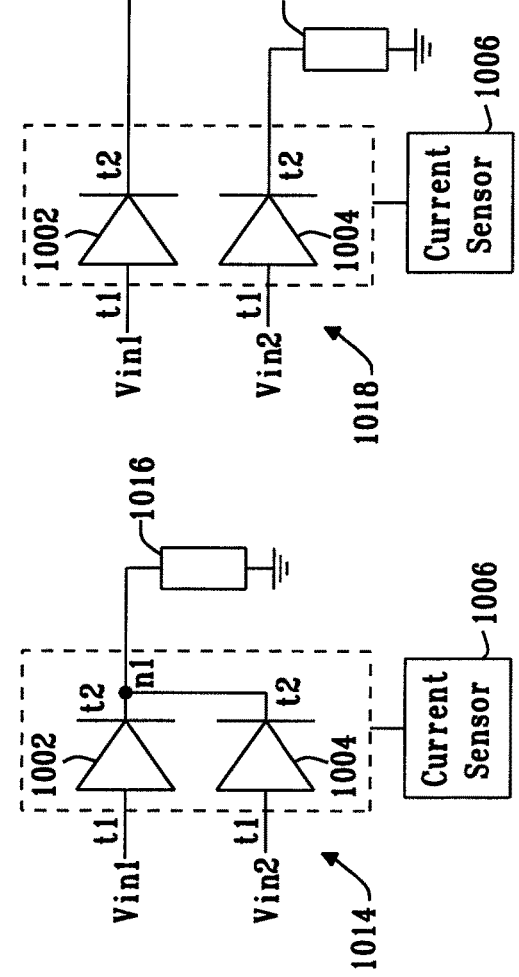
FIG. 10D
FIG. 10C

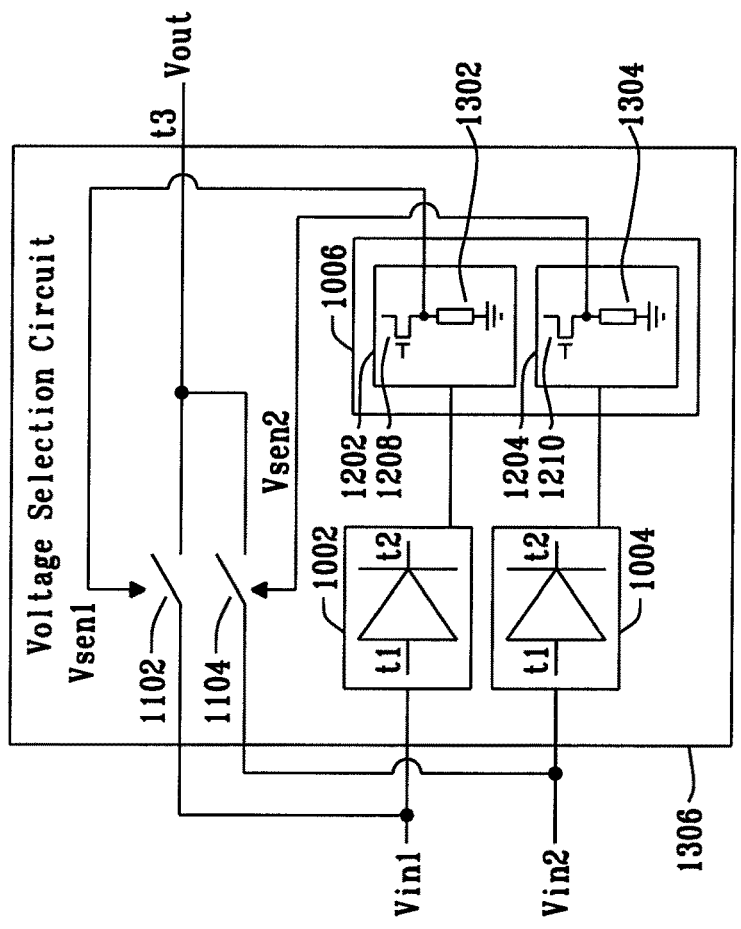
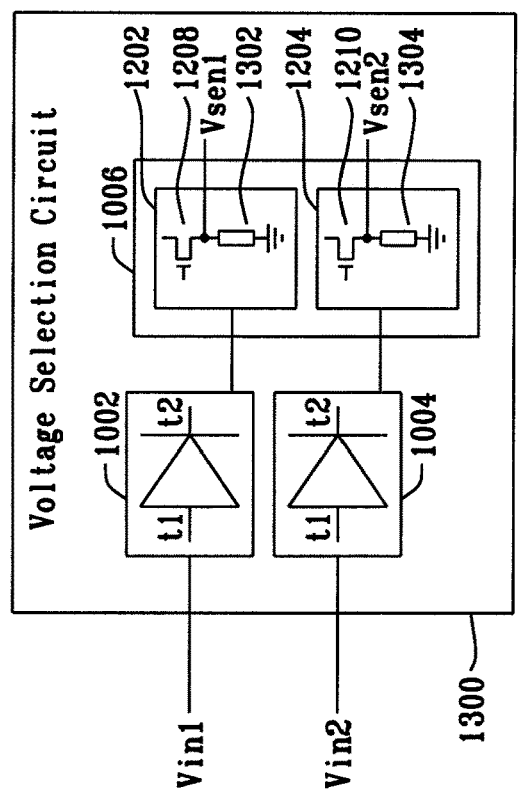
FIG. 13B
FIG. 13A

VOLTAGE SELECTION CIRCUIT

TECHNICAL FIELD

The present disclosure relates to a circuit for selecting a voltage. In particular, the present disclosure relates to a voltage selection circuit for selecting a voltage from a plurality of input voltages.

BACKGROUND

FIG. 1A is a schematic of a switch-based maximum voltage selector 100 in accordance with the prior art. The selector 100 is capable of directly driving a load 102 using an input voltage (Vin1, Vin2 . . . VinN) when it is coupled to the load 102 via a closed switch.

Each input voltage may be selectively coupled to the load 102 via a switch 104, 106, 108. In operation the switch 104, 106, 108 associated with the maximum of the input voltages is closed, whilst the other switches remain open.

FIG. 1B is a schematic of a diode-based maximum voltage selector 110 in accordance with the prior art. The selector 110 is capable of directly driving the load 102 using the input voltage (Vin1, Vin2 . . . VinN) with the largest value. Each input voltage is coupled to the load 102 via a diode 112, 114, 116.

FIG. 1C is a schematic of a circuit 118 that can provide an approximation of an ideal diode which may, for example, be provided as an implementation for the diodes 112, 114, 116. The circuit 118 comprises an op-amp 120 and a real diode 122.

The selector 110 of FIG. 1B may be referred to as a diode network, which is for automatically selecting a maximum supply voltage. This circuit is seen commonly in battery back-up applications where a system has an internal power supply rail(s) powered primarily from an external supply (FIG. 1.83 on page 49, "The Art of Electronics", P. Horowitz & W. Hill, 2nd edition, Cambridge University Press, 1990), but if the supply is removed then internal supply rail(s) must switch immediately to a (lower voltage) back-up battery without risking browning-out the internal rail(s) through any switch-over dead-time that leaves the internal rail(s) floating.

The selector 110 requires no additional power supplies beyond the input voltages to provide the power demanded by the load 102; it is self-powered. If the diodes 112, 114, 116 are ideal (0 V forward voltage drop with no internal resistance and prefect reverse blocking) then:

$$V\text{out}=\max(V\text{in1},V\text{in2},\ldots,V\text{inN})$$

and load current is supplied only from the largest input voltage source with all other diodes reverse-blocking. However, real diodes have a forward voltage drop when conducting current to a load 102 (typically 0.2-0.3 V for Schottky or germanium diodes, 0.7 V for silicon diodes—possibly more if diode forward resistance cannot be reduced) so that in practice, for silicon PN junction diodes:

$$V\text{out}\approx\max(V\text{in1},V\text{in2},\ldots,V\text{inN})-0.7\text{ V}.$$

In some applications the 0.7 V drop is unacceptable.

Ideal diodes can be implemented accurately using active circuits (e.g. sections 4.15-4.17, "The Art of Electronics", P. Horowitz & W. Hill, 2nd edition, Cambridge University Press, 1990), e.g. FIG. 1C and this implementation can provide an ideal rectifier network as the selector 110. These are useful for applications such as analog computing, but they are usually not useful for driving the load 102 because:

The output is driven by an op-amp(s) 120 not the input voltages. Using the op-amp 120 to drive the load 102 entails difficulties related to ensuring amplifier stability under possibly widely varying load impedances, designing the op-amp 102 for high output power handling etc.

The diode 122's forward voltage drop must still be overcome, requiring a supply voltage higher than any of the input voltages for the op-amp 102, which may not be available; even if a higher supply is available, the op-amp 102 power dissipation could be considerable, giving heating problems and/or low power transfer efficiency.

FIG. 2 is a schematic of a 2-input cross-coupled maximum selection switch circuit 200. The circuit 200 uses pMOS transistors, however it will be appreciated that other transistor types may be used. The circuit 200 comprises transistors 202, 204. The transistor 202 is also labelled "M1", and the transistor 204 is also labelled "M2".

The circuit 200 outputs the larger of its two input voltages, Vin1 and Vin2, by connecting the larger input voltage to the circuit 200 output via a switch (M1 or M2). The circuit 200 comprises two pMOS power switches, M1 and M2. Each switch M1, M2 couples one of the input voltages Vin1, Vin2 to the output and the switch gate is driven by the other input voltage Vin1, Vin2. Both FETs M1, M2 have their bulk connected to the output voltage Vout to bias all bulks to the highest voltage and ensure all bulk-drain/source diodes stay reverse-biased.

The circuit 200 of FIG. 2 is simple and draws no current other than the load current but has a problem when both input voltages Vin1, Vin2 are equal (or nearly equal). pMOS FETs have a threshold voltage, VTHP, and the gate voltage must be VTHP volts below the source (or drain) voltage for a conducting channel to form between the drain and source terminals (commonly referred to as the FET being "turned on"). If Vin1=Vin2 then the desired Vout=max(Vin1, Vin2)= Vin1=Vin2, but this means both M1 and M2 have VGS=0 and so they will be turned-off (|VGS|<VTHP) and the output voltage Vout floats.

In practice, if the load current is drawn then the output voltage Vout will droop until one or both of the switches M1, M2 turn on again, i.e. there is a dead-zone roughly ±VTHP wide around Vin1=Vin2 (where VTHP is the pMOS threshold voltage) in which the output voltage Vout is driven only weakly via high switch resistances. FIG. 3 is a graph showing results from a simulation of the circuit 200, using simulation parameters that are representative of a practical implementation of the circuit 200. FIG. 3 is an example operation of the circuit 200, showing the dead-zone problem when Vin1 is approximately equal to Vin2.

FIG. 3 shows a trace 300 of the input voltage Vin1 as it varies with time, a trace 302 of the input voltage Vin2 as it varies with time, a trace 304 of the output voltage Vout as it varies with time, a trace 306 of the maximum voltage Vmax as it varies with time, and a trace 308 of the load current as it varies with time.

The trace 304 shows the output voltage Vout as output by the circuit 200, and the trace 306 shows the ideal output voltage which corresponds to the maximum voltage Vmax of the two input voltages Vin1, Vin2. For ideal operation of the circuit 200, the traces 304 and 306 should be equal.

The following parameters were used in the simulation:
0 V≤Vin1≤1.2 V and 0≤Vin2≤1.8 V and driving a 2 kΩ resistive load.

The circuit implements M1 and M2 using pMOS FETs with VTHP≈0.64 V.

When Vin1=1.2 V or Vin2=1.8 V and the other input voltage=0V then Vout is switched strongly to the highest input voltage (the traces 304 and 306 are almost identical) even while driving load current, i.e. the circuit 200 operates as desired.

However, when Vin1 and Vin2 come within ≈0.64 V of each other both pMOS begin to turn off and Vout droops significantly (by up to 0.7 V in this example) below the desired Vout=max(Vin1, Vin2).

Also, Vout does not track max(Vin1, Vin2) well when Vin1 and Vin2 are below the pMOS threshold voltage as there is insufficient gate drive to properly turn on M1 or M2.

The output voltage Vout droop caused by the dead-zone can be a problem in some applications.

FIG. 4 is a schematic of a known improved 2-input cross-coupled maximum selection switch circuit 400 with a latch. The circuit 400 may be referred to as a cross-coupled pMOS switch with a latch.

The circuit 400 is a development of the circuit 200 that uses a latch to ensure that one switch, M1 or M2, is always fully closed (gate pulled to ground for maximum possible VGS), and so avoid droop caused by both switches being off/weakly conductive when Vin1≈Vin2. Switches M3 and M4 with loads R1 and R2 form a cross-coupled latch driven by input voltages Vin1 and Vin2.

When Vin1>Vin2, M3 conducts pulling Vg2 to Vin1, turning off M2 and M4. With M4 off, R2 pulls Vg1 to ground, ensuring M3 and M1 conduct strongly. M1 turned on (conducting) connects Vin1 to Vout as required.

When Vin2>Vin1, M4 conducts pulling Vg1 to Vin2, turning off M1 and M3. With M3 off, R1 pulls Vg2 to ground, ensuring M2 and M4 conduct strongly. M2 turned on connects Vin2 to Vout as required.

The latches are shown with resistive loads, but current sources, long-channel MOSFETs with large output conductance to emulate resistors, etc. can also be used as loads. It is also possible to use a latch with resistive pull-up and cross-coupled nMOS active pull-down. In all cases the basic operating principle is identical: use a voltage-driven latch to determine which of Vin1 or Vin2 is largest.

The M3 and M4 bulks are shown connected to Vout so that they can share a common N-well with M1 and M2 in integrated implementations, but the M3 bulk could also connect to Vin1 and the M4 bulk to Vin2.

FIG. 5 and FIG. 6 are graphs showing results from a simulation of the circuit 400, over different time scales and using simulation parameters that are representative of a practical implementation of the circuit 400.

FIG. 5 and FIG. 6 shows a trace 500 of the input voltage Vin1 as it varies with time, a trace 502 of the input voltage Vin2 as it varies with time, a trace 504 of the output voltage Vout as it varies with time, and a trace 506 of the maximum voltage Vmax as it varies with time.

The trace 504 shows the output voltage Vout as output by the circuit 200, and the trace 506 shows the ideal output voltage which corresponds to the maximum voltage Vmax of the two input voltages Vin1, Vin2. As for the circuit 200, for ideal operation of the circuit 400, the traces 504 and 506 should be equal.

The following parameters were used in the simulation:
using pMOS devices with VTHP≈0.64 V,
with R1=R1=1 MΩ,
driving a 2 kΩ resistive load.

Comparing FIG. 5 to FIG. 3, the Vout dead-zone/droop problem of the circuit 200 of FIG. 2 is resolved in the circuit 400 of FIG. 4. However, FIG. 6 shows that Vout does not always track max(Vin1, Vin2) accurately; there are input voltage tracking errors near Vin1=Vin2 crossover comprising a narrow dip to a low Vout voltage just before Vout switch-over, and a Vout voltage error ≈0.4 V accumulates before Vout switches correctly to the new highest output voltage.

This tracking error arises because of the input voltage overdrive needed to flip the latch. Consider FIG. 6 at time 8 ms when Vin1=1.2 V and Vin2=0 V, Vg1=0 V and Vg2=1.2 V, and Vout is connected to Vin1. As Vin2 rises and exceeds Vin1, in order to flip the latch so that Vin2 drives Vout, M4 must turn on, which requires VGS(M4)≈VTHP; the circuit will not select the new largest input voltage until Vin2 exceeds Vg2=Vin1 by ≈VTHP. That is, there is a latch overdrive requirement that causes a Vout tracking error at input crossover. The same effect applies also when the largest voltage becomes the smallest voltage, as also seen in FIG. 6 as Vin2 ramps down from 1.8 V to 0 V. This can be a problem in low-voltage systems if the pMOS threshold voltage is high relative to the supply voltages.

Latch overdrive switching errors can be reduced by using low-VT devices for M3 or M4, if available, or by reducing the threshold voltages of M3 and M4 via the body-effect using weak forward bias of the M3 and M4 source-bulk diodes. Bulk-switching/biasing for threshold voltage reduction is a well-known prior art (e.g. See T. Lehmann, M. Cassia "1 V power supply CMOS cascode amplifier", IEE Journal of Solid-State Circuits, vol. 36, pp. 1082-1086, 2001). Bulk bias cannot reduce the threshold to 0 V though and reducing the threshold voltage too much increases off-state leakage which may inhibit correct latch function.

SUMMARY

It is desirable to provide a voltage selection circuit that overcomes or mitigates one or more of the above-mentioned problems.

According to a first aspect of the disclosure there is provided a voltage selection circuit for selecting a voltage from a plurality of input voltages comprising a plurality of diodes, each diode having a first terminal coupled to one of the input voltages, and a current sensor configured to sense a current flow through each diode, wherein the selected voltage is dependent on the sensed current flow.

Optionally, each diode comprises a transistor.

Optionally, the voltage selection circuit is configured to select a maximum voltage or a minimum voltage from the plurality of input voltages.

Optionally, each of the plurality of diodes comprises a second terminal, the voltage selection circuit comprising a resistive element, wherein the second terminals are coupled to a first node that is coupled to the resistive element, or a plurality of resistive elements wherein each of the second terminals is coupled to one of the resistive elements.

Optionally, the first terminal of each of the diodes is a cathode terminal and the second terminal of each of the diodes is an anode terminal, or the first terminal of each of the diodes is an anode terminal and the second terminal of each of the diodes is a cathode terminal.

Optionally, the voltage selection circuit comprises a plurality of power switches, wherein each power switch is configured to selectively couple one of the input voltages to an output terminal based on the selected voltage.

Optionally, each power switch comprises a power switch transistor.

Optionally, the selected voltage is the input voltage that is to be selectively coupled to the output terminal using one of the power switches.

Optionally, the current sensor is configured to sense the current flow through each of the diodes by mirroring the current flow through each of the diodes.

Optionally, the current sensor comprises a plurality of current mirrors, wherein each current mirror is i) associated with one of the diodes, and ii) configured to mirror the current flowing through its associated diode.

Optionally, each of the current mirrors comprises a current mirror transistor.

Optionally, the current sensor comprises a plurality of resistive elements, wherein each resistive element is i) coupled to one of the current mirror transistors and ii) configured to provide a sensed voltage that is dependent on the mirrored current provided to the resistive element.

Optionally, the voltage selection circuit comprises a plurality of power switches, wherein each power switch is configured to selectively couple one of the input voltages to an output terminal based on the selected voltage, and each of the power switches is configured to receive one or more of the sensed voltages, the selective coupling of each power switch being controlled by the one or more sensed voltages received by said power switch.

Optionally, each of the power switches is configured to receive one of the sensed voltages, the selective coupling of each power switch being controlled by the sensed voltage received by said power switch, each power switch comprises a transistor that comprises a gate, and the transistor has its gate coupled to the sensed voltage received by said power switch.

Optionally, each power switch comprises a logic circuit and the transistor has its gate coupled to the sensed voltage received by said power switch via the logic circuit.

Optionally, at least one of the logic circuits comprises an inverter.

Optionally, each of the power switches is configured to receive two or more of the sensed voltages, the selective coupling of each power switch being controlled by the two or more sensed voltages received by said power switch, each power switch comprises two or more transistors that each comprise a gate, and each transistor has its gate coupled to one of the two or more sensed voltages received by said power switch.

According to a second aspect of the disclosure there is provided a method of selecting a voltage from a plurality of input voltages comprising providing a plurality of diodes, each diode having a first terminal coupled to one of the input voltages, and sensing a current flow through each diode using a current sensor, wherein the selected voltage is dependent on the sensed current flow.

It will be appreciated that the method of the second aspect may include features set out in the first aspect and can incorporate other features as described herein.

BRIEF DESCRIPTION OF THE DRAWINGS

The disclosure is described in further detail below by way of example and with reference to the accompanying drawings, in which:

FIG. 1A is a schematic of a switch-based maximum voltage selector in accordance with the prior art, FIG. 1B is a schematic of a diode-based maximum voltage selector in accordance with the prior art, FIG. 1C is a schematic of a circuit that can provide an approximation of an ideal diode;

FIG. 2 is a schematic of a 2-input cross-coupled maximum selection switch circuit;

FIG. 9A is a schematic of an all-digital voltage comparator that can be used as a maximum supply voltage comparator/detector, FIG. 9B is a schematic of a 2-input maximum voltage selector circuit using an alternative embodiment of the comparator/detector of FIG. 9A.

FIG. 10A is a schematic of a voltage selection circuit for selecting a voltage from a plurality of input voltages in accordance with a first embodiment of the present disclosure, FIG. 10B is a schematic of a voltage selection circuit for selecting a voltage from a plurality of input voltages in accordance with a second embodiment of the present disclosure, FIG. 10C is a schematic of a voltage selection circuit for selecting a voltage from a plurality of input voltages in accordance with a third embodiment of the present disclosure, FIG. 10D is a schematic of a voltage selection circuit for selecting a voltage from a plurality of input voltages in accordance with a fourth embodiment of the present disclosure, FIG. 10E is a schematic of a voltage selection circuit for selecting a voltage from a plurality of input voltages in accordance with a fifth embodiment of the present disclosure.

FIG. 13A is a schematic of a voltage selection circuit in accordance with an eleventh embodiment of the present disclosure, FIG. 13B is a schematic of a voltage selection circuit in accordance with a twelfth embodiment of the present disclosure.

DESCRIPTION

As discussed previously, FIGS. 1A and 1B illustrate maximum voltage selectors in accordance with the prior art. With reference to the selector 110 of FIG. 1B, in some applications the 0.7 V drop is unacceptable, for example:
- the resulting output voltage Vout is too low in low voltage systems where 0.7V error is significant relative to the supply voltages being switched, or
- it still permits some bulk forward bias and leakage in high voltage power switching applications (because the 0.7 V can be enough to forward bias other diodes), or
- at high load currents the diode power dissipation is unacceptable and so a good, low on resistance (Ron), power switch circuit would be much preferred.

Ideal diodes can be implemented accurately using active circuits, e.g. FIG. 1C; but such active circuits are not well-suited to power switching applications.

Figure 7:
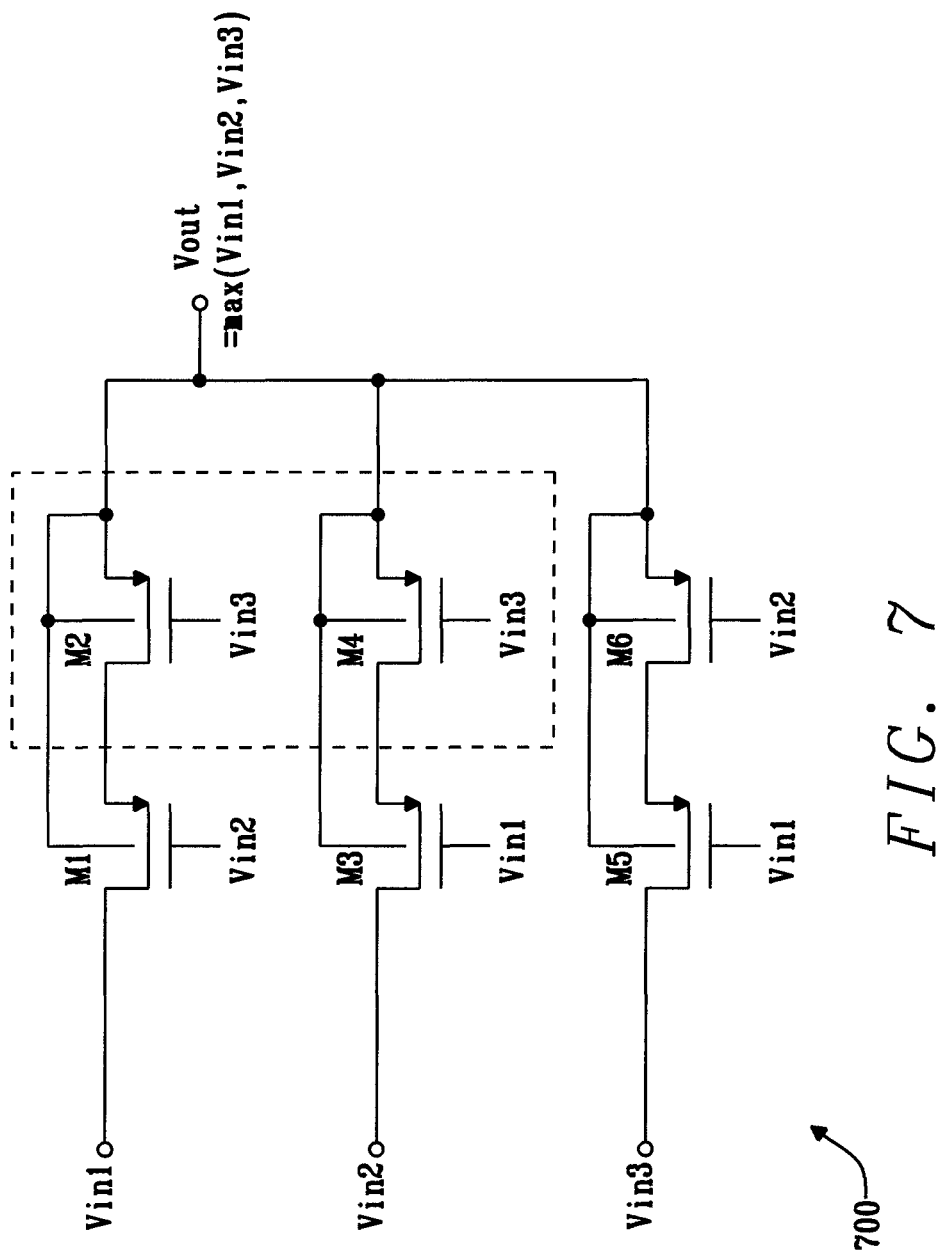
FIG. 7 is a schematic of a cross coupled maximum selector power switch for 3-inputs circuit.

FIG. 7 is a schematic of a cross coupled maximum selector power switch for 3-inputs circuit 700. This is an extension of the circuit 200 of FIG. 2. The circuit 700 can be simplified by parallel reduction of some devices, e.g. M2 and M4 could be replaced by one device to node Vout.

Figure 8:
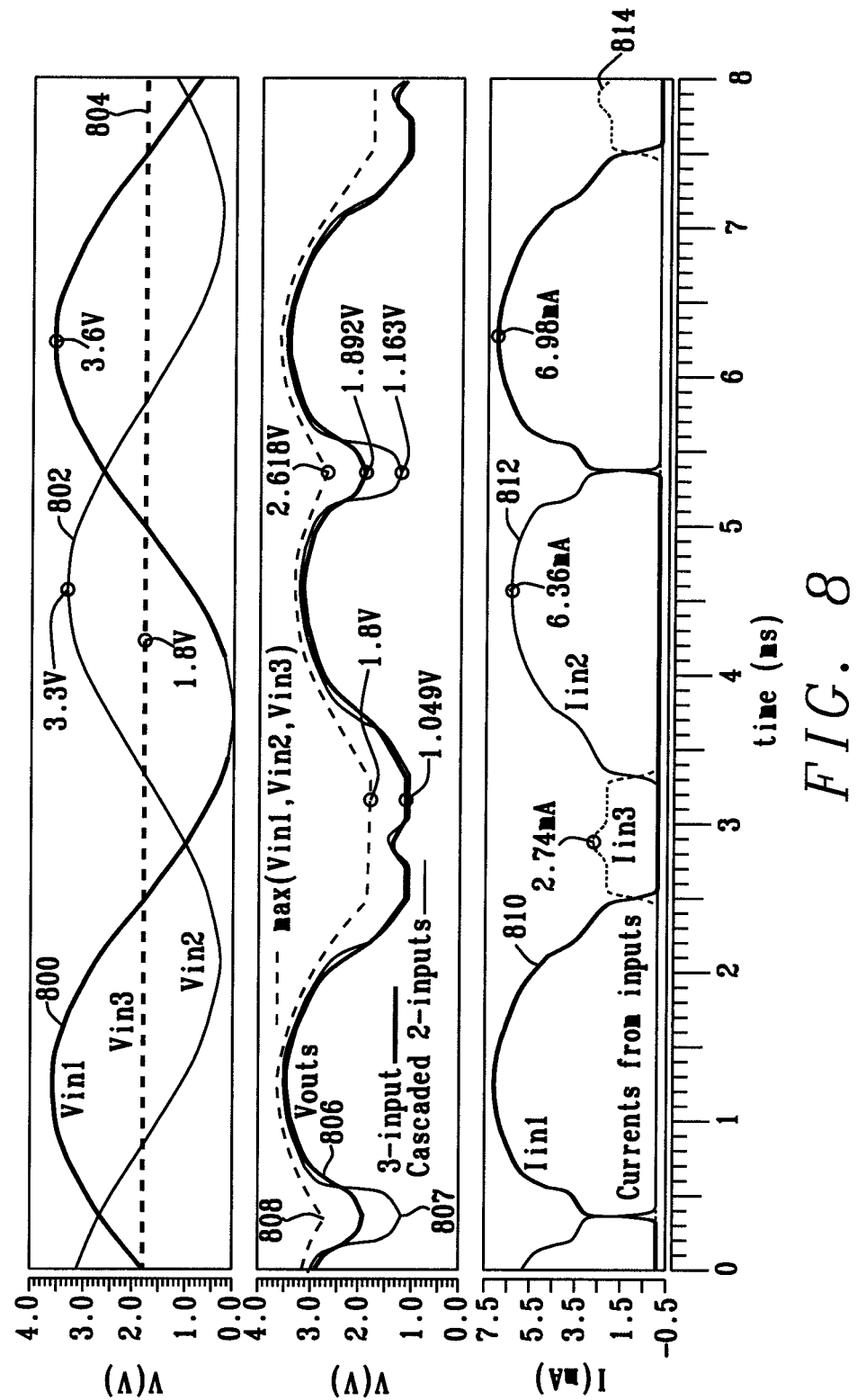
FIG. 8 is a graph showing results from a simulation of the circuit of FIG. 7.

FIG. 8 is a graph showing results from a simulation of the circuit 700, using simulation parameters that are representative of a practical implementation of the circuit 700. Additionally, results are shown for two cascaded two input voltage selectors of the type shown in FIG. 2 (circuit 200). This may be represented by Vout=max(max(Vin1, Vin2), Vin3). Both drive 1 kΩ resistive loads.

FIG. 8 shows a trace 800 of the input voltage Vin1 as it varies with time, a trace 802 of the input voltage Vin2 as it varies with time, a trace 804 of the input voltage Vin3 as it varies with time, a trace 806 of the output voltage Vout as it varies with time for the circuit 700, a trace 807 of the output voltage Vout as it varies with time for the two cascaded two input voltage selectors, a trace 808 of the maximum voltage Vmax as it varies with time, and traces of the current from the inputs Iin1, Iin2, Iin3, labelled as 810, 812, 814, respectively.

The traces 806 and 807 shows the output voltages Vout as output by the circuit 700 and the two cascade two input voltage selectors, respectively. The trace 808 shows the ideal output voltage which corresponds to the maximum voltage Vmax of the three input voltages Vin1, Vin2, Vin3. For ideal operation of the circuit 700 and the two cascade two input voltage selector, the trace 808 should equal the Vout traces of the respective circuits.

The lower traces 810, 812, 814 show the currents supplied by Vin1, Vin2 and Vin3; these inputs supply both circuits (the circuit 700 and the cascade of circuits 200), so are combined currents. The currents from the voltage inputs show abrupt transitions to and from 0 mA, indicating that both circuits are effective in switching only the highest supply to Vout as soon as one supply voltage exceeds the others.

However, both 3-input maximum selector circuits again show significant Vout droop around the transitions whenever the largest input voltages are roughly within VTHP≈0.64 V of each other. The worst droop in the 3-input maximum selector circuit is 2.62 V−1.16 V=1.46 V; this is a very large voltage error when compared to the input voltage magnitudes (0-3.6 V). The cascade circuit exhibits a worse droop because the voltage droops and switch resistances from each 2-input stage can accumulate in generating Vout.

Neither of these 3-input maximum selector circuits has a Vout waveform that tracks the ideal Vout=max(Vin1, Vin2, Vin2) waveform well. As such, the 3-input selector circuits exhibit Vout droop problem when input voltages are within a threshold voltage of each other as was the case for the 2-input selector presented in FIG. 2.

FIG. 9A is a schematic of an all-digital voltage comparator that can be used as a maximum supply voltage comparator/detector 900 of the type presented in Mandal, P., P. A. A. Khan, and R. Pandey. "Max-supply selector using a voltage comparator." In Proceedings of the International Conference Mixed Design of Integrated Circuits and System, 2006. MIXDES 2006, pp. 327-331. IEEE, 2006. Any logic family can be used provided gate G1 can self-bias at its switching point. For example, static CMOS logic (shown by a circuit 902 and its transfer function graph 904) or, in the examples shown in Mandal et. al, pMOS input logic with nMOS current source loads.

FIG. 9B is a schematic of a 2-input maximum voltage selector circuit 902 using an alternative embodiment of the comparator/detector 900 of FIG. 9A that uses NOR gates G1 and G2 in place of inverters of FIG. 9A, and with additional NOR-based SR latching logic to control the power switches M1 and M2. Vin1 and Vin2 shown above each gate in FIG. 9B indicate the input voltage used to power that particular gate.

Figure 9C:
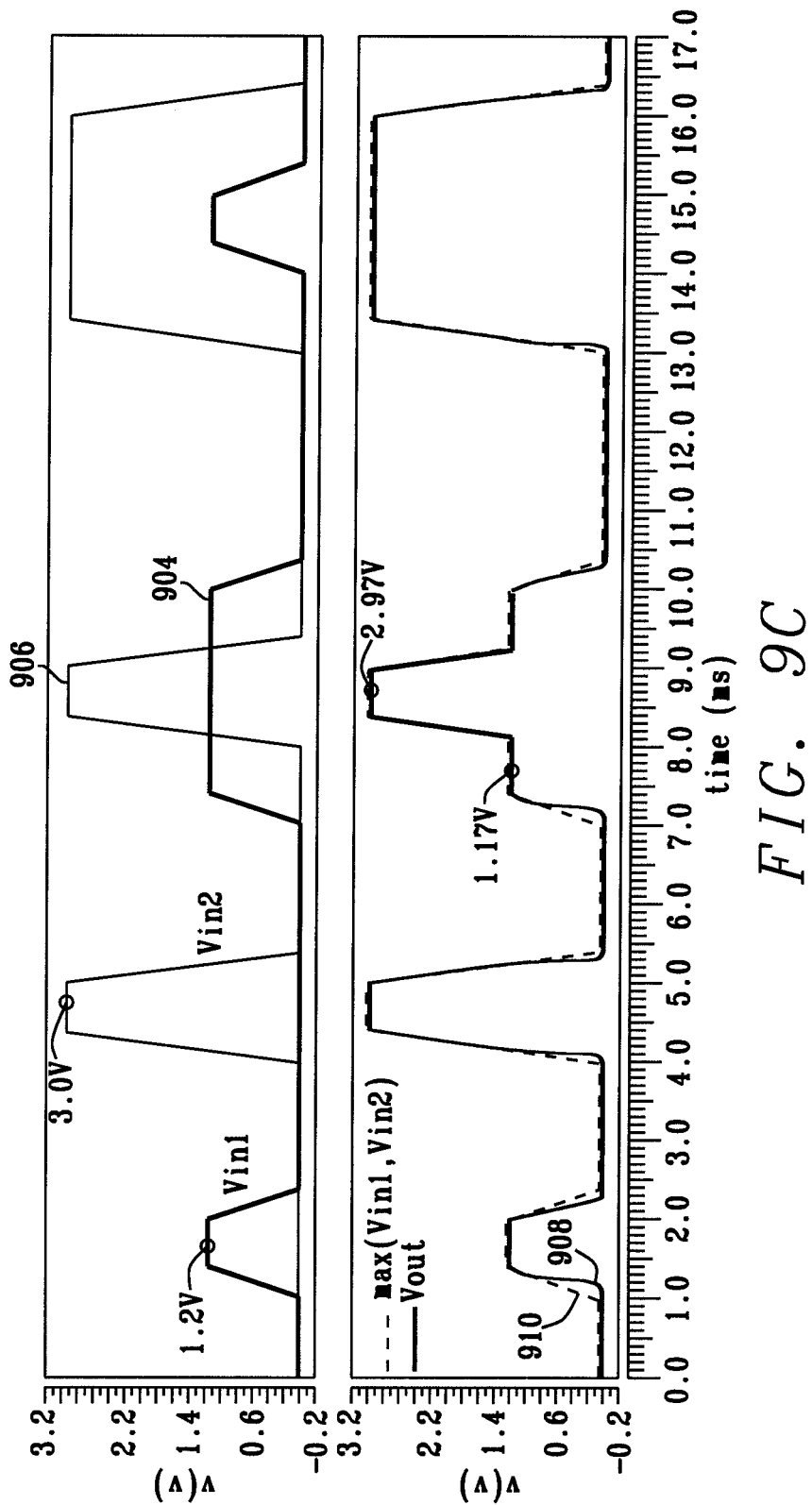
FIG. 9C is a graph showing results from a simulation of the circuit of FIG. 9B.

FIG. 9C is a graph showing results from a simulation of the circuit 902, using simulation parameters that are representative of a practical implementation of the circuit 902.

FIG. 9C shows a trace 904 of the input voltage Vin1 as it varies with time, a trace 906 of the input voltage Vin2 as it varies with time, a trace 908 of the output voltage Vout as it varies with time, and a trace 910 of the maximum voltage Vmax as it varies with time.

FIG. 10A is a schematic of a voltage selection circuit 1000 for selecting a voltage from a plurality of input voltages Vin1, Vin2 in accordance with a first embodiment of the present disclosure. The voltage selection circuit 1000 comprises a plurality of diodes 1002, 1004 with each diode having a first terminal t1 coupled to one of the input voltages Vin1, Vin2.

In the present example, the circuit 1000 is configured to select a voltage from two input voltages Vin1, Vin2 such that the circuit 1000 comprises two diodes 1002, 1004. It will be appreciated that in further embodiments there may be more than two input voltages from which a voltage is to be selected, meaning that there will also be more than two diodes. Preferably, there will be an equal number of input voltages and diodes, such that each input voltage is associated with a unique diode.

In the present example, the first terminal t1 is labelled as the anode terminal of the diodes, however it will be appreciated that in further embodiments, the first terminal t1 may be the cathode terminal, in accordance with the understanding of the skilled person.

The circuit 1000 further comprises a current sensor 1006 configured to sense a current flow through each diode 1002, 1004, wherein the selected voltage is dependent on the sensed current flow. For example, the current sensor 1006 may be configured to sense the current flow through each of the diodes 1002, 1004 by mirroring the current flow through each of the diodes 1002, 1004.

In a preferred embodiment the voltage selection circuit 1000 is configured to select a maximum voltage from the plurality of input voltages Vin1 Vin2. In further embodiments, the circuit 1000 may be configured to select a minimum voltage from the plurality of input voltages Vin1, Vin2. In further embodiments, the circuit 1000 may be configured to select the voltage based on another criterion, for example the second highest voltage from a three or more input voltages.

FIG. 10B is a schematic of a voltage selection circuit 1008 for selecting a voltage from a plurality of input voltages Vin1, Vin2 in accordance with a second embodiment of the present disclosure. The circuit 1008 is a specific embodiment of the circuit 1000 where each diode 1002, 1004 comprises a transistor 1010, 1012.

FIG. 10C is a schematic of a voltage selection circuit 1014 for selecting a voltage from a plurality of input voltages Vin1, Vin2 in accordance with a third embodiment of the present disclosure.

For the voltage selection circuit 1014 each of the plurality of diodes 1002, 1004 comprises a second terminal t2 and the voltage selection circuit 1014 comprises a resistive element 1016. The second terminals t2 are coupled to a first node n1 that is coupled to the resistive element 1016. The resistive element 1016 may, for example, be a resistor or a current source.

It will be appreciated that in the embodiments presented herein, resistors may be shown coupled to ground. It will be appreciated that rather than ground, the resistors may otherwise be coupled to an appropriate voltage source in accordance with the understanding of the skilled person.

FIG. 10D is a schematic of a voltage selection circuit 1018 for selecting a voltage from a plurality of input voltages Vin1, Vin2 in accordance with a fourth embodiment of the present disclosure.

In the present embodiment, the voltage selection circuit 1018 comprises a plurality of resistive elements 1020, 1022 where each of the second terminals t2 is coupled to one of the resistive elements 1020, 1022. In the present example the first terminal t1 of each of the diodes 1002, 1004 is an anode terminal and the second terminal t2 of each of the diodes 1002, 1004 is a cathode terminal. The resistive elements 1020, 1022 may, for example, be resistors or current sources.

It will be appreciated that in the circuit 1014 of FIG. 10C, current will only flow through the diode 1002, 1004 that is coupled to the highest of the input voltages Vin1, Vin2. However, in the circuit 1018 of FIG. 10D current will flow through both diodes 1002, 1004, irrespective of which input voltage Vin1, Vin2 is greater.

The role of the current sensor 1006 in the circuit 1014 may simply be to detect the presence of a current flowing through one of the diodes 1002, 1004 to determine the maximum input voltage Vin1 Vin2. In the circuit 1018, the current sensor 1006 may, for example, evaluate the magnitude of current flow through the diodes 1002, 1004 which may be used to determine the maximum input voltage Vin1, Vin2.

The circuits of FIGS. 10A-D are configured to select the maximum voltage of the input voltages Vin1, Vin2.

FIG. 10E is a schematic of a voltage selection circuit 1024 for selecting a voltage from a plurality of input voltages Vin1 Vin2 in accordance with a fifth embodiment of the present disclosure. The circuit 1024 is configured to select the minimum voltage of the input voltages Vin1, Vin2. In the present example the first terminal t1 of each of the diodes 1002, 1004 is a cathode terminal and the second terminal t2 of each of the diodes 1002, 1004 is an anode terminal.

Figures 10F, 10G:
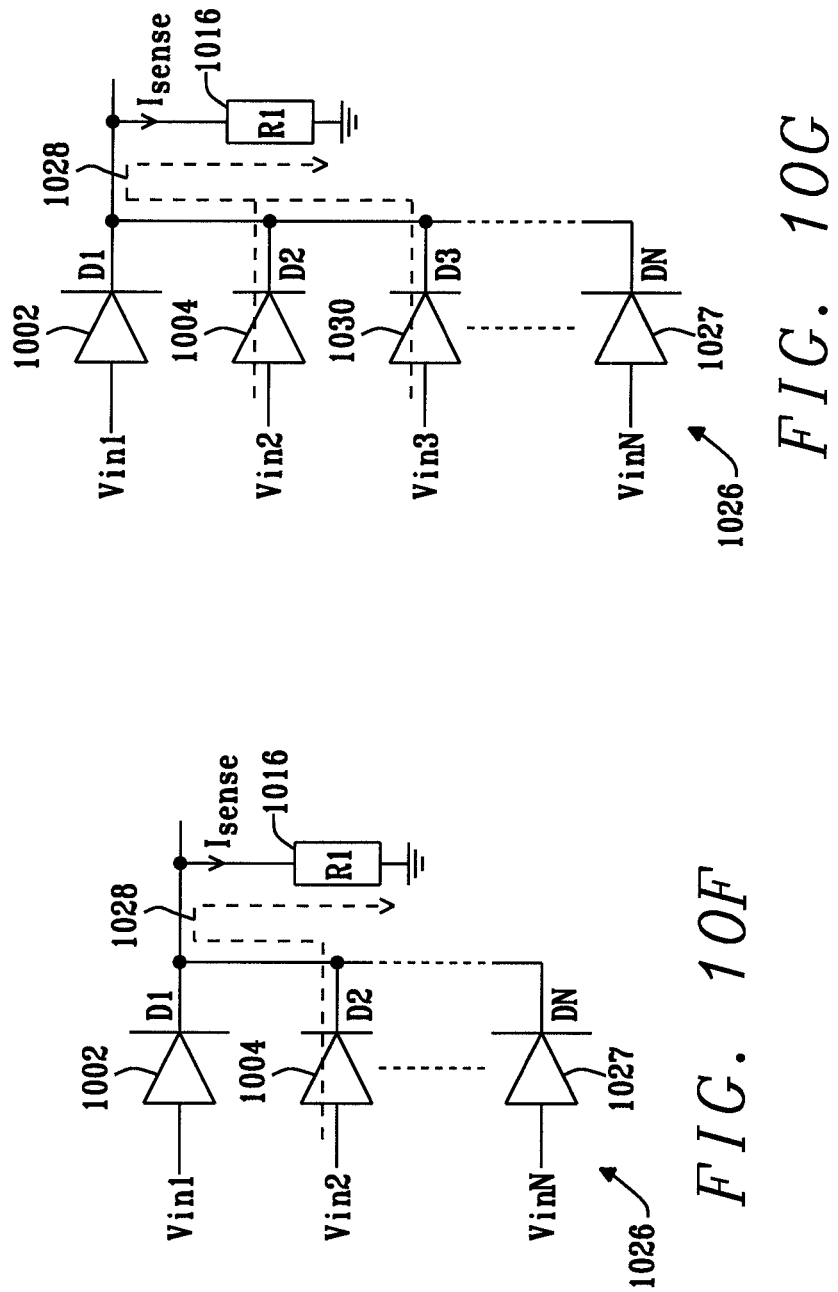
FIG. 10F is a schematic of a voltage selection circuit for selecting a voltage from a plurality of input voltages and in accordance with a sixth embodiment of the present disclosure.
FIG. 10G shows an alternative example for the circuit of FIG. 10F where both input voltages Vin2, Vin3 are equal.

FIG. 10F is a schematic of a voltage selection circuit 1026 for selecting a voltage from a plurality of N input voltages, where N is an integer, and in accordance with a sixth embodiment of the present disclosure.

FIG. 10F shows a generalisation of the circuit 1014 (the current sensor 1006 has been omitted from the drawing) by extending from two diodes and two input voltages to N diodes and N input voltages. The N-th diode is labelled by reference numeral 1027 and the N-th input voltage is labelled VinN.

Assuming Vin2 is greater than any of the other input voltages Vin1, . . . VinN, a current will flow through the diode 1004 as illustrated by a current flow path 1028. Under these conditions, only the diode 1004 conducts. This means that the current sensor 1006 can detect that current is flowing through the diode 1004 and detection of current flowing through the diode 1004 means that it is known that the voltage Vin2 is the greatest of the input voltages.

FIG. 10G shows an alternative example for the circuit 1026 where both input voltages Vin2, Vin3 are equal. A further diode 1030 is shown. Having two or more equal highest input voltages provides similar characteristics to the case where there is a single highest input voltage. All diodes connected to the highest inputs will conduct, so it is known from the current sensor 1006 that all these voltages are equal and highest among the input voltages.

Figure 11A:
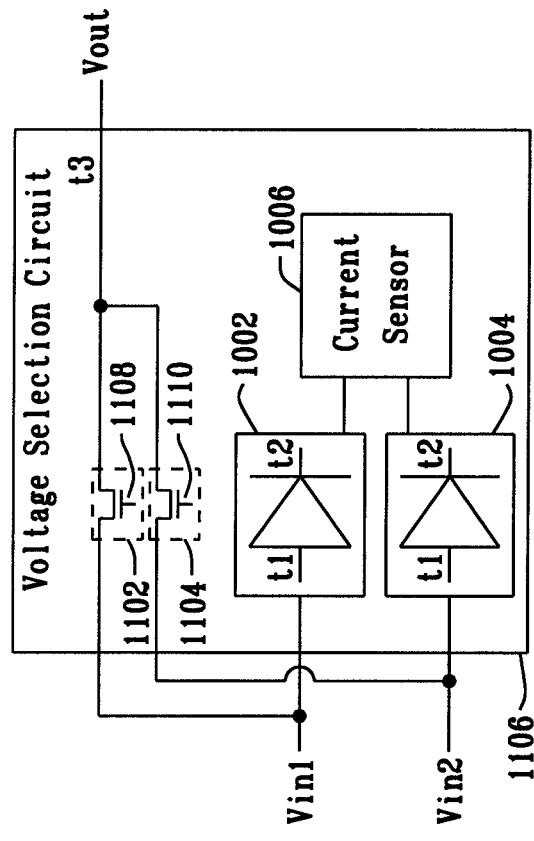
FIG. 11A is a schematic of a voltage selection circuit for selecting a voltage from a plurality of input voltages in accordance with a seventh embodiment of the present disclosure.

FIG. 11A is a schematic of a voltage selection circuit 1100 for selecting a voltage from a plurality of input voltages in accordance with a seventh embodiment of the present disclosure.

The voltage selection circuit 1100 comprises a plurality of power switches 1102, 1104. Each power switch 1102, 1104 is configured to selectively couple one of the input voltages Vin1, Vin2 to an output terminal t3 based on the selected voltage. For example, assuming the voltage selection circuit 1100 is configured to detect the maximum voltage and Vin1 is greater than Vin2. The current sensor 1006 will detect current flow through the diode associated with the maximum voltage Vin1 (for example diode 1002). Using this information, the circuit 1100 will "select" the input voltage Vin1, such that the selected voltage is Vin1. The circuit 1100 will then close the switch 1102, whilst leaving switch 1104 open. In this case the input voltage Vin1 will be coupled to the output terminal t2, and the circuit 1100 will provide an output voltage Vout that is equal to the input voltage Vin1.

In the present example, the selected voltage is the input voltage that is to be selectively coupled to the output terminal using one of the power switches. It will be appreciated that further configurations are possible, in accordance with the understanding of the skilled person.

The output voltage Vout may be provided to a load such that when coupled to the load via the power switch, the coupled input voltage Vin1, Vin2 may function as a power source for the load. In operation, the circuit 1100 functions as a comparator to detect the maximum among several voltages. The comparator decision is used to close one or more of the power switches to ensure that the load is powered from the highest input voltage (s).

In a preferred embodiment, the output voltage Vout of the circuit 1100 is the largest voltage out of the input voltages Vin1, Vin2, Vin3 and may be represented as follows:

$$Vout=max(Vin1, Vin2, Vin3, \ldots)$$

It will be appreciated that the schematic shows two input voltages, however this circuit 1100 may be modified to select the maximum of N input voltages, where N is an integer.

In a preferred embodiment, the aim of the circuit 1100 is to switch seamlessly between multiple varying input voltages to always output the maximum voltage to supply a load.

Maximum voltage selection may be applied to managing systems with multiple power supplies which can be powered up/down independently. One example of such an application is systems where an internal supply rail must automatically switch to a back-up battery whenever external power is removed. A common problem in multi-supply systems is biasing the N-Wells of pMOS power switches to the highest system voltage to guard against strong forward bias of their bulk-source junctions when one or more supplies is powered down, to avoid unwanted high currents that may drain batteries or even cause device damage.

The type of maximum voltage selector described herein generates its output voltage by switching the largest input voltage or largest input voltages directly to the circuit output, which follows the procedure illustrated in FIG. 1A as is known in the prior art. The circuits of the present disclosure do not need to output "buffered copies" of their input voltages, as far example will be the case if FIG. 1B is implemented using the op-amp based ideal diode of FIG. 1C and they do not need to generate any internal voltages larger than the biggest input voltage to function, as for example will be the case if FIG. 1B is implemented using the op-amp based ideal diode of FIG. 1C i.e. they can be powered directly from the inputs Vin1, Vin2, . . . VinN.

If the inputs are power supply voltages and the switches are power switches, then automatic powering of the load from the highest supply rail present can be achieved using this type of circuit.

The voltage selection circuits described herein do not employ feedback and so are stable against oscillation regardless of the load impedance being powered.

The voltage selection circuits as described herein can be used to avoid output voltage errors that are present in known circuits, such as the dead-zone problem of the circuit 200. The voltage selection circuits as described herein are not limited to selection from two voltages, but can be extended to N voltage selection, where N is an integer.

Desirable behaviours of any maximum voltage selector, as exhibited by the circuit 1100 and the other circuits described herein in accordance with the understanding of the skilled person are as follows:

Ideally the output voltage should be as close as possible to the largest input voltage. Voltage errors should be as small as possible.

Low power dissipation possible relative to load power delivered.

Minimal circuit stability concerns/considerations.

Fast switching between inputs. The output is preferably be driven by at least one input.

Undesirable behaviours to avoid, and which are not exhibited by the circuit 1100 and the other circuits described herein in accordance with the understanding of the skilled person are as follows:

Any output voltage tracking errors, e.g. dead-zones in which the output floats undriven, or having the output not necessarily switching to the new highest voltage when the input voltages are changing.

Needing any power supplies over and above those being switched to the load (i.e. self-powered, autonomous switching sought).

Output brown-out caused by any dead-times where the output is undriven when switching between inputs (e.g. hard break-before-make switching)

Being limited to selecting between only 2 input voltages.

In a further embodiment a plurality of 2-input maximum voltage selector circuits (for example, an embodiment of the circuit 1100 having only two inputs) can be used to select the largest of more than two voltages by using tree networks of 2-input selectors to perform pair-wise comparisons. FIG. 11B is a schematic of a cascaded maximum voltage selector circuit 1112 for outputting the highest voltage of 3 input voltages, and comprising two 2 maximum input voltage selector circuits 1114, 1116, and in accordance with an embodiment of the present disclosure.

With 3 voltages Vin1, Vin2 and Vin3, any two 2-input selectors can be cascaded to obtain the largest output voltage, e.g.: Vout=max (Vin1, max(Vin2, Vin3)). In operation, the first of the two selectors would determine the largest voltage out of the input voltages Vin2, Vin3, and output the largest of the voltages Vin2, Vin3. The largest of the two voltages would then be provided to the second of the two selectors as an input along with the input voltage Vin1. The second selector would then output the largest of its two inputs which would correspond to the largest voltage of Vin1 Vin2, Vin3. This maximum (or minimum) voltage selection method can extend arbitrary number of input voltages by cascading additional 2-input maximum (or minimum) selectors.

Returning to FIG. 11A, when two or more input voltages are approximately equal, for example as shown in FIG. 10G, the power switches 1102, 1104 can use this information in various ways. For example, by switching both inputs to the load (at the output terminal t3), or by using a control logic circuit (or control logic circuits), to arbitrate such situations and choose only one of the equal largest inputs to switch to the load.

Figure 11C:
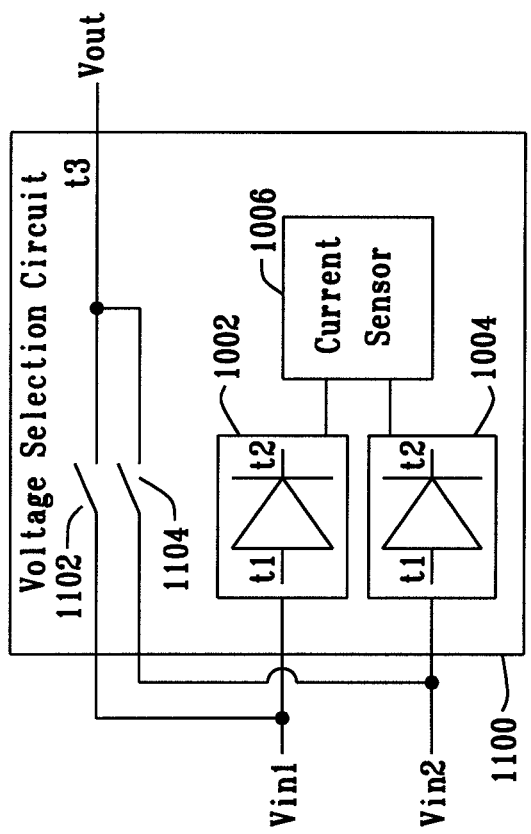
FIG. 11C is a schematic of a voltage selection circuit for selecting a voltage from a plurality of input voltages in accordance with an eighth embodiment of the present disclosure.
Figure 11B:
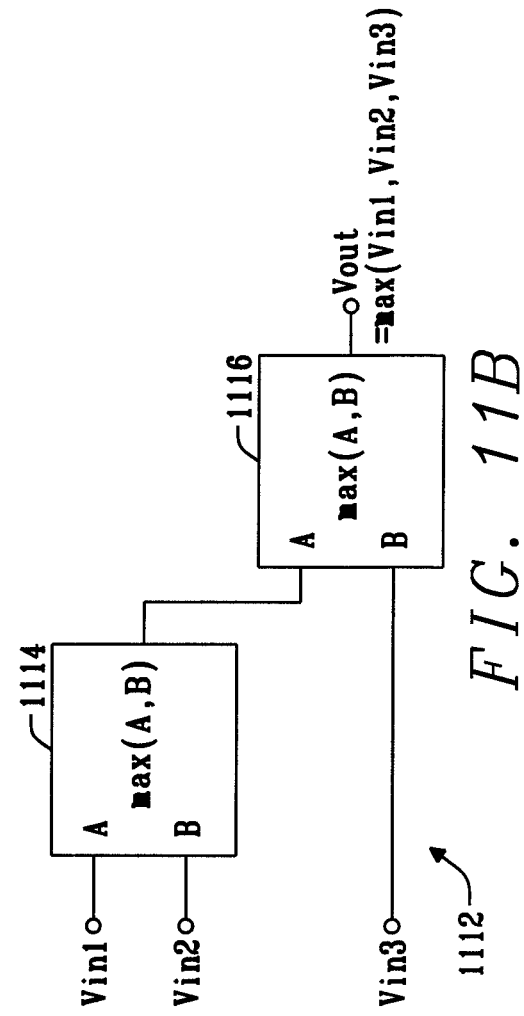
FIG. 11B is a schematic of a cascaded maximum voltage selector circuit.

FIG. 11C is a schematic of a voltage selection circuit 1106 for selecting a voltage from a plurality of input voltages in accordance with an eighth embodiment of the present disclosure. In the present embodiment, each power switch 1102, 1104 comprises a power switch transistor 1108, 1110.

Figure 12B:
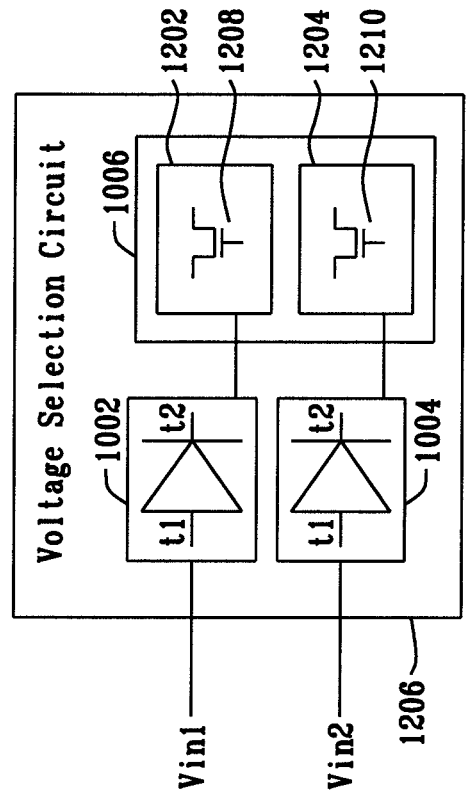
FIG. 12B is a schematic of a voltage selection circuit in accordance with a tenth embodiment of the present disclosure.
Figure 12A:
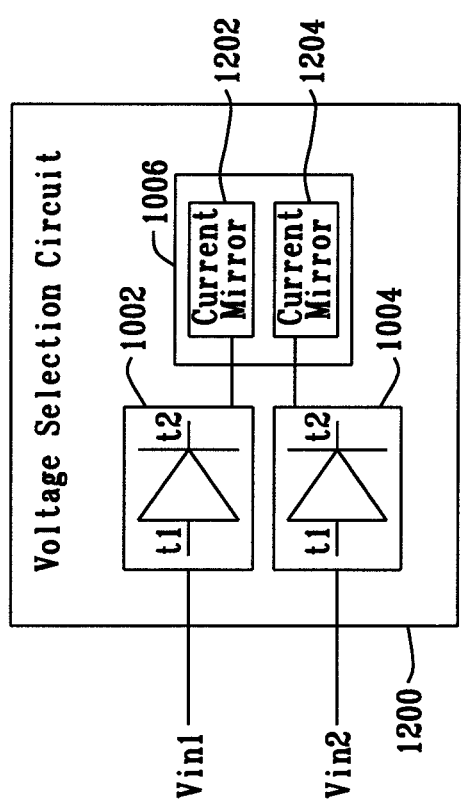
FIG. 12A is a schematic of a voltage selection circuit in accordance with a ninth embodiment of the present disclosure.

FIG. 12A is a schematic of a voltage selection circuit 1200 in accordance with a ninth embodiment of the present disclosure. In the present embodiment, the current sensor 1006 comprises a plurality of current mirrors 1202, 1204, where each current mirror is associated with one of the diodes 1002, 1004 and configured to mirror the current flowing through its associated diode 1002, 1004.

In the schematic, two input voltages Vin1, Vin2 are shown, each being coupled to a diode which has an associated current mirror. It will be appreciated that the circuit 1200 could be modified to provide voltage selection for two or more input voltages in accordance with the understanding of the skilled person.

In the present example, the current mirror 1202 is associated with the diode 1002 and the current mirror 1204 is associated with the diode 1004.

FIG. 12B is a schematic of a voltage selection circuit 1206 in accordance with a tenth embodiment of the present disclosure. The present embodiment corresponds to a specific embodiment of the circuit 1200 where each of the current mirrors 1202, 1204 comprises a current mirror transistor 1208, 1210 for mirroring the respective currents.

FIG. 13A is a schematic of a voltage selection circuit 1300 in accordance with an eleventh embodiment of the present disclosure. The present embodiment corresponds to a specific embodiment of the circuit 1206 where the current sensor 1006 comprises a plurality of resistive elements 1302, 1304, such as resistors, and each resistive element 1302, 1304 is coupled to one of the current mirror transistors 1208, 1210 and configured to provide a sensed voltage Vsen1, Vsen2 that is dependent on the mirrored current provided to the resistive element 1302, 1304.

FIG. 13B is a schematic of a voltage selection circuit 1306 in accordance with a twelfth embodiment of the present disclosure. The voltage selection circuit 1306 comprising the plurality of power switches 1102, 1104, as discussed previously.

Each power switch 1102, 1104 is configured to selectively couple one of the input voltages Vin1, Vin2 to the output terminal t3 based on the selected voltage. Each of the power switches 1102, 1104 is configured to receive one or more of the sensed voltages Vsen1, Vsen2. The selective coupling of each power switch 1102, 1104 is controlled by the sensed voltage Vsen1, Vsen2 received by that power switch 1102, 1104.

In the present embodiment, if the sensed voltage Vsen1, Vsen2 exceeds a threshold voltage value then it will be a high state signal, whereas if the sensed voltage Vsen2 is below the threshold voltage value then it will be a low state signal.

For example, assume that Vsen1 is 5V and the threshold voltage is 2.5V. As Vsen1 is greater than the threshold it will be a high state signal for the purposes of controlling the power switch 1102. If Vsen1 falls below the threshold voltage, for example to 2V, the Vsen1 will be a low state signal for the purposes of controlling the power switch 1102.

In the present embodiment, if the switch 1102, 1104 receives a high state signal, it will close and be conductive, and if it receives a low state signal it will open and become non-conductive.

For example, in operation, assume that the input voltage Vin1 is greater than the input voltage Vin2. A current will flow through the diode 1002 which will be mirrored by the current mirror transistor 1208, and the sensed voltage Vsen1 will be generated due to the presence of the resistive element 1302. The sensed voltage Vsen1 will function as a control signal in a high state to close the switch 1102, thereby providing a conductive path between the input voltage Vin1 and the output terminal t3. Therefore, in the present example the output voltage Vout will be the input voltage Vin1. Assuming no current flows through the diode 1004, for example by using the circuit implementation shown in FIG. 10C, the sensed voltage Vsen2 will, in effect, be zero and a low state signal, and the switch 1104 will remain open.

It will be appreciated that additional circuitry may be provided to adjust the sensed voltage Vsen1, Vsen2 to a suitable level to drive the switching of the switches 1102, 1104. For example, the additionally circuitry may comprise one or more comparators.

Figure 13C:
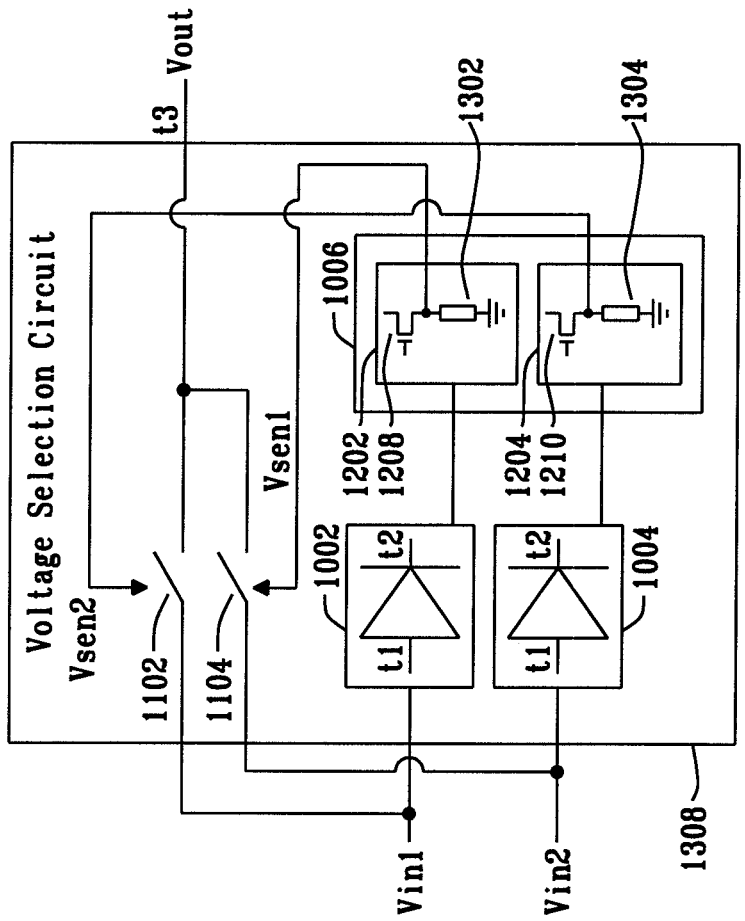
FIG. 13C is a schematic of a voltage selection circuit in accordance with a further embodiment of the present disclosure.

FIG. 13C is a schematic of a voltage selection circuit 1308 in accordance with a further embodiment of the present disclosure. The voltage selection circuit 1308 illustrates an alternative to the circuit 1306.

As in the circuit 1306 each power switch 1102, 1104 is configured to selectively couple one of the input voltages Vin1, Vin2 to the output terminal t3 based on the selected voltage. Each of the power switches 1102, 1104 is configured to receive one or more of the sensed voltages Vsen1, Vsen2. The selective coupling of each power switch 1102, 1104 is controlled by the sensed voltage Vsen1, Vsen2 received by that power switch 1102, 1104.

As for the circuit 1306, if the sensed voltage Vsen1, Vsen2 exceeds a threshold voltage value then it will be a high state signal, whereas if the sensed voltage Vsen2 is below the threshold voltage value then it will be a low state signal.

In the circuit 1308, the switches 1102, 1104 are configured differently from the circuit 1306 such that if the switch 1102, 1104 receives a low state signal, it will close and be conductive, and if it receives a high state signal it will open and become non-conductive. To accommodate this difference compared to the circuit 1306, in the circuit 1308 the sensed voltage Vsen1 is received by the switch 1104 and the sensed voltage Vsen2 is received by the switch 1102.

In operation, assume that the input voltage Vin1 is greater than the input voltage Vin2. A current will flow through the diode 1002 which will be mirrored by the current mirror transistor 1208, and the sensed voltage Vsen1 will be generated due to the presence of the resistive element 1302. The sensed voltage Vsen1 will function as a control signal in a high state to open the switch 1104.

Assuming no current flows through the diode 1004, for example by using the circuit implementation shown in FIG. 10C, the sensed voltage Vsen2 will, in effect, be zero. The sensed voltage Vsen2 will function as a control signal in a low state to close the switch 1102, thereby providing a conductive path between the input voltage Vin1 and the output terminal t3. Therefore, in the present example the output voltage Vout will be the input voltage Vin1.

It will be appreciated that additional circuitry may be provided to adjust the sensed voltage Vsen1, Vsen2 to a suitable level to drive the switching of the switches 1102, 1104. For example, the additionally circuitry may comprise one or more comparators.

Figures 14A, 14B:
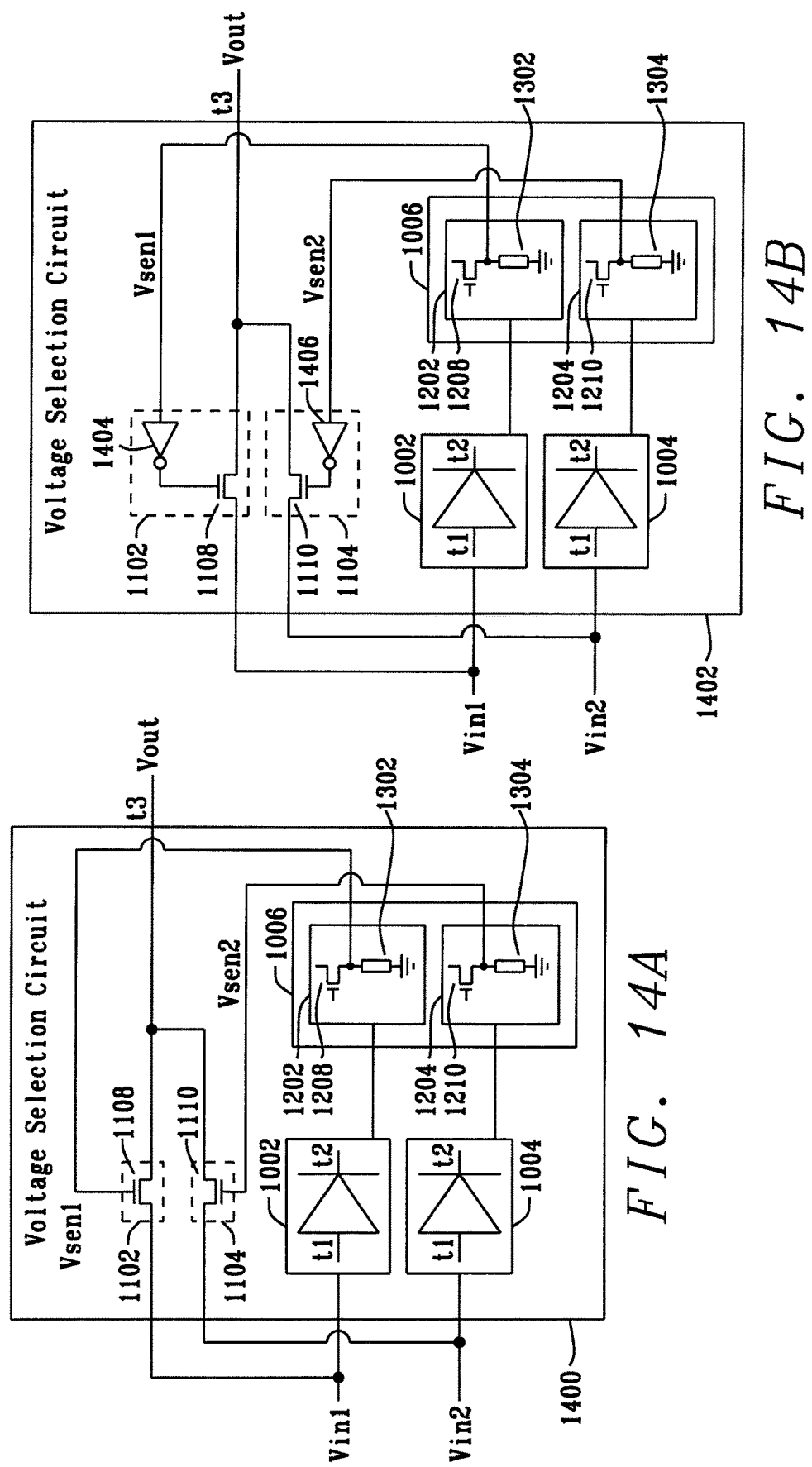
FIG. 14A is a schematic of a voltage selection circuit in accordance with a thirteenth embodiment of the present disclosure.
FIG. 14B is a schematic of a voltage selection circuit in accordance with a fourteenth embodiment of the present disclosure.

FIG. 14A is a schematic of a voltage selection circuit 1400 in accordance with a thirteenth embodiment of the present disclosure. In the present embodiment, each power switch 1102, 1104 comprises a transistor 1108, 1110, as discussed previously with respect to the circuit 1106. In operation, the selective coupling of each of the power switches 1102, 1104 is controlled by the sensed voltage Vsen1, Vsen2 received by the gate of its transistor 1108, 1110.

It will be appreciated that other switching configuration are possible. For example, for a further embodiment, the switches 1102, 1104 may be closed until a control signal exceeding a threshold voltage value is received, after which they will open. In such an embodiment, the sensed voltage Vsen1 may be provided to the power switch 1104 and the sensed voltage Vsen2 may be provided to the power switch 1102 to provide the required functionality of coupling the greatest input voltage Vin1, Vin2 to the output terminal t3.

FIG. 14B is a schematic of a voltage selection circuit 1402 in accordance with a fourteenth embodiment of the present disclosure. In the present example, each power switch 1102, 1104 comprises a logic circuit 1404, 1406 and the transistor 1108, 1110 has its gate coupled to the sensed voltage Vsen1, Vsen2 via the logic circuit 1404, 1406. At least one of the logic circuits 1404, 1406 may comprise an inverter, specifically in the present example, each of the logic circuits 1404, 1406 comprises an inverter. FIG. 14B presents an alternative solution where the switches 1102, 1104 may be closed until a control signal is received.

As discussed previously, when two or more input voltages are approximately equal, for example as shown in FIG. 10G, the power switches 1102, 1104 can use this information in various ways. For example, in a further embodiment, the logic circuits 1404, 1406 may be configured to arbitrate such situations and choose only one of the equal largest inputs to switch to the load.

It will be appreciated that other configurations are possible in accordance with the understanding of the skilled person.

Figure 15:
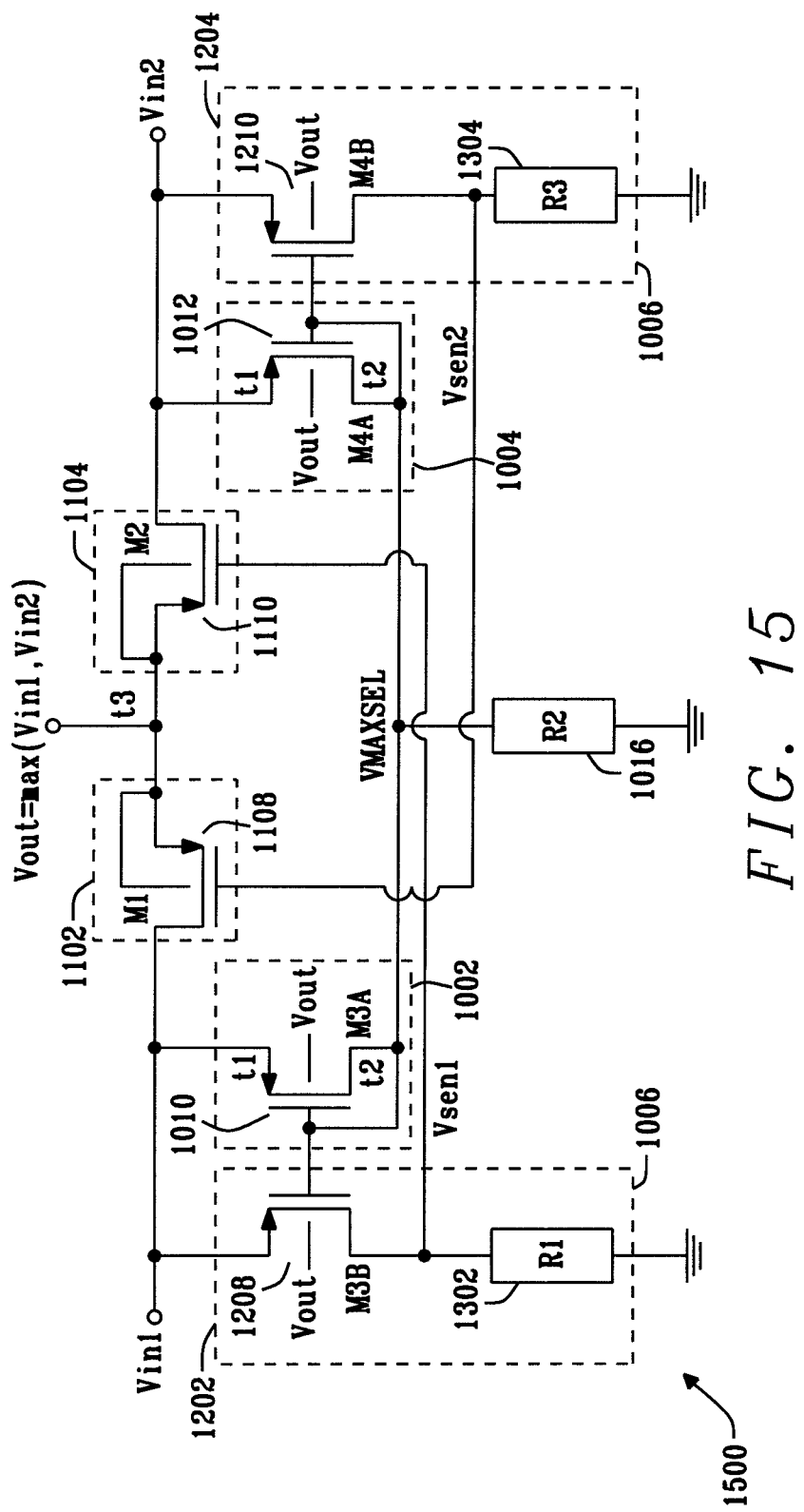
FIG. 15 is a schematic of a voltage selection circuit in accordance with a fifteenth embodiment of the present disclosure.

FIG. 15 is a schematic of a voltage selection circuit 1500 in accordance with a fifteenth embodiment of the present disclosure. The voltage selection circuit 1500 comprises features as previously described in relation to the other embodiments.

In the present embodiment, the transistor 1108 has its gate coupled to Vsen2 and the transistor 1110 has its gate coupled to Vsen1. This is opposite to the arrangement shown in the circuit 1400. This is due to the configuration of the transistors 1108, 1110 in the present embodiment meaning that they function as closed switches when they receive a low state signal at their gates and function as open switches when they receive a high state signal at their gates. As such, the operation of the switches 1102, 1104 of the circuit 1500 are configured as described for the circuit 1308 of FIG. 13C. It will be appreciated that in a further embodiment, the switches 1102, 1104 of the circuit 1500 may alternatively be configured in a way similar to that described for the circuit 1400 in accordance with the understanding of the skilled person.

It will be appreciated that in the embodiments described herein, the current mirrors 1202, 1204 comprising transistors 1208, 1210 have been described as being distinct from the diode coupled transistors 1010, 1012 that generate the current to be mirrored. Conventionally, the current mirror may be said to comprise both transistors, for example the transistors 1010 and 1208 form a current mirror. The distinction has been applied herein for clarity of explanation and it will be appreciated that this description is not intended to be limiting or to omit embodiments that apply a different convention.

Features of the circuit 1500 are as follows:
- pMOS FETs M1 (transistor 1108) and M2 (transistor 1110) implement power switches 1102, 1104 for switching either of the input voltages Vin1 or Vin2 to the circuit output, Vout.
- Diode-connected pMOS FETs M3A (transistor 1010) and M4A (transistor 1012) in conjunction with resistive element 1016 form a maximum voltage selector of the generic type shown in FIG. 10C. The voltage on net VMAXSEL is VMAXSEL≈max(Vin1, Vin2)−VTHP. Resistive element 1016 has a resistance R2.
- pMOS devices M3A (transistor 1010) and M4A (transistor 1012) also form a common-gate, high transconductance differential pair with input voltages Vin1 and Vin2, that can steer the resistive element 1016 current through M3A and M4A based on the voltage (Vin1−Vin2).
  - If Vin1>Vin2 then most/all of the resistive element 1016 current flows via M3A.
  - If Vin2>Vin1 then most/all of the resistive element 1016 current flows via M4A.
  - If Vin1=Vin2 then half of the resistive element 1016 current flows in each of M3A and M4A (assuming for now that M3A and M4A are matched devices).
- pMOS FET M3B (transistor 1208) forms a current mirror with M3A (transistor 1010) as its input and converts the mirror output current to the voltage Vsen1 using the resistive element 1302.
- pMOS FET M4B (transistor 1210) forms a current mirror with M4A (transistor 1012) as its input and converts the mirror output current to the voltage Vsen2 using the resistive element 1304.
- The voltages Vsen1, Vsen2 may control the gates of the power switches M1 (transistor 1108) and M2 (transistor 1110).
- The circuit 1500 is powered from its input voltage sources (Vin1, Vin2) and no additional supply is required.
- The bulks of M3A (transistor 1010), M3B (transistor 1208), M4A (transistor 1012) and M4B (transistor 1210) are shown connected to Vout. This is convenient for IC realisation as all devices can share a common N-well. Other connections are possible without affecting circuit operation, e.g. M3A/B bulks to Vin1 and M4A/B bulks to Vin2.

For the sake of simplicity, the description of circuit operation that follows assumes circuit symmetry:
- Resistive element 1302 has a resistance R1 that is equal to resistance R3 of resistive element 1304.
- M3A (transistor 1010) and M4A (transistor 1012) are identical (matched) pMOS devices
- M3B (transistor 1208) and M4B (transistor 1210) are identical (matched) pMOS devices.

The mirror current ratio IDS(M3B)/IDS(M3A)=IDS(M4B)/IDS(M4A)=M.

A note on naming conventions, IDS(a) is the drain source current through transistor "a"

These are not strict requirements for useful/correct circuit operation however, and imbalanced circuit embodiments are possible and may be useful in some applications.

Circuit operation is now described. Consider the case Vin1>>0 V, Vin2=0 V:

VMAXSEL is raised to ≈Vin1−VTHP by the M3A MOS diode.

Diode M4A is reverse-biased (because Vin2=0) and does not conduct; no current flows in M4B and R3, and thus V2_max=0 V.

The current flowing through R2 (=VMAXSEL/R2) all flows through MOS diode M3A.

This current is mirrored (with mirror ratio M) by M3B and flows into R1.

The voltage drop across R1 can be calculated as follows:

$$Vsen1 = IDS(M3B) \times R1 = M \times \left(\frac{VMAXSEL}{R2}\right) \times R1 \quad (1)$$

If Vsen1 as calculated above ≥Vin1 then M3B will drop into triode mode, reducing the effective mirror ratio, until voltage Vsen1 clamps at Vsen1≈Vin1. Since Vsen2=0 V, switch M1 is closed, switch M2 is open, and Vout=Vin1. Therefore Vout=max(Vin1, Vin2), as desired.

From symmetry considerations, if instead Vin2>>0 V and Vin1=0 V then Vout=Vin2 results, so again Vout=max(Vin1, Vin2) as desired.

The schematics of the voltage selection circuits as presented herein have been shown for the selection of a voltage from two or three input voltages. It will be appreciated that all embodiments presented herein may be configured to provide voltage selection from two or more input voltages in accordance with the understanding of the skilled person and is not intended to be limited to voltage selection from only two or three input voltages.

Now consider when Vin1=Vin2:

Since it has been assumed for simplicity that M3A and M4A are matched devices then half of the current flowing in R2 flows in each:

$$IDS(M3A) = IDS(M4A) = \frac{VMAXSEL}{2.R2} \quad (2)$$

where VMAXSEL=Vin1−VTHP=Vin2−VTHP.

Since it has been assumed for simplicity that R1 and R3 are matched resistors and that M3B and M4B are also matched devices implementing mirrors with common mirror ratio M, then:

$$IDS(M3B) = IDS(M4B) = \frac{M \times VMAXSEL}{2 \times R2} \quad (3)$$

$$Vsen1 = Vsen2 = \frac{M \times VMAXSEL}{(2 \times R2) \times R1} \quad (4)$$

By suitable choice of M, R2, R1 and R3, when Vin1=Vin2 than voltages Vsen1=Vsen2 can be made low enough to turn on both M1 and M2, ensuring that Vout is driven from both. Since Vin1=Vin2, having both inputs voltages connected via M1 and M2 is acceptable—the switches are not creating an unwanted short between supplies at different voltages—and is in fact desirable behaviour as it means there will be no dead-zone caused by having M1 and M2 both off when the input voltages crossover, the circuit soft-switches between Vin1 and Vin2 when the input voltages crossover.

When Vin1 and Vin2 are not equal, but close, i.e. Vin1≈Vin2 then the high transconductance of the current-steering pair M3A/M4A means that as soon as one input voltage is even slightly higher than the other then the R2 current is diverted via the M3A/M3B or M4A/M4B mirrors to node Vsen1 or Vsen2 to control M1 and M2 so that the highest voltage drives the output.

The circuit 1500, and the other circuits presented herein in accordance with the understanding of the skilled person, combines comparator and switch driver functions in an effective manner, where relatively few devices perform several merged duties at once to achieve a complicated goal, e.g. the MOS diodes (transistors 1010, 1012) of the maximum selector also operate as common-gate differential inputs to multiple current-steering mirrors (current mirrors 1202, 1204) that in turn form part of the power switch drivers. It enables very accurate maximum voltage tracking using a feed-forward method that thus avoids concerns about any closed-loop stabilities.

Compared to the known circuits as discussed previously, the circuits disclosed herein in accordance with the present disclosure provide:

Very accurate output voltage tracking, Vout=max(Vin1, Vin2, . . . )

No dead-zones.

No tracking errors due to latch overdrive requirements.

Additionally, like the known circuits presented previously, the circuits disclosed herein in accordance with the present disclosure uses feed-forward operation, so avoids the risk of oscillations that may occur due to output voltage Vout loading.

Figure 16A:
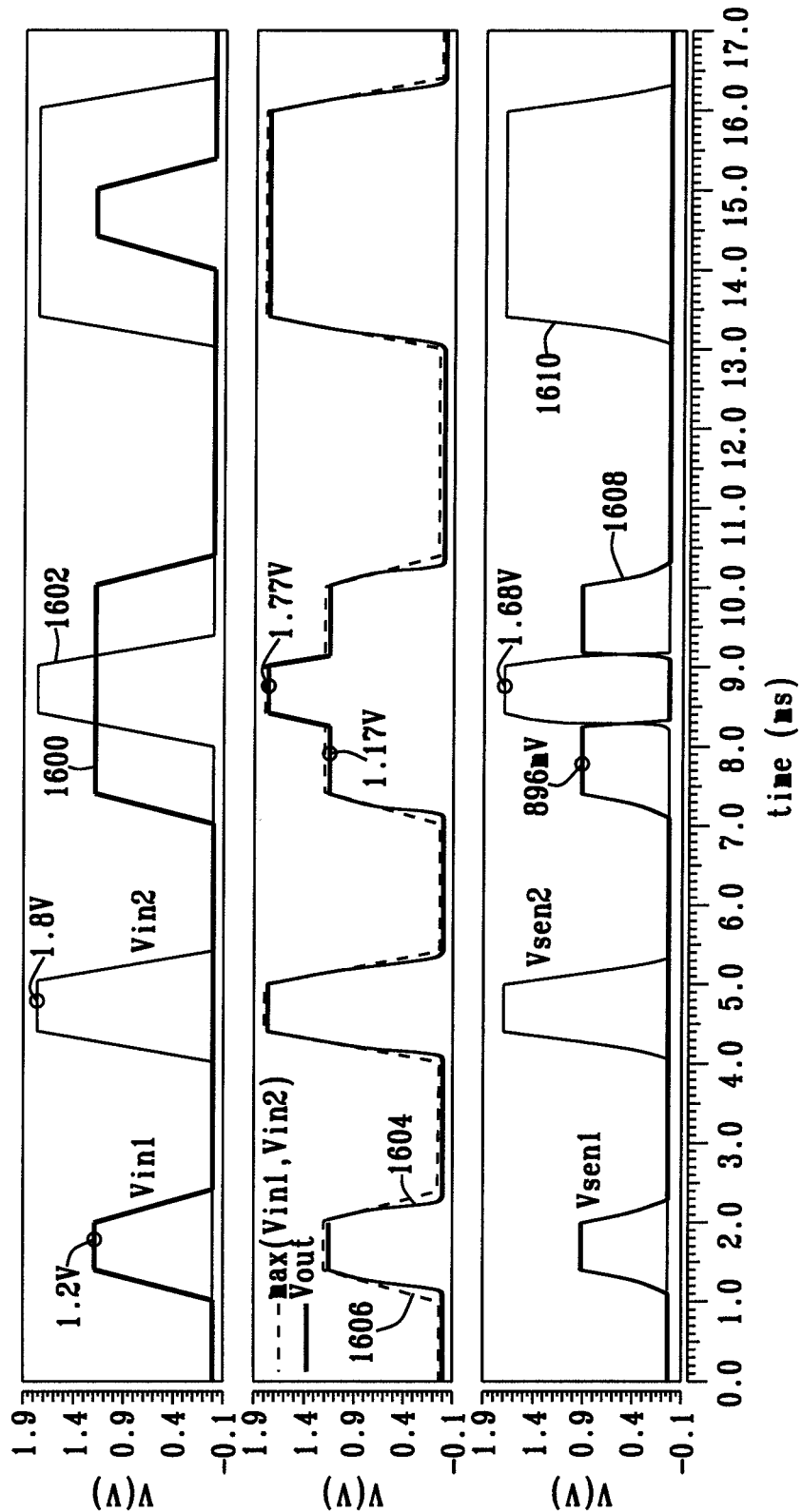
FIG. 16A is a graph showing results from a simulation of the circuit of FIG. 15.

FIG. 16A is a graph showing results from a simulation of the circuit 1500, using simulation parameters that are representative of a practical implementation of the circuit 1500.

Figure 16B:
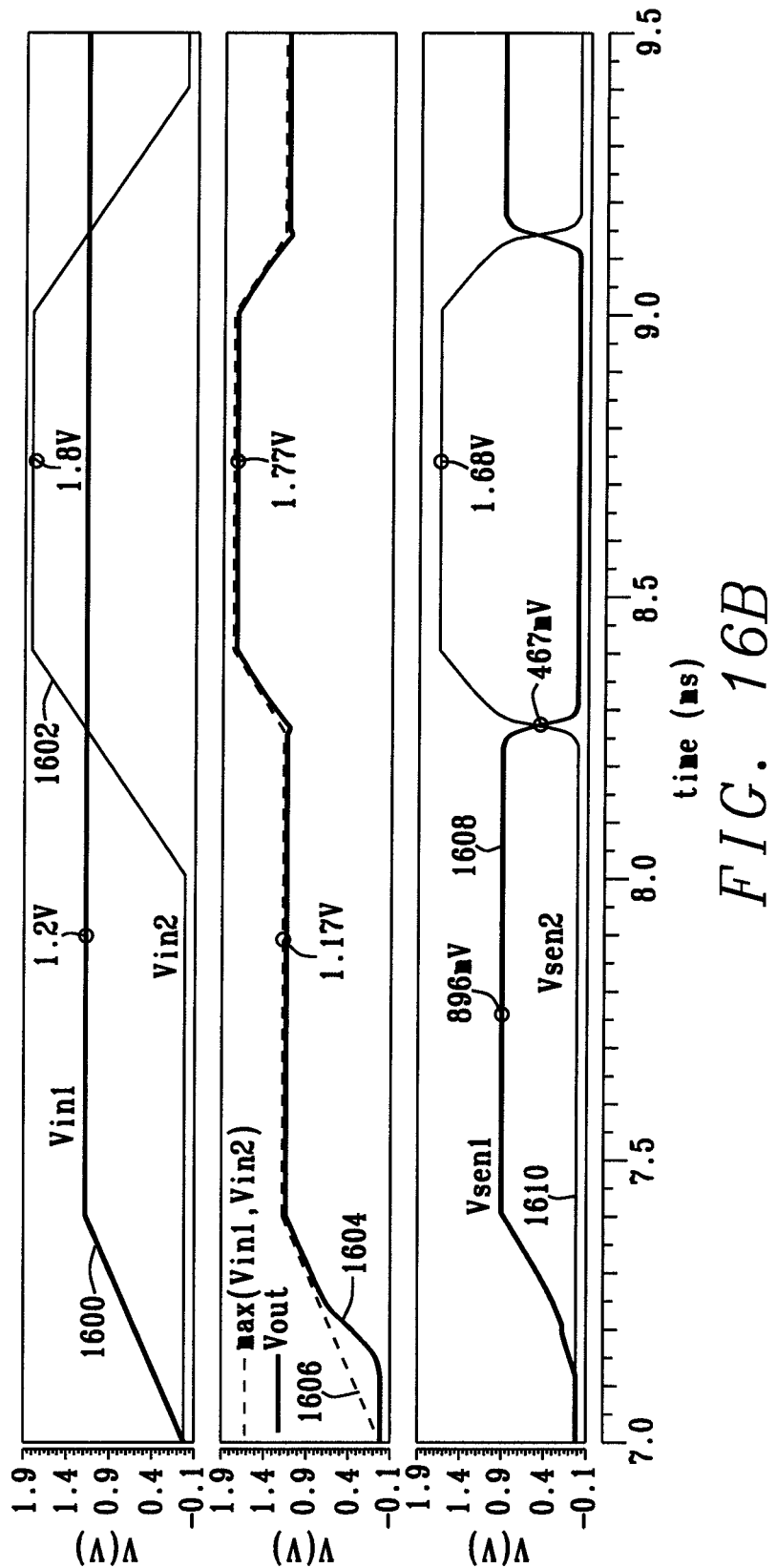
FIG. 16B shows the simulation results presented in FIG. 16A over a specific time frame.

FIG. 16A shows a trace 1600 of the input voltage Vin1 as it varies with time, a trace 1602 of the input voltage Vin2 as it varies with time, a trace 1604 of the output voltage Vout as it varies with time, a trace 1606 of the maximum voltage Vmax as it varies with time, a trace 1608 of Vsen1 as it varies with time and a trace 1610 of Vsen2 as it varies with time. FIG. 16B shows the simulation results presented in FIG. 16A over a specific time frame.

The simulation uses the following parameters:

R2=2.95 MΩ

R1=R3=2.21 MΩ (75% of R2)

pMOS threshold voltage VTHP≈0.64 V

Current mirror ratio of M3A/3B and M4A/4B pairs M=2

M1 and M2 identical-sized pMOS switch devices.

input voltages Vin1=0 to 1.2 V, Vin2=0 to 1.8 V, driving a 2 kΩ load.

Figure 3:
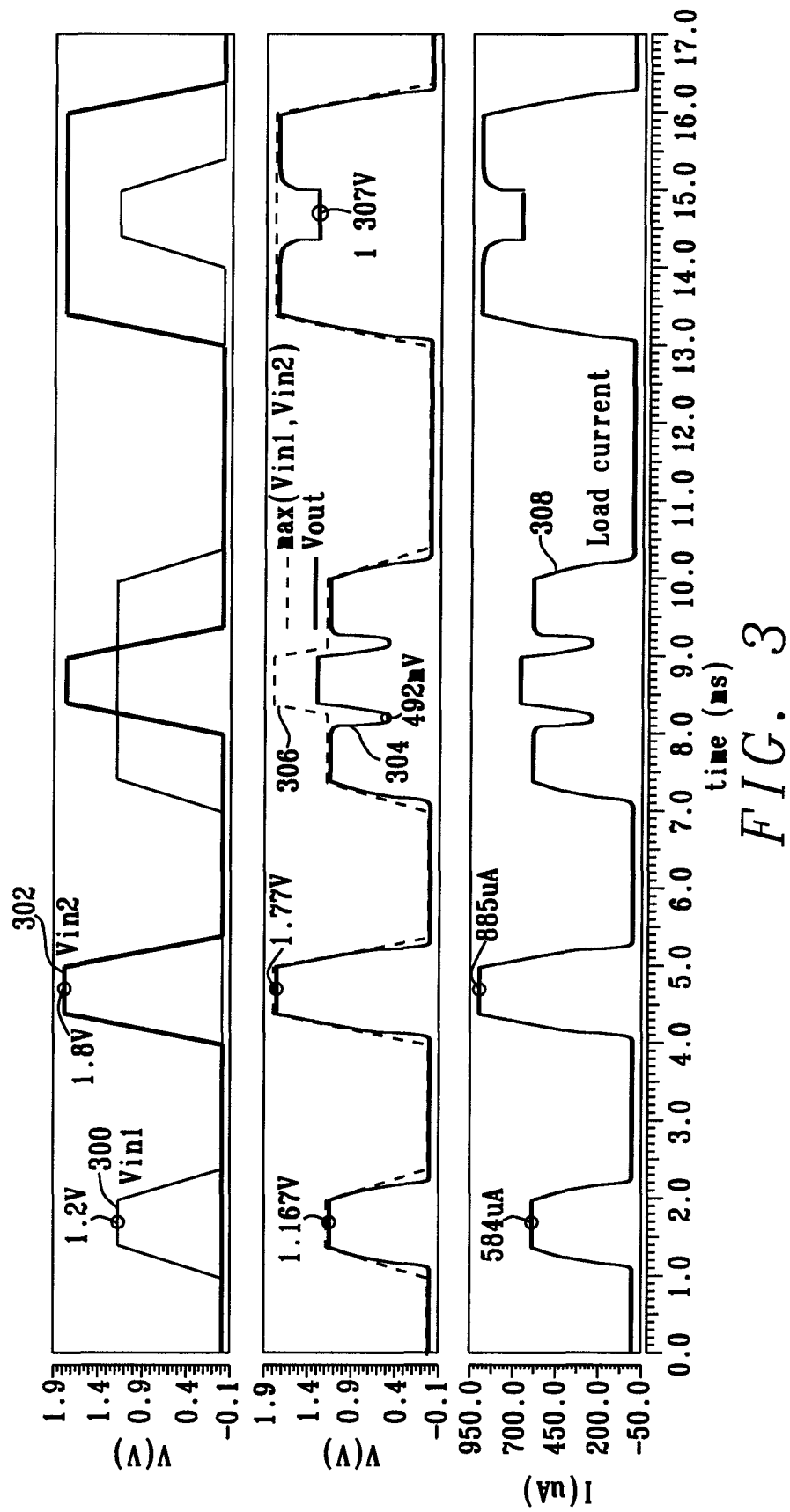
FIG. 3 is a graph showing results from a simulation of the circuit of FIG. 2.
Figure 4:
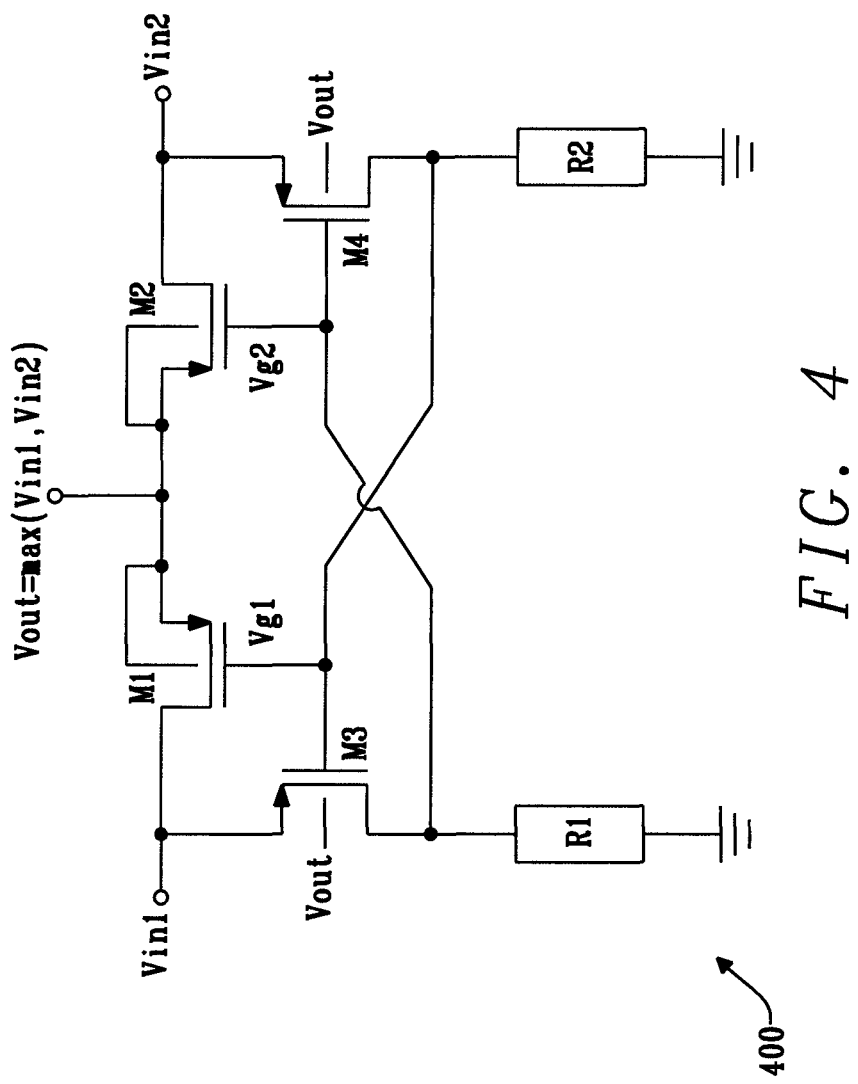
FIG. 4 is a schematic of a known improved 2-input cross-coupled maximum selection switch circuit with a latch.
Figure 5:
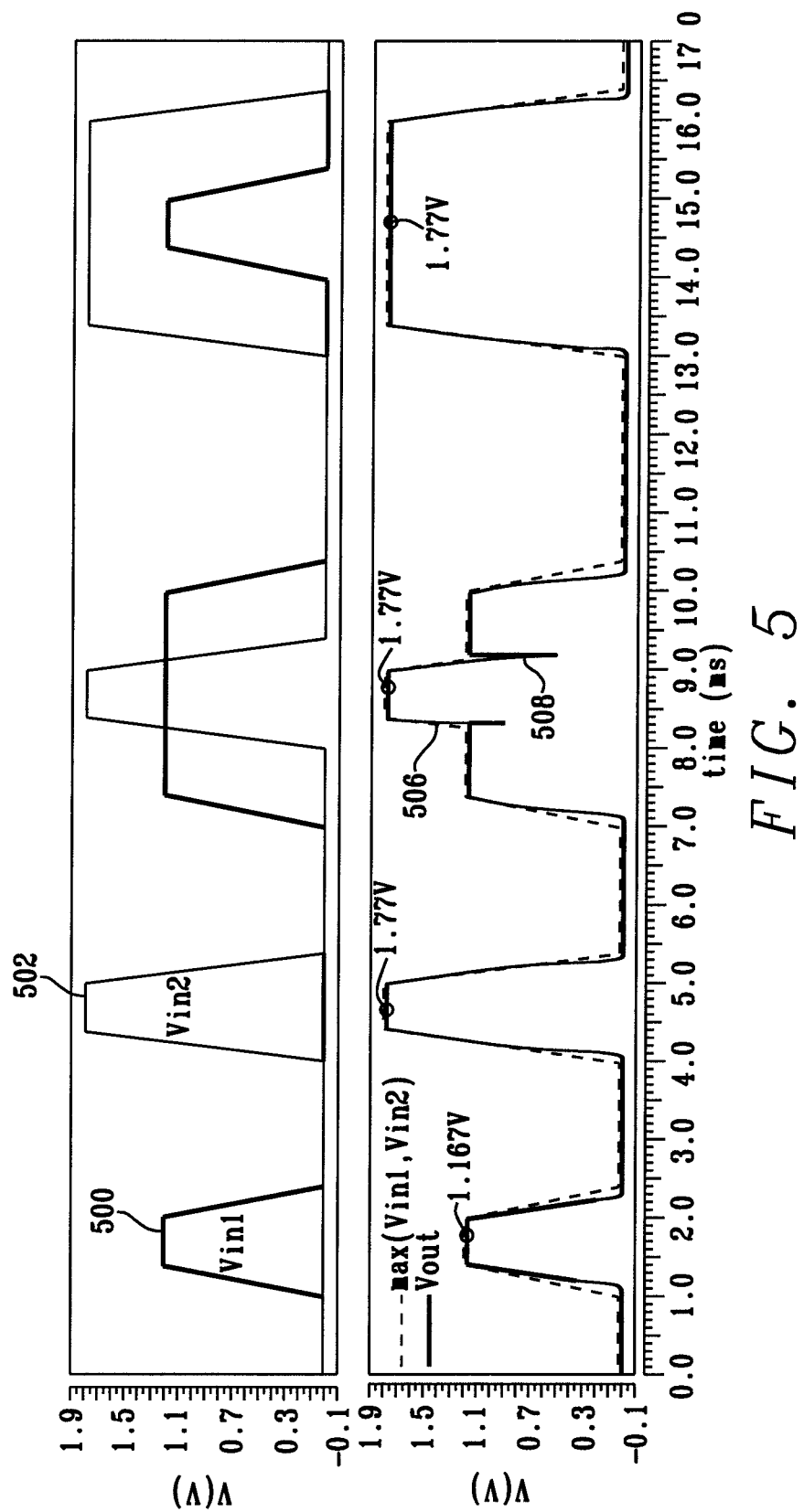
FIG. 5 is a graph showing results from a simulation of the circuit of FIG. 4.
Figure 6:
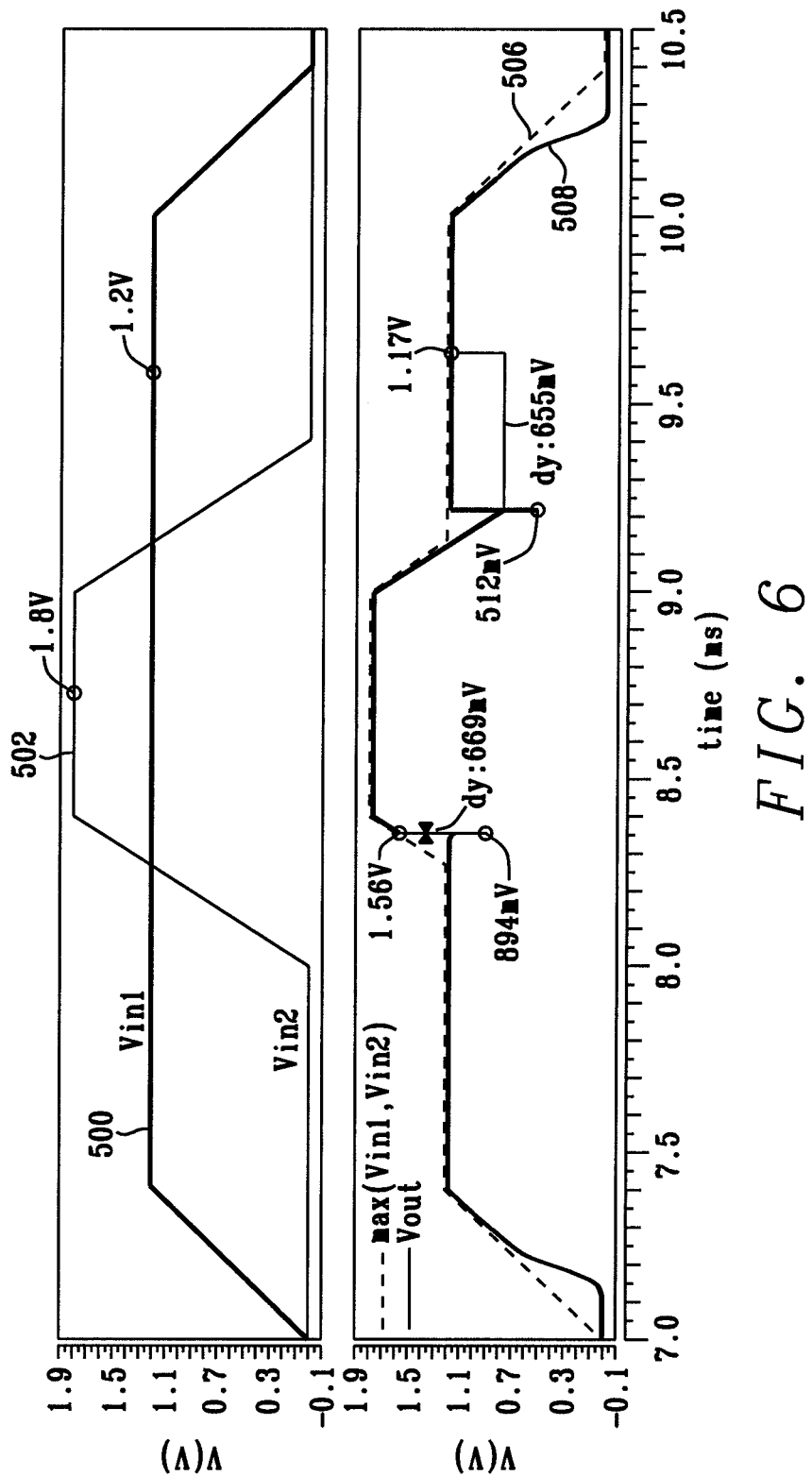
FIG. 6 is a further graph showing results from a simulation of the circuit of FIG. 4.

Comparing to simulations FIG. 3 and FIG. 5 relating to known systems, FIG. 16A and FIG. 16B (input voltages crossover behaviour detail) show:

Vout now very accurately tracks max(Vin1, Vin2) with no noticeable dead-zone or crossover Vout voltage errors.

when Vin1 and Vin2 approach and crossover, the gate control signals Vsen1 (also labelled V1_max) and Vsen2 (also labelled V2_max) quickly switch to connect Vout to the larger input voltage and disconnect the smaller input voltage. The switch-over between which input drives Vout is a soft-switch instead of an abrupt switch-over; one power switch on-resistance (RON) ramps-up while the other switch RON ramps down.

Figure 16C:
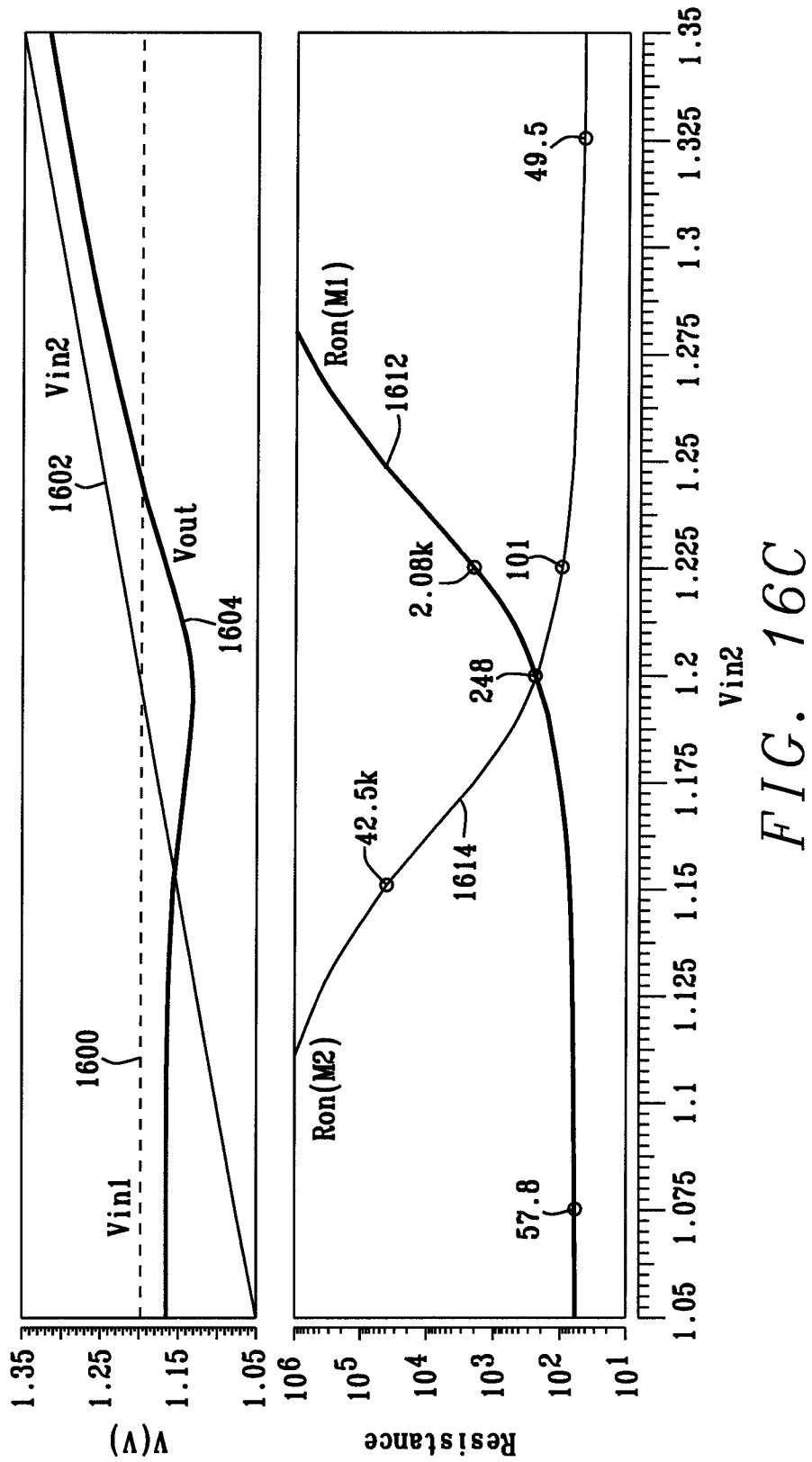
FIG. 16C is a further graph showing results from a simulation of the circuit of FIG. 15.

FIG. 16C is a graph showing results from a simulation of the circuit 1500, specifically relating to how the on resistance of switches M1 (transistor 1108) and M2 (transistor 1110) vary with the input voltage Vin2 at switch-over, when Vin1=Vin2=1.2V. There is shown a trace 1612, being the on resistance of M1, and a trace 1614, being the on resistance of M2. Vout is slightly less than max(Vin1, Vin2) here because of a load current IR drop across M1 and M2.

FIG. 16C shows detail of the input voltage crossover at Vin1=Vin2=1.2 V including the on resistances (RON) of switches M1 and M2. When Vin1=Vin2 both M1 and M2 connect Vin1 and Vin2 to Vout via low RON switch resistance (248Ω). As soon as the voltage difference |Vin1−Vin2|>a few 10 s of milliVolts, Vout is driven predominantly by the higher of Vin1 and Vin2.

For this example, at Vin2=1.225 V, Vin1=1.2 V the ratio RON(M1)/RON(M2)=2080/101≈20, confirming that Vout is driven primarily by input Vin2 even at only 25 mV input voltage difference.

Above 50 mV input voltage difference the RON ratio >600 due to the high gain of the maximum voltage selecting gate-driver circuits.

Figure 16D:
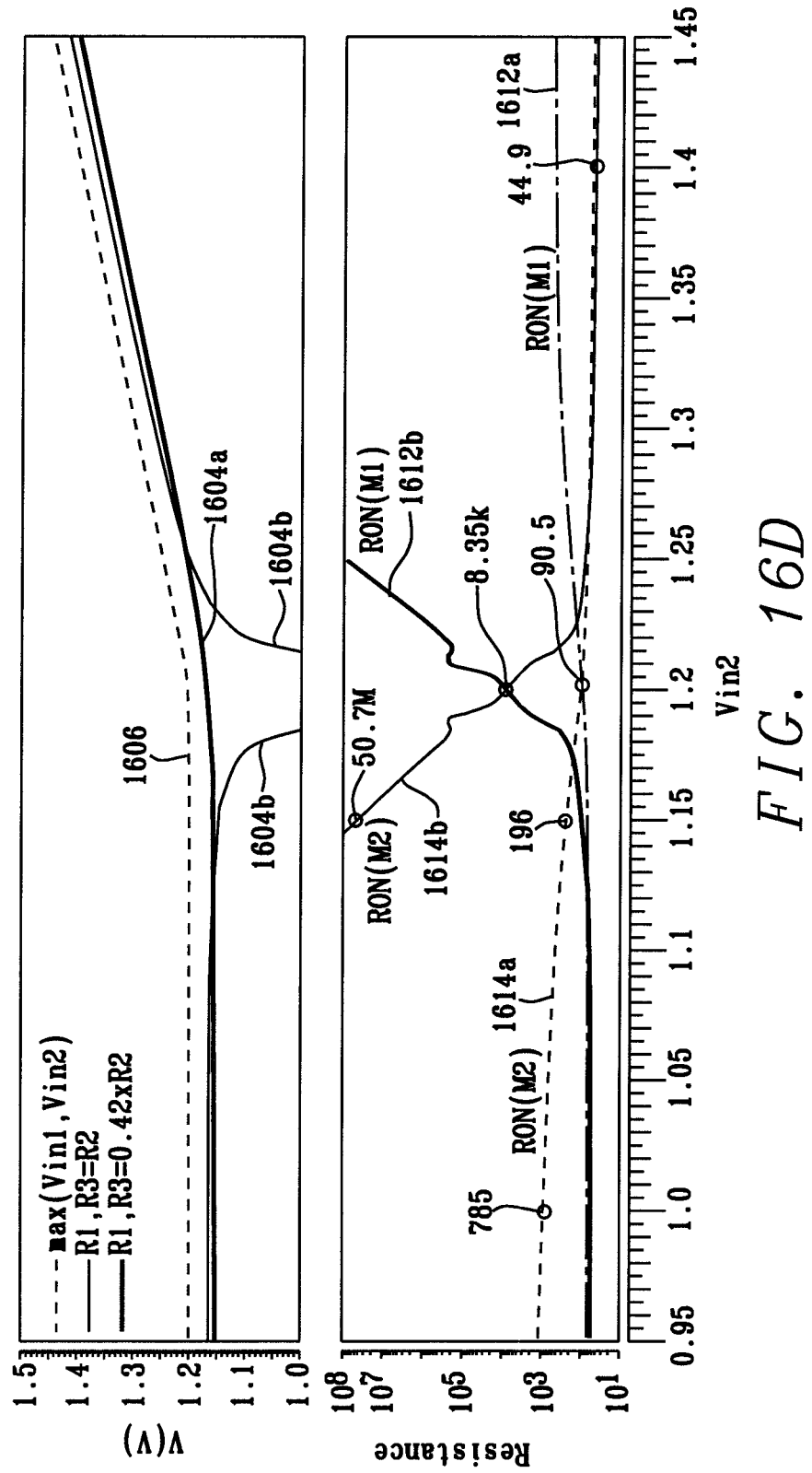
FIG. 16D is an additional graph showing results from a simulation of the circuit of FIG. 15.

FIG. 16D shows detail of the input voltage crossover behaviour with R1=R3=R2 and R1=R3=0.42×R2 for the circuit 1500 with mirror ratio M=2. There is shown the following:

When R1=R3=0.42×R2
   a trace 1604a for the output voltage Vout, a trace 1612a for RON(M1), a trace 1614a for RON(M2)
When R1=R3=R2
   a trace 1604b for the output voltage Vout, a trace 1612b for RON(M1), a trace 1614b for RON(M2)

When implementing the circuit 1500, values for R1 and R3 may be chosen. Assuming again for simplicity that R1=R3 and that M3A/M3B and M4A/M4B have identical mirror ratios M=2 larger R1 and R3 values increase the gain from Vin1, Vin2 to Vsen1 and Vsen2. Larger R1 and R3 values gives a sharper transition (compared with smaller values) between Vin1 and Vin2 when the input voltages crossover, but if R1 and R3 increase until R1=R3=R2 then circuit symmetry shows that at Vin1=Vin2, Vsen1=Vsen2=VMAXSENSE=Vin1−VTHP. Switches M1 and M2 have their gate-source voltage, VGS≈VTHP and so may conduct very weakly causing Vout to droop when loaded.

If R1=R3>R2 then M1 and M2 gate drive is further reduced and a dead-zone can appear around Vin1=Vin2. Avoiding this sets an upper bound on the values for R1 and R3. Having small R1 and R3 avoids a dead-zone or weak output drive when Vin1≈Vin2, but results in less gain and so a less-sharp crossover whenever one input voltage becomes largest. This could result in unwanted current flow between Vin1 and Vin2 as the difference |Vin1−Vin2| increases.

In the extreme where R1=R3=0 then both M1 and M2 gates short to ground and so M1 and M2 will always conduct, which can result in very large, unwanted non-load current flow between Vin1 and Vin2.

Practically, choosing R1=R3>R2/2 ensures that (for M=2) when Vin1>Vin2 then Vsen1 can rise to Vsen1≥Vin1−VTHP, which will be high enough to ensure that M2 does not conduct, and vice-versa for Vsen2 and M1 when Vin2>Vin1.

The above considerations give, for M=2
R2/2≤R1, R3≤R2
And for general mirror ratio
MR2/M≤R1, R3≤2×R2/M FIG. 16D illustrates these design constraints and shows why it is desirable to adhere to them. For the circuit 1500 with M=2, FIG. 16D shows the input cross-over behaviour for R1=R3=R2 (suggested upper limit)
R1=R3=0.42×R2 (slightly below suggested lower limit to emphasise consequences)

When R1 and R3 are at the upper limit (=R2), a dead-zone is created around Vin1≈Vin2. M1 and M2 both have RON>8 kΩ and Vout dips to ≈0.5 V (not shown). When R1 and R3 are below the lower limit, both M1 and M2 have RON<100Ω when Vin1=Vin2=1.2 V and so Vout is strongly driven and there is no dead-zone.

However, because Vsen1 and Vsen2 cannot not rise high enough to properly turn-off M2 and M1 when required, both continue to conduct quite strongly (RON<1 kΩ) even when Vin1≠Vin2, resulting in unwanted non-load current flow between Vin1 and Vin2.

In a preferred embodiment, the circuit 1500 may use R1=R3=0.75×R2 (middle of the suggested range), which is a reasonable compromise between switching sharply from supplying load current from only Vin1 or Vin2 when Vin1≠Vin2, and avoiding a dead-zone when Vin1≈Vin2.

Figure 17:
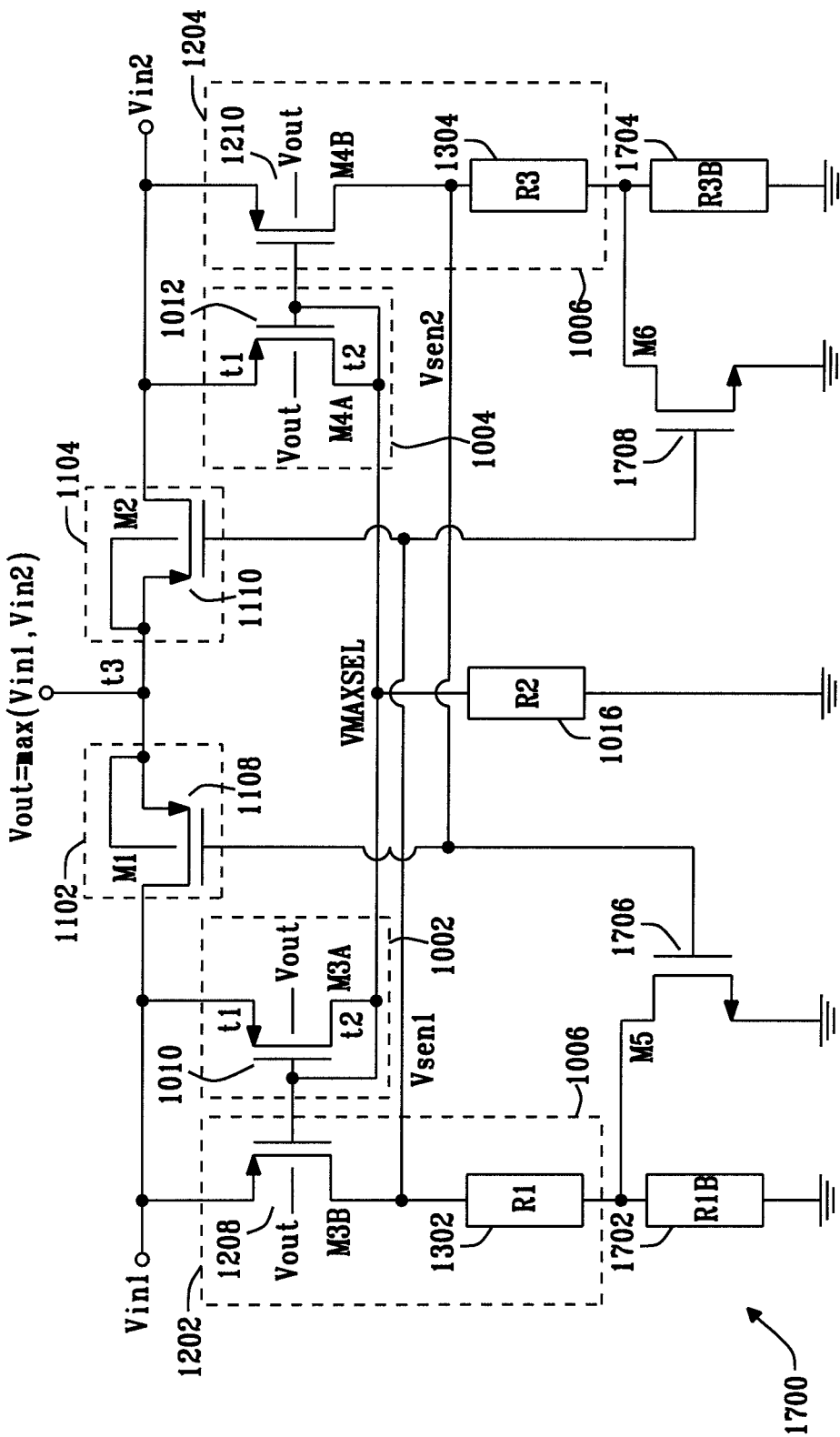
FIG. 17 is a schematic of a voltage selection circuit in accordance with a sixteenth embodiment of the present disclosure.

FIG. 17 is a schematic of a voltage selection circuit 1700 in accordance with a sixteenth embodiment of the present disclosure. The circuit 1700 uses adaptive load resistance switching for improved power FET (M1, M2) gate drive around Vin1≈Vin2.

The trade-off between wanting R1 and R3 large for high gain/sharp crossover but wanting R1 and R3 low to keep Vsen1 and Vsen2 low so both M1 and M2 conduct well near crossover can be improved using the circuit 1700 of FIG. 17, which adapts the load resistances based on the present maximum input voltage.

Compared to the circuit 1500, the circuit 1700 further comprises resistive elements 1702 (also labelled R1B), 1704 (also labelled R3B) and transistors 1706 (also labelled M5), 1708 (also labelled M6).

Figure 18A:
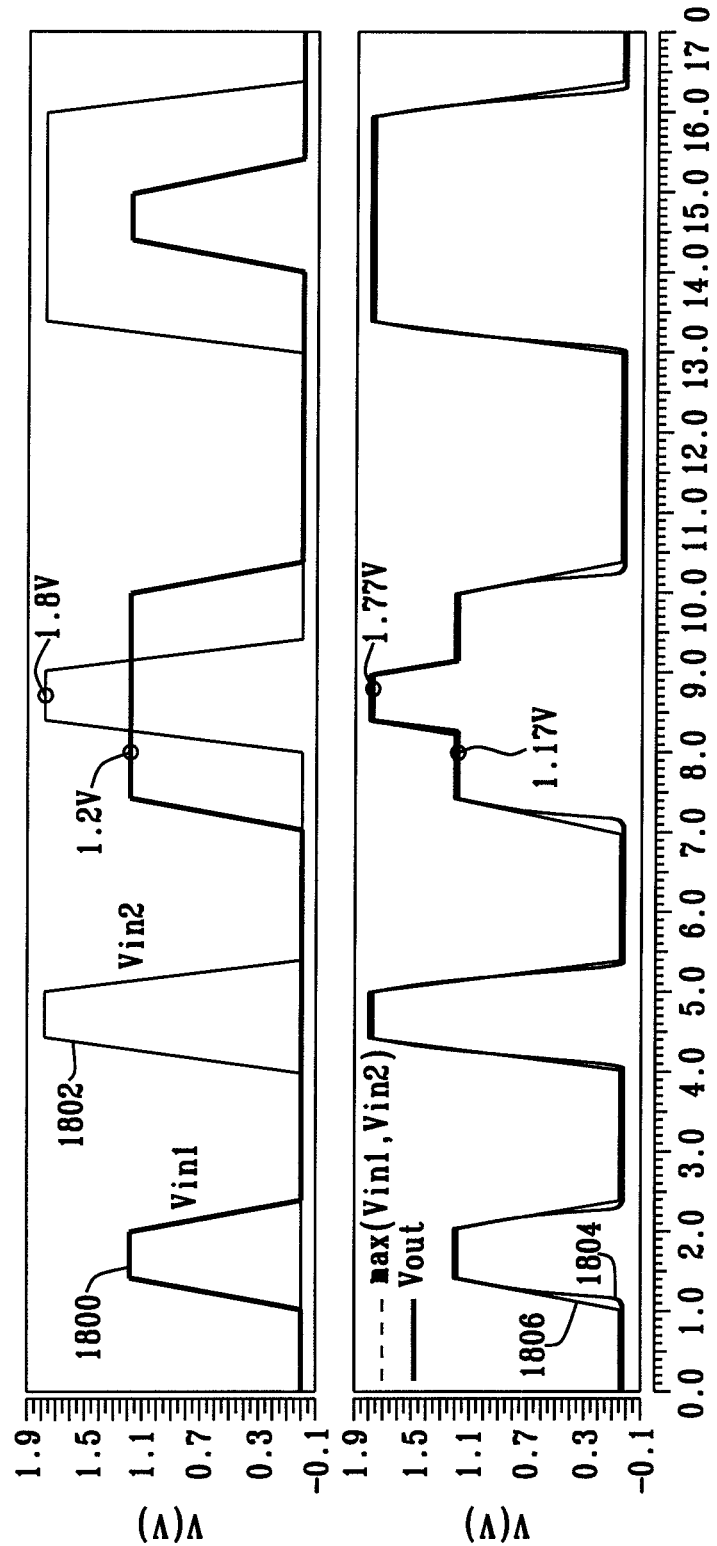
FIG. 18A is a graph showing results from a simulation of the circuit of FIG. 17.

FIG. 18A is a graph showing results from a simulation of the circuit 1700 driving a 2 kΩ load with Vin1=0 to 1.2 V and Vin2=0 to 1.8 V, using simulation parameters that are representative of a practical implementation of the circuit 1700.

FIG. 18A shows a trace 1800 of the input voltage Vin1 as it varies with time, a trace 1802 of the input voltage Vin2 as it varies with time, a trace 1804 of the output voltage Vout as it varies with time and a trace 1806 of the maximum voltage Vmax as it varies with time.

Figure 18B:
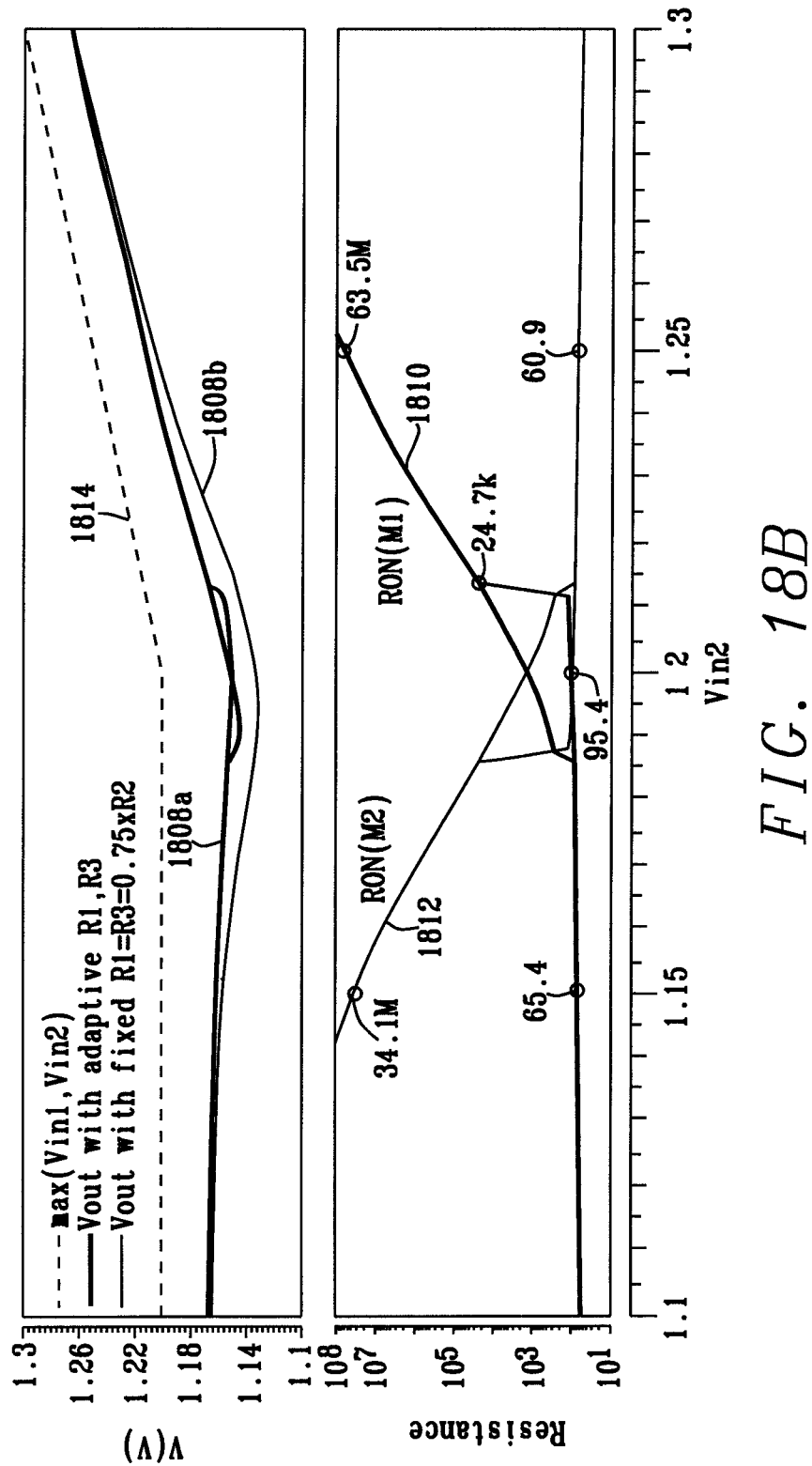
FIG. 18B is a further graph showing results from a simulation of the circuit of FIG. 17.

FIG. 18B is a graph showing results from a simulation of the circuit 1700 driving a 2 kΩ load showing crossover behaviour around Vin1=Vin2=1.2 V with adaptive load switching. Hysteretic sweep of Vin2=1.1 to 1.3 V then back to 1.1 V with fixed Vin1=1.2 V.

FIG. 18B shows detail of the input voltage crossover behaviour comparing adaptive R1, R3 against fixed R1=R3=0.75×R2 for the circuit 1700. There is shown the following:

When R1, R3 are adaptive:
   a trace 1808a for the output voltage Vout, a trace 1810 for RON(M1), a trace 1812 for RON(M2)
When R1=R3=0.75×R2:
   a trace 1818b for the output voltage Vout Also shown is the maximum voltage by a trace 1814.

The following parameters were used for the simulations as described for FIG. 18A and FIG. 18B:

R2=2.95 MΩ

R1+R1B=R3+R3B=1.24/2.95 MΩ (adaptive switching between 43% and 100% of R2)

pMOS threshold voltage VTHP≈0.64 V

Current mirror ratio of M3A/M3B and M4A/M4B pairs M=2

M1 and M2 identical-sized pMOS switch devices.

Driving a 2 kΩ load.

Comparing to FIG. 16D for which R1 and R3 were fixed at either (0.42×R2) or R2, neither of which resulted in satisfactory circuit performance, FIG. 18B shows excellent Vout tracking performance with good crossover between inputs for supplying load current (and without unwanted current leakage between the input voltages) can be achieved when adapting the loads to the input voltages. Adaptively switching the load resistors causes a small hysteresis in the cross-over switching behaviour (±14 mV in this example).

Comparing FIG. 16C and FIG. 18B shows that with adaptive resistor loads Vout tracking accuracy (i.e. how good an approximation to max(Vin1, Vin2)) can exceed that achievable with fixed load resistors.

Various alternative embodiments of the circuits 1500, 1700 are possible, in accordance with the understanding of the skilled person. For example (non-exhaustive list of alternative embodiments implementing the same basic circuit architecture):

The maximum voltage sensing and gate driving MOSFET devices M3A/M3B and M4A/M4B could be implemented using instead PNP bipolar transistors, p-channel JFETs, or any other suitable device.

Resistors were show for loads R1, R2 and R3 because they are simple to implement. However, other load structures well-known to analogue designers may be used, such as:

Current sources and mirrors.

MOSFETs operated in triode mode to approximate resistors (this usually requires less silicon area than a polysilicon or diffused resistor of equivalent resistance and is useful if circuit area is constrained).

Figure 19A:
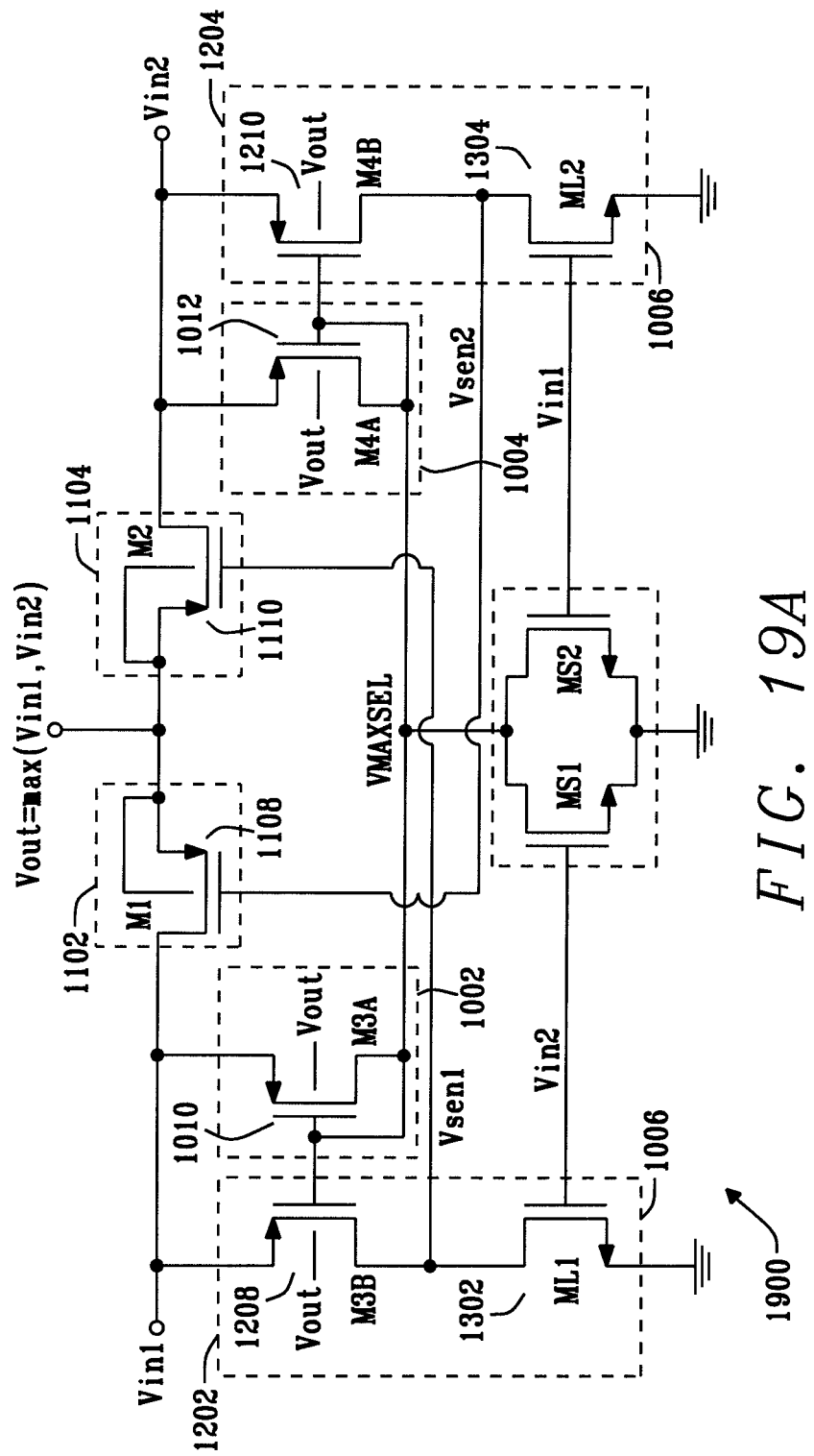
FIG. 19A is a schematic of a voltage selection circuit in accordance with a seventeenth embodiment of the present disclosure.

FIG. 19A is a schematic of a voltage selection circuit 1900 in accordance with a seventeenth embodiment of the present disclosure. The circuit 1900 uses triode-mode MOS loads to approximate resistive loads. The resistive element 1302 comprises a transistor ML1, the resistive element 1304 comprises a transistor ML2 and the resistive element 1016 comprises transistors MS1, MS2.

Figure 19B:
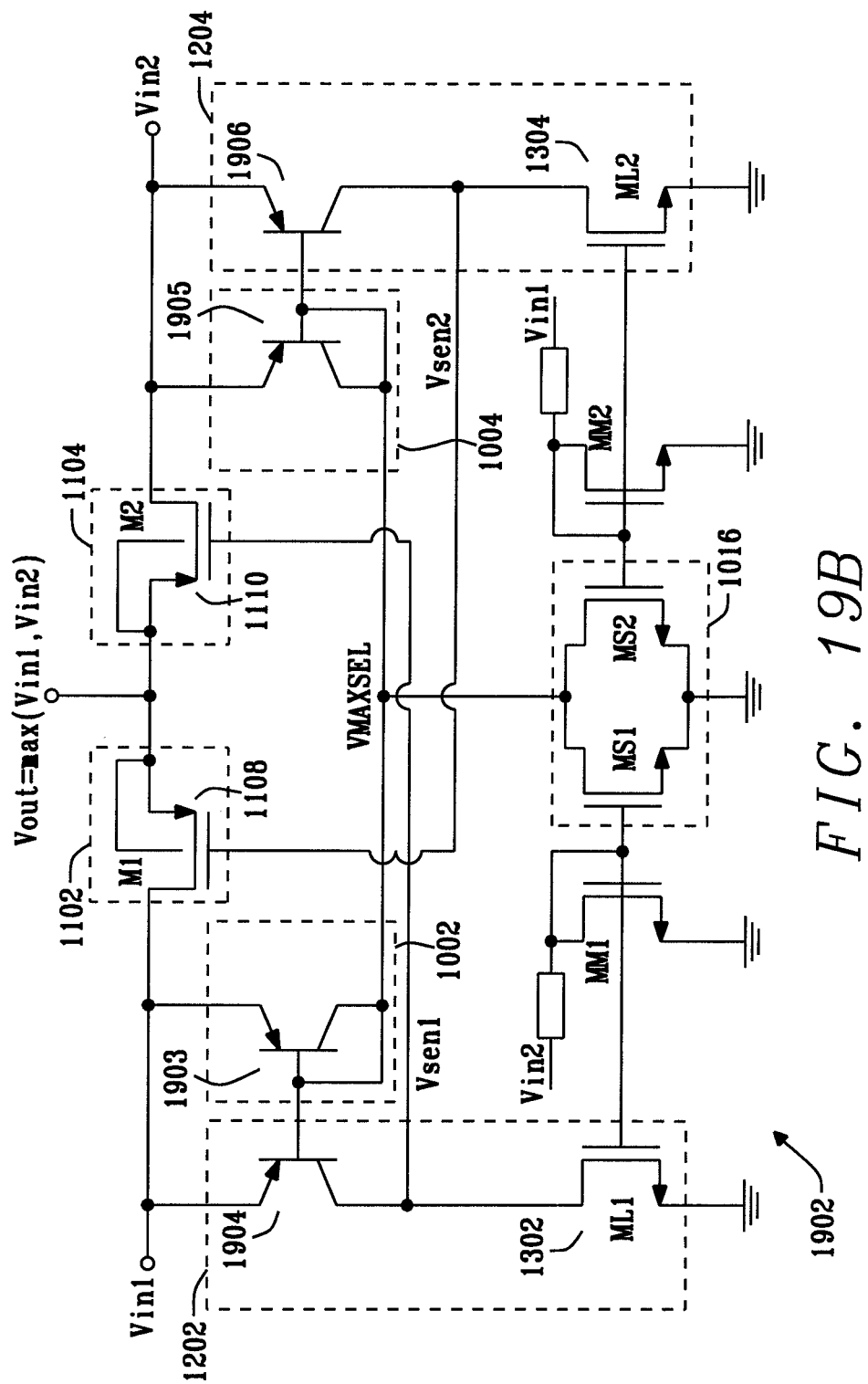
FIG. 19B is a schematic of a voltage selection circuit in accordance with an eighteenth embodiment of the present disclosure.

FIG. 19B is a schematic of a voltage selection circuit 1902 in accordance with an eighteenth embodiment of the present disclosure. The circuit 1902 uses current mirror loads and BJT maximum selection devices. The circuit 1902 uses current mirrors to create high output impedance loads and the current for the VMAXSEL maximum voltage selector circuit. The circuit 1902 comprises BJT transistors 1903, 1904, 1905, 1906, transistors MM1, MM2 and resistors 1908, 1910.

As discussed for resistive loads, the values/sizes of any load devices is preferably chosen in conjunction with the M3A/M3B and M4A/M4B mirror ratios to ensure correct circuit operation, namely that the Vsen1 and Vsen2 voltages can be pulled low enough to ensure that M1 and M2 conduct strongly when Vin1≈Vin2, and also that Vsen1 can pull high enough to turn off M2 when Vin1>Vin2, and Vsen2 can pull high enough to turn off M1 when Vin2>Vin1.

Figure 20:
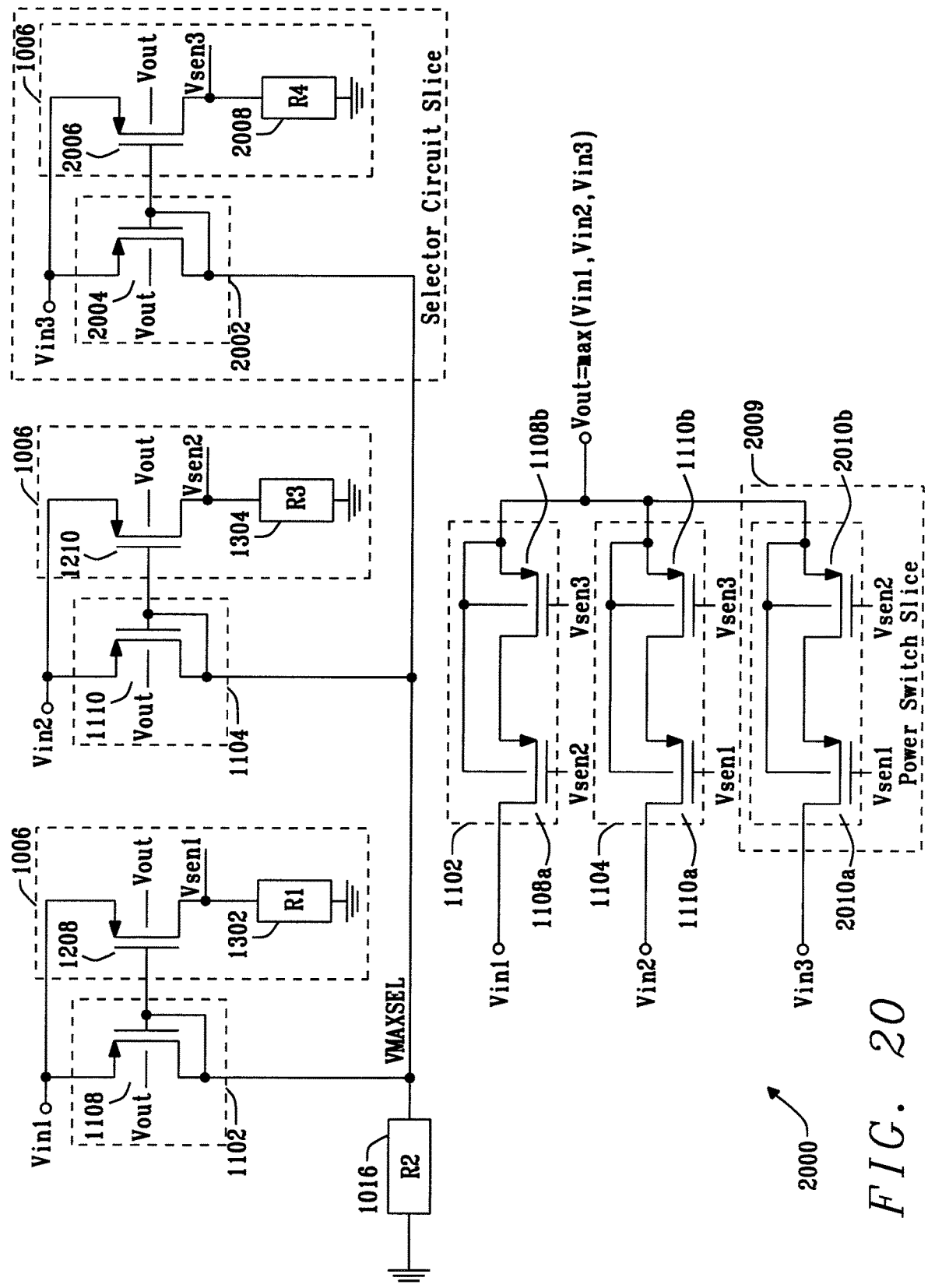
FIG. 20 is a schematic of a voltage selection circuit in accordance with a nineteenth embodiment of the present disclosure.

FIG. 20 is a schematic of a voltage selection circuit 2000 in accordance with a nineteenth embodiment of the present disclosure. The voltage selection circuit 2000 is a 3-input version of the circuit 1500 for selecting a voltage from the input voltage Vin1, Vin2, Vin3, and, in the present embodiment, configured to output the maximum of the three input voltages Vin1, Vin2, Vin3. For the third input voltage Vin3, the circuit 2000 comprises a diode 2002 comprising a transistor 2004; the current mirror 1006 further comprises a transistor 2006 and a resistive element 2008 (also labelled R4). The third input voltage Vin3 is coupled to the output terminal via a power switch 2009 comprising two transistors 2010a, 2010b. The power switch 1102 comprises two transistors 1108a, 1108b and the power switch 1104 comprises two transistors 1110a, 1110b.

In the present embodiment, each of the power switches 1102, 1104, 2009 is configured to receive two sensed voltages from the sensed voltages Vsen1, Vsen2, Vsen3. The selective coupling of each power switch is controlled by the two sensed voltages Vsen1, Vsen2, Vsen3 received by said power switch 1102, 1104, 2009. Each power switch comprises two transistors that each comprise a gate each transistor has its gate coupled to one of the two sensed voltages received by said power switch.

The circuit 2000 (and other alternative embodiments shown) can be generalised to implement Vout=max(Vin1, Vin2, . . . , VinN) without needing to cascade trees of 2-input maximum selector circuits. For the power switches, a N-input selector requires a N×(N−1) pMOS switch array with (N−1) pMOS connected in series in each slice. For the general power switch slice coupling input VinX to the output, there are (N−1) series coupled pMOS power switches with their individual gates connected to Vsen1, Vsen2, . . . , Vsen(X−1), Vsen(X+1), . . . , VsenN, i.e. all Vsen signals except for VsenX control the pMOS switch gates (c.f. FIG. 20). Assume one input voltage, VinX, is higher than all other input voltages. Only VsenX will be high and all other Vsen voltages will be low, and since pMOS switches are open if their gate voltage is high, in this power switching method the highest input voltage effectively blocks all other input voltages from connecting to Vout by ensuring that at least one switch (the pMOS switch gated by VsenX) in their power switch slices connecting them to Vout is open.

Figure 21:
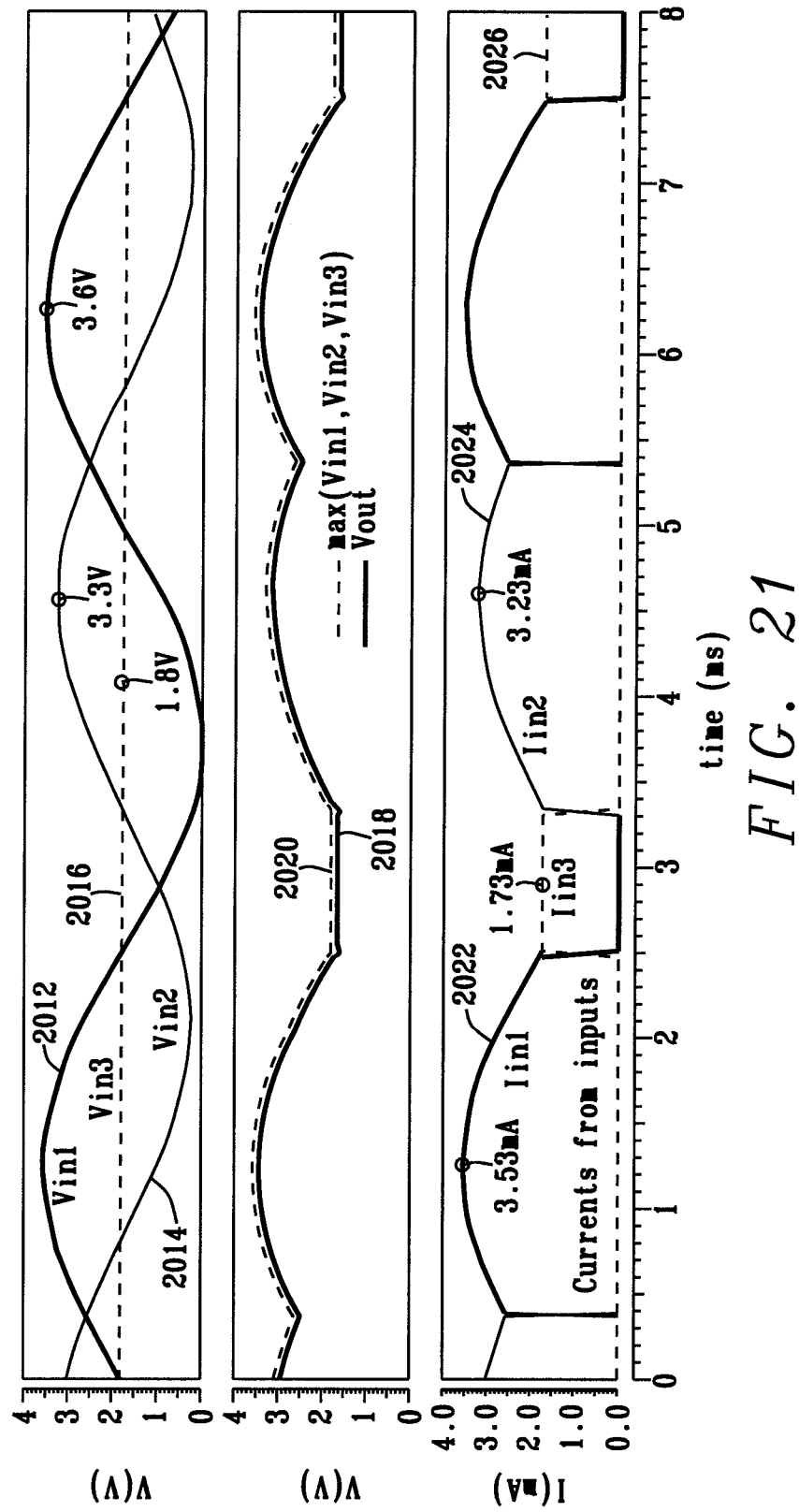
FIG. 21 is a graph showing results from a simulation of the circuit of FIG. 20.

FIG. 21 is a graph showing results from a simulation of the circuit 2000 using simulation parameters that are representative of a practical implementation of the circuit 2000.

FIG. 21 shows a trace 2012 of the input voltage Vin1 as it varies with time, a trace 2014 of the input voltage Vin2 as it varies with time, a trace 2016 of the input voltage Vin3 as it varies with time, a trace 2018 of the output voltage Vout as it varies with time, a trace 2020 of the maximum voltage Vmax as it varies with time, a trace 2022 of the current from the Vin1 input as it varies with time, a trace 2024 of the current from the Vin2 input as it varies with time, and a trace 2026 of the current from the Vin3 input as it varies with time.

The simulation used the following parameters:

R1=R3=R4=0.55 MΩ

R2=1 MΩ pMOS threshold voltage ≈0.64 V

Current mirror ratio of (transistor 1108)/(transistor 1208), (transistor 1104)/(transistor 1210) and (transistor 2004)/(transistor 2006)=3.

The same size of transistors as part of the power switches as used in the simulation of FIG. 8

1 kΩ load as used in the simulation of FIG. 8.

Comparing FIG. 21 simulation results given to FIG. 8 simulation results given, the new 3-input circuit exhibits much improved performance:

The input current traces show that the circuit 2000 switches quickly between which input drives the load as each becomes the largest voltage Vout now tracks ideal max(Vin1, Vin2, Vin3) very accurately.

There is no Vout droop problem whenever Vin1, Vin2 and Vin2 are roughly within a pMOS threshold voltage of each other.

As for the new 2-input maximum selector of the circuit 1500, there is no Vout tracking errors at input voltage crossovers.

As discussed for alternative embodiments for the 2-input circuit, the resistive loads of the circuit 2000 can be replaced with alternatives, such as current sources, MOSFETs operating in triode region to approximate resistors etc.

All sense/gate-drive MOSFETS (i.e. all MOSFETs that are not power switches) can be replaced with different but similar devices such as PNP BJTs.

All circuits can be inverted via well-known pMOS-to-nMOS conversion methods to implement most-negative voltage selection circuits.

The pMOS maximum selector and gate drive diodes/mirrors could be implemented using PNP BJTs, JFETs etc.

One weakness of the circuit 2000 is that for N voltage inputs, the number of switches in the power switch array is N×(N−1). Each switch branch connecting one of the N voltage inputs to Vout requires (N−1) series connected switch devices, and if each switch has on-resistance RON then the total resistance between any selected input voltage and Vout becomes: RTOT=(N−1)×RON.

If RTOT must not exceed a certain maximum value, then as N increases the individual switch FETs must become (N−1) times wider so that their individual on resistances become RON/(N−1); this needs (N−1) times as much silicon area for each individual pMOS switch device. Given that the size of the power switch array is N×(N−1), if each FET must increase in size roughly proportional to N as N increases, then to maintain a low RTOT the size of the total power switch array area grows proportional to $N^3$. In integrated implementations keeping RTOT low will clearly demand excessive silicon area for the power switches even for low values of N. In discrete implementations, a large number of power FETs will be required on the bill-of-materials.

The circuit 2000 may be extended to determine the largest of N input voltages and then generate signals to drive the power switches. The selector circuit slice can be implemented using PNP BJTs etc instead of pMOSFETs. Any device that can form a "diode" for maximum voltage selection and also make that diode part of a current mirror to transmit information concerning which input voltage is largest to the power switch gate driver circuits is suitable. Various outputs loads are possible: true resistors, triode-mode FET resistor approximations, current mirrors/sources etc. Provided the loads allow the Vsen1, Vsen2, Vsen3 nodes to swing from near ground to the largest input voltage any load will work. High load impedance to give high gate driver gain is desirable for sharp transition between input voltages at crossover.

FIG. 22A is a schematic of a power switch array 2200 in accordance with a twentieth embodiment of the disclosure. The power switch array 2200 can function as an alternative to the switch array (provided by power switches 1102, 1104, 2009) as shown in FIG. 20. The power switch array 2200 resolves the issue of having a rapidly increasingly large number of transistors as N increases for N input voltages. To maintain a certain maximum resistance RTOT between any input and the output Vout, the silicon area required by power switch array 2200 grows proportional to N, not $N^3$ as is required by power switch array 2000.

Each power switch 1102, 1104, 2009 comprises an inverter 2202, 2204, 2206. It will be appreciated that the present power switch array 2200 is an advancement on the power switch arrangement presented in FIG. 14B for three input voltages rather than two.

FIG. 22B is a schematic illustrating three possible implementations for the inverter (static CMOS, nMOS RTL and nMOS pseudo-RTL). Each embodiment comprises at least one transistor 2208, 2210, and in one case a resistive element 2212 such as a resistor or a current source. The examples are given only for illustration and other known logic circuit families can be used, e.g. bipolar RTL.

FIG. 22A shows a 3-input example of one alternative power switch array design that can be generalised easily to N inputs and requires only single power switches to connect each input to Vout, thus needing power switch array silicon area that grows proportional to N to maintain low RTOT.

The pMOS power switch gates are driven by inverting logic gates powered from Vout (not the only choice; any voltage high enough to ensure that all power switches that must turn off can be turned-off is suitable, e.g. VMAXSEL node of the circuit 2000).

The inverter inputs are driven by the Vsen1, Vsen2, Vsen3 signals shown in FIG. 20.

Numerous well-known basic inverter circuits can be used here, see FIG. 22B for some examples (left to right: static CMOS, nMOS RTL, pseudo RTL). All that is required is that the inverter output voltage can swing close enough to ground to turn on a pMOS power switch and close enough to its supply voltage (=Vout) to ensure that those power FET switches that must be turned off can be turned off.

Complex logic functions can also be implemented in the switch drive logic, e.g. arbitration logic to select just one preferred input to connect to Vout if two input voltages are equal and the Vsen1, Vsen2, Vsen3 signals are requesting both be connected to Vout, or to implement break-before-make or make-before-break closing and opening of power switches etc.

Figure 23:
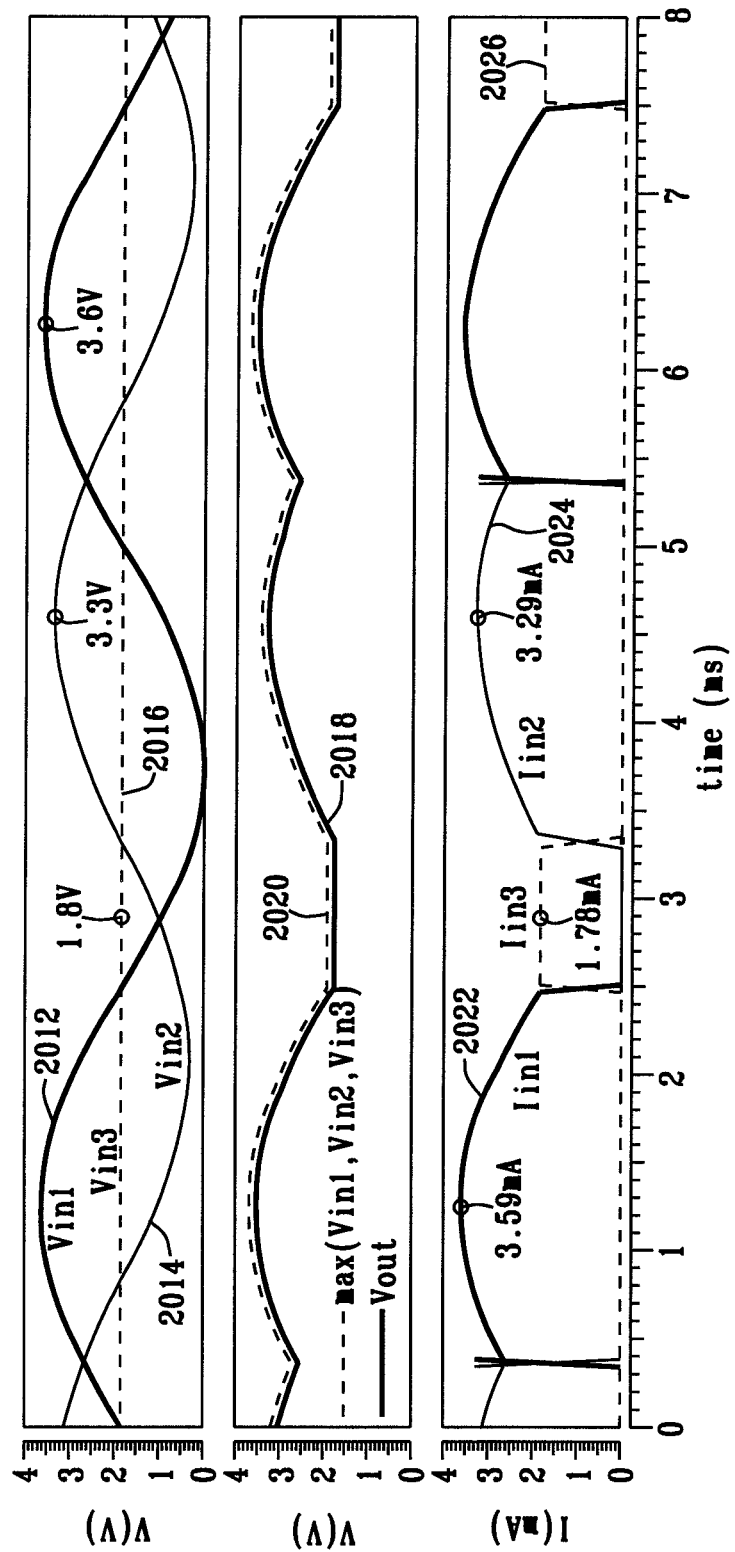
FIG. 23 is a graph showing results from a simulation of the circuit of FIG. 20 using the power switch array of FIG. 22A.

FIG. 23 is a graph showing results from a simulation of the circuit 2000 using the power switch array 2200 instead of the 6 FET array shown in FIG. 20 and using simulation parameters that are representative of a practical implementation of the circuit 2000.

Figure 22:
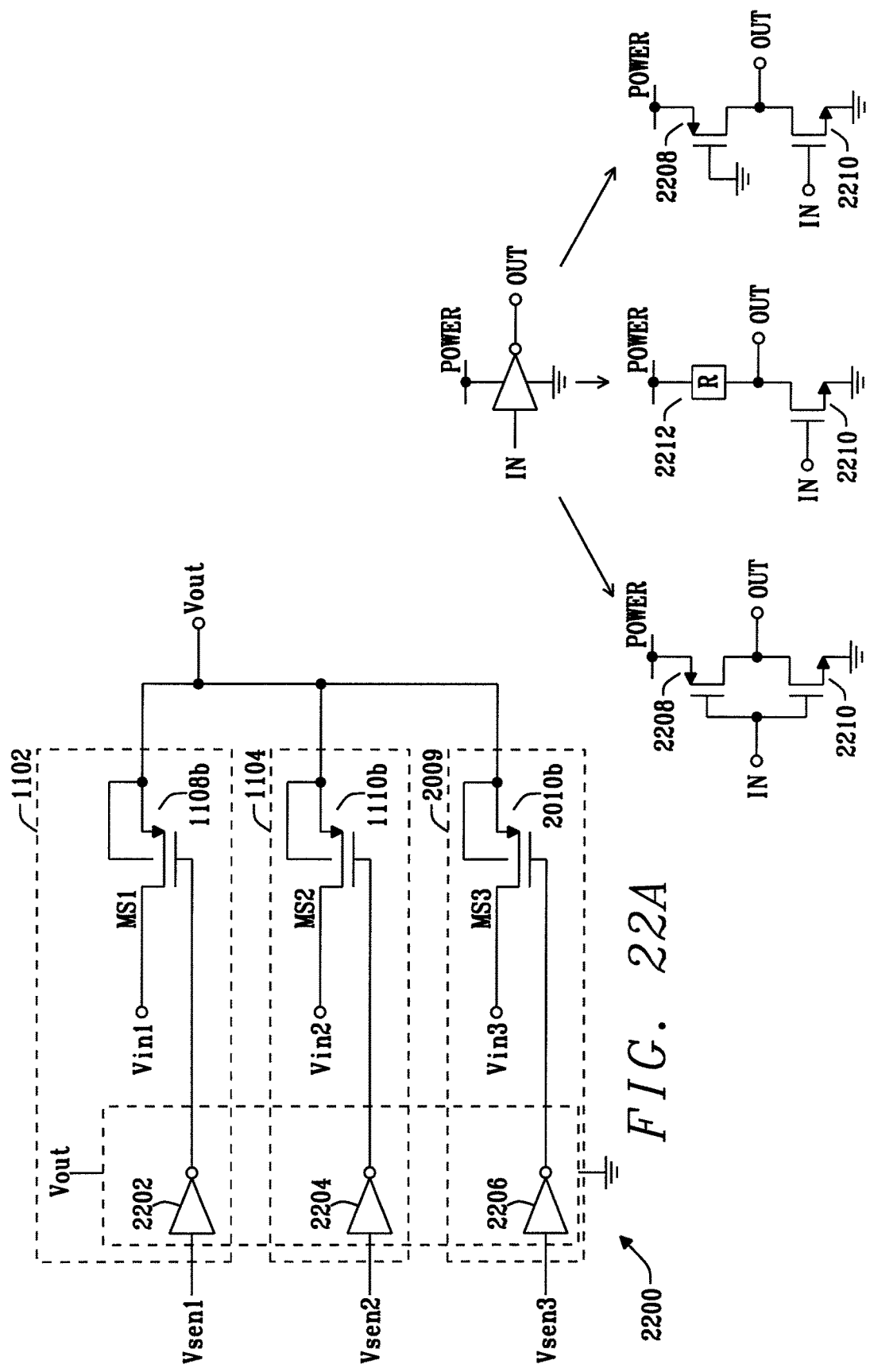
FIG. 22A is a schematic of a power switch array in accordance with a twentieth embodiment of the disclosure.
FIG. 22B is a schematic illustrating three possible implementations for an inverter of the power switch array of FIG. 22A.

In this example embodiment the inverters 2202, 2204, 2206 are pseudo-RTL type with nMOS input and long-channel grounded gate pMOS loads (FIG. 22 right-most inverter).

It can be observed that circuit performance is improved over FIG. 8. Specifically:

The input current waveforms show sharp transitions, showing that the maximum voltage selector switches quickly to the new largest input voltage.

Except at cross-over switching, only one input voltage provides load current at any time, i.e. there is no unwanted current leakage between the input sources through the power switches.

Vout tracks ideal max(Vin1, Vin2, Vin3) very accurately.

Figure 24:
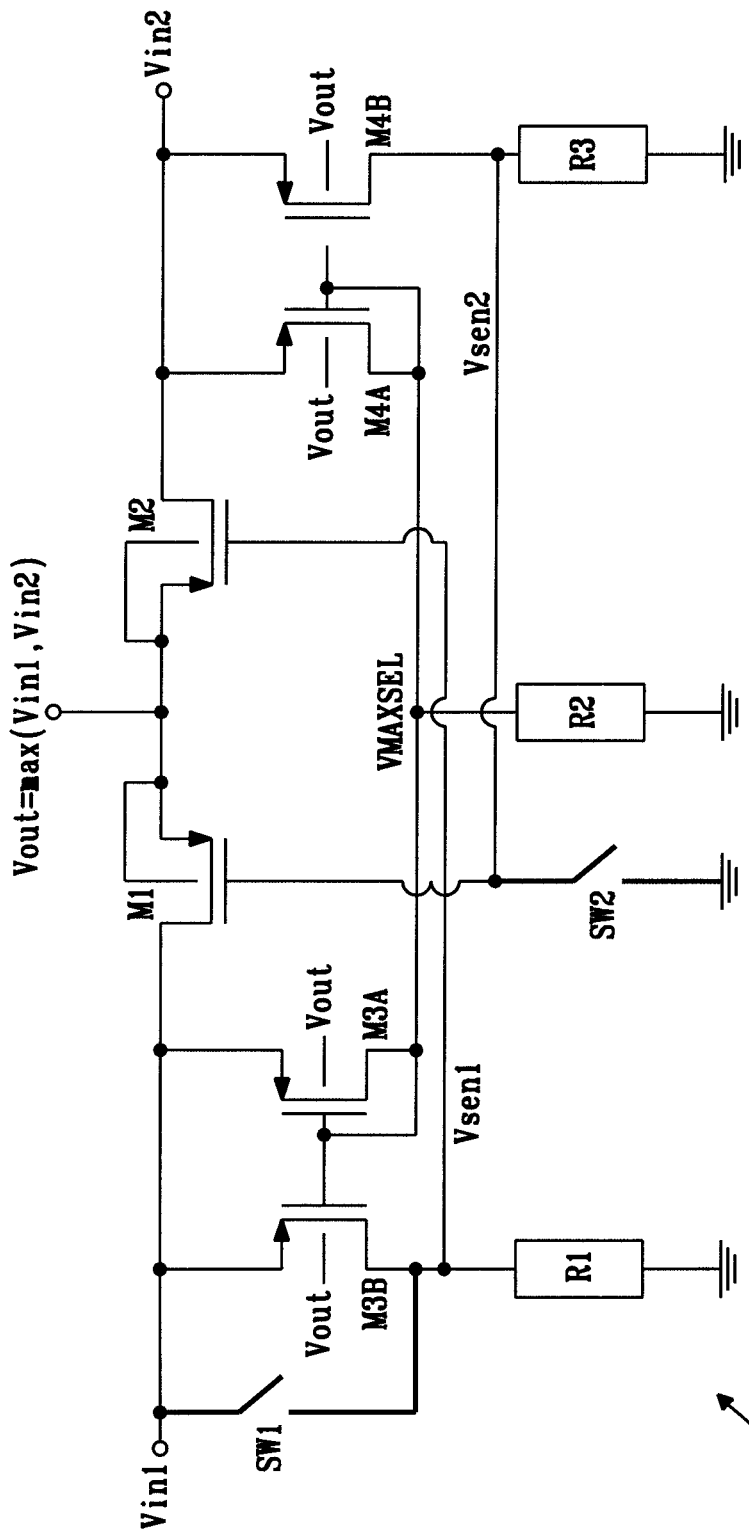
FIG. 24 is a schematic of a voltage selection circuit in accordance with a twenty first embodiment of the disclosure.

FIG. 24 is a schematic of a voltage selection circuit 2400 in accordance with a twenty first embodiment of the disclosure. The voltage selection circuit 2400 comprises switches SW1, SW2.

The inclusion of switches SW1, SW2 means that the circuit 2400 can be powered down and/or one specific input voltage Vin1, Vin2 can be set to drive Vout when the input voltages are equal (or approximately equal). In operation, when switches SW1 and SW2 close, M1 conducts and M2 is cut-off, so Vout is powered only from Vin1 when Vin1=Vin2 (otherwise the circuit would drive Vout via both M1 and M2). Such behaviour could be desirable if, say, Vin2 is a noisy voltage supply and it is desired not to short Vin2 to a quiet Vin1 in under Vin1=Vin2 conditions. Switch SW1 could be a pMOS device like M3B and switch SW2 could be a nMOS device. A comparator may be used to monitor the differential between Vin1, Vin2 and control the switches SW1, SW2.

Figure 25A:
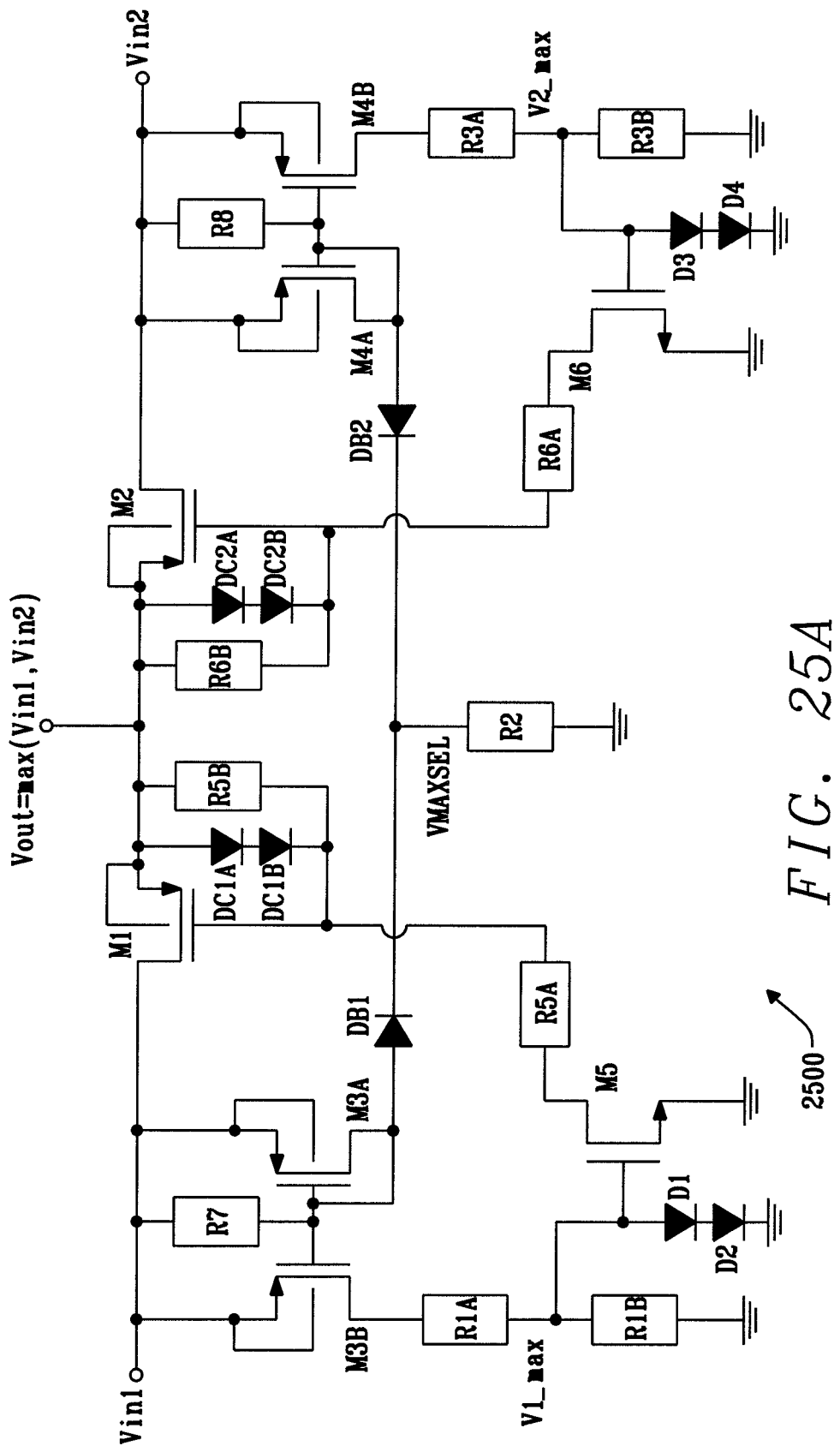
FIG. 25A is a schematic of a voltage selection circuit in accordance with a twenty second embodiment of the disclosure.

FIG. 25A is a schematic of a voltage selection circuit 2500 in accordance with a twenty second embodiment of the disclosure, and configured for high voltage (HV) operation, where HV implies the input voltages can exceed the safe operating voltages for the active devices (e.g. maximum gate-source voltage, VGS(max), permitted for MOSFETs without causing gate oxide failure, maximum drain-source voltage, VDS(max), permitted without triggering punch-through, junction breakdown or hot-carrier-induced degradation).

The voltage selection circuit 2500 comprises resistive elements R1A, R1B, R2, R3A, R3B, R5A, R5B, R6A, R6B, R7, R8/ transistors M1, M2, M3A, M3B, M4A, M4B, M5, M6; and diodes DC1A, DC1B, DC2A, DC2B, DB1, DB2, D1, D2, D3, D4.

All MOSFETs in the present embodiment are of types tolerant of high drain-source voltages, e.g. LDMOS, DMOS, VMOS.

Blocking diodes DB1 and DB2 prevent excessive reverse (accumulation mode) VGS across M3A/M3B and M4A/M4B whenever they are not conducting and the difference between voltages Vin1 and Vin2>VGS (max). Minimum input voltage for circuit operation will increase by a PN diode forward voltage as now either the (M3A and DB1) or (M4A and DB2) path must conduct for the maximum detector to operate. Optional bleed resistors R7 and R8 ensure M3B and M4B do not conduct (VGS pulled to 0V) when DB1 and DB2 respectively are reverse biased.

VGS(max) clamps DC1A/DC1B and DC2A/DC2B prevent excess VGS for M1 and M2 when their gates are being pulled toward ground by the maximum detector circuit (two diodes have been shown only to illustrate the general idea—any suitable clamp device can be used to get close to but not exceed VGS(max), e.g. MOS diodes, Zener clamps etc.)

M5 and M6 (with maximum VGS protection clamps at their gates) provide pull-down for the gates of M1 and M2 depending on which device the maximum voltage selector indicates should conduct. This avoids possible reverse conduction through M3B and M4B caused by the DC2A/DC2B or DC1A/DC1B clamps.

Figure 25B:
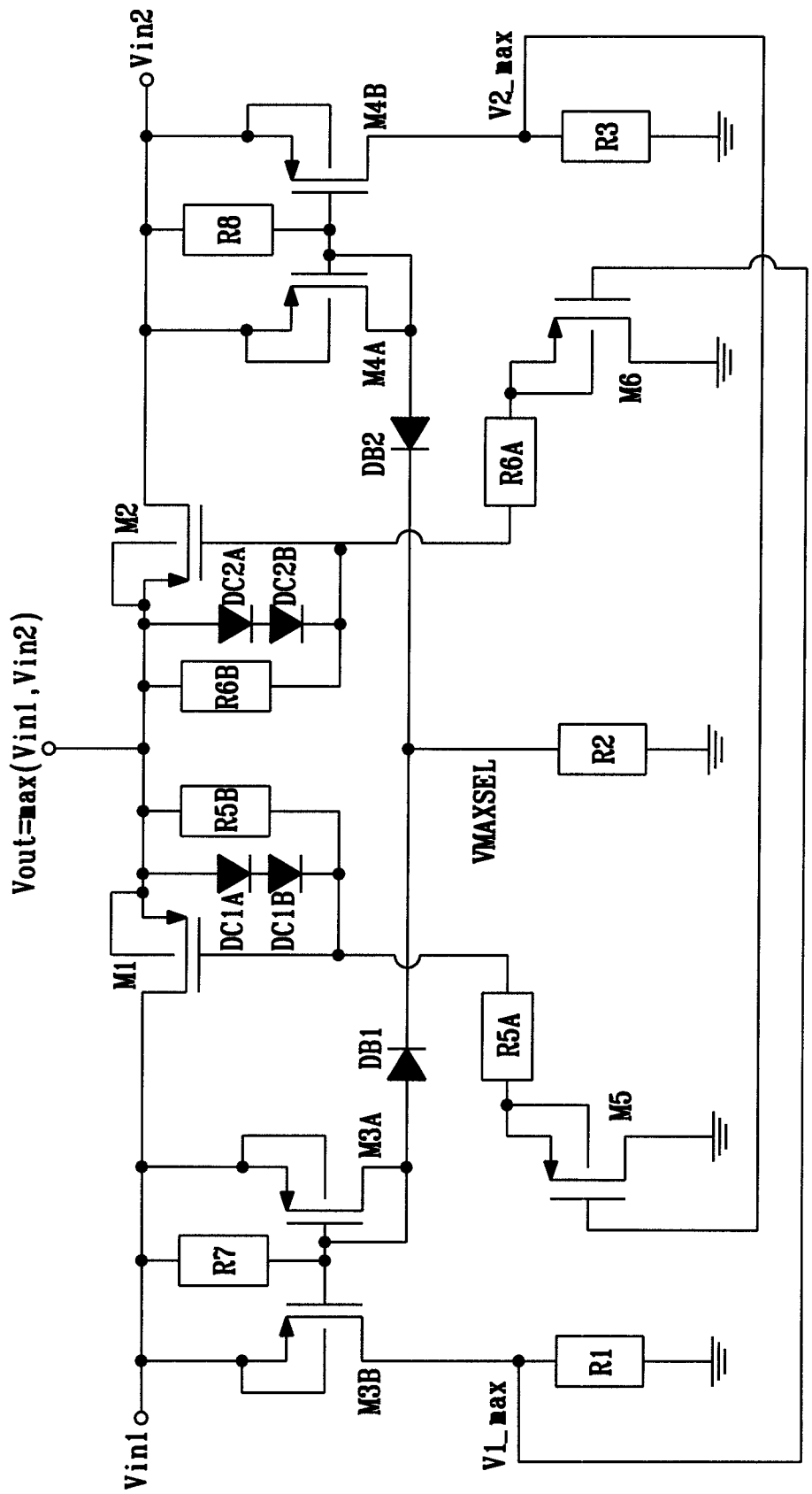
FIG. 25B is a schematic of a voltage selection circuit in accordance with a twenty third embodiment of the disclosure.

FIG. 25B is a schematic of a voltage selection circuit 2502 in accordance with a twenty third embodiment of the disclosure, and configured for high voltage (HV) operation.

It will be appreciated that the circuits 2500, 2502 may be modified to function with three or more input voltages, in accordance with the understanding of the skilled person.

Figure 26A:
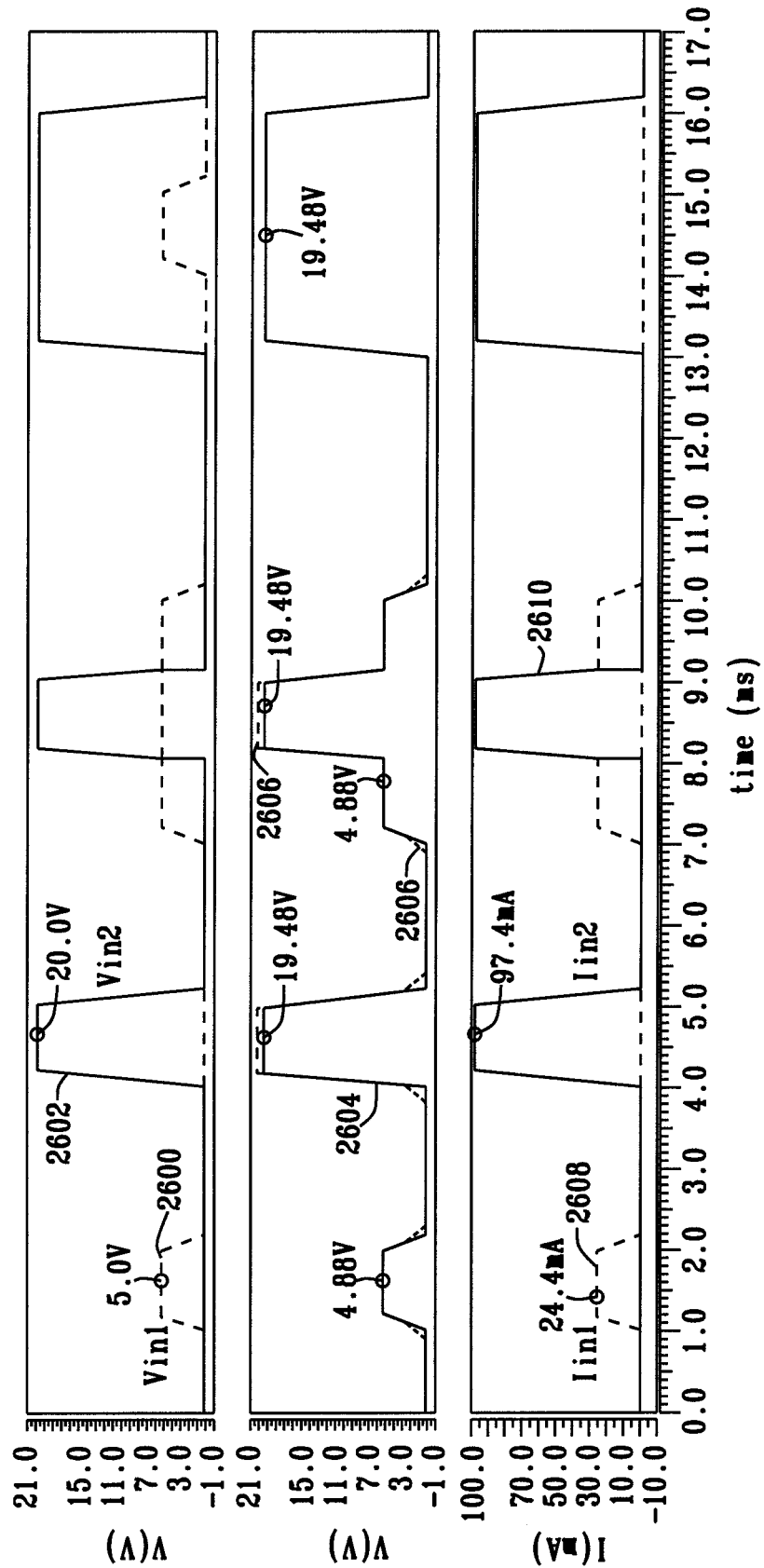
FIG. 26A is a graph showing results from a simulation of the circuit of FIG. 25A.

FIG. 26A is a graph showing results from a simulation of the circuit 2500 using simulation parameters that are representative of a practical implementation of the circuit 2500. The results show functionally correct operation with input voltages up to 20 V. No device maximum voltage ratings are exceeded at any time.

FIG. 26A shows a trace 2600 of the input voltage Vin1 as it varies with time, a trace 2602 of the input voltage Vin2 as it varies with time, a trace 2604 of the output voltage Vout as it varies with time, a trace 2606 of the maximum voltage Vmax as it varies with time, a trace 2608 of the input current Iin1 as it varies with time, and a trace 2610 of the input current Iin2 as it varies with time.

Figure 26B:
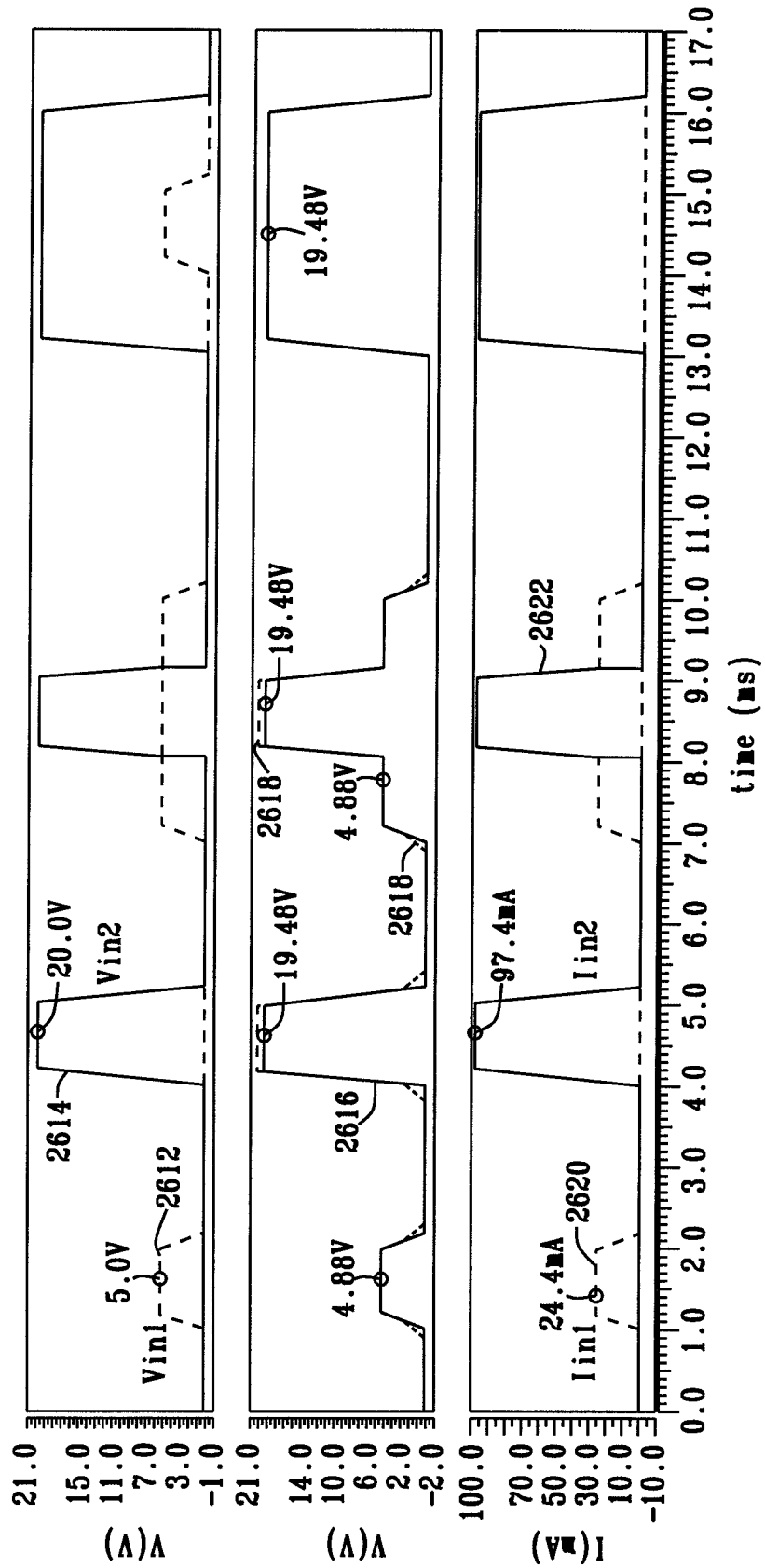
FIG. 26B is a graph showing results from a simulation of the circuit of FIG. 26B.

FIG. 26B is a graph showing results from a simulation of the circuit 2502 using simulation parameters that are representative of a practical implementation of the circuit 2502. The results show functionally correct operation with input voltages up to 20 V. Again, correct circuit function is demonstrated (Vout=max(Vin1, Vin2)) and no device overvoltages occur.

FIG. 26B shows a trace 2612 of the input voltage Vin1 as it varies with time, a trace 2614 of the input voltage Vin2 as it varies with time, a trace 2616 of the output voltage Vout as it varies with time, a trace 2618 of the maximum voltage Vmax as it varies with time, a trace 2620 of the input current Iin1 as it varies with time, and a trace 2622 of the input current Iin2 as it varies with time.

It will be appreciated that variations on the above circuits are possible in accordance with the understanding of the skilled person. For example, in FIG. 25A R1B and the M5 gate clamp diodes, and R3B and the M6 gate clamps diodes could each be replaced by diode connected nMOS devices, which would provide the same circuit function.

Figure 27:
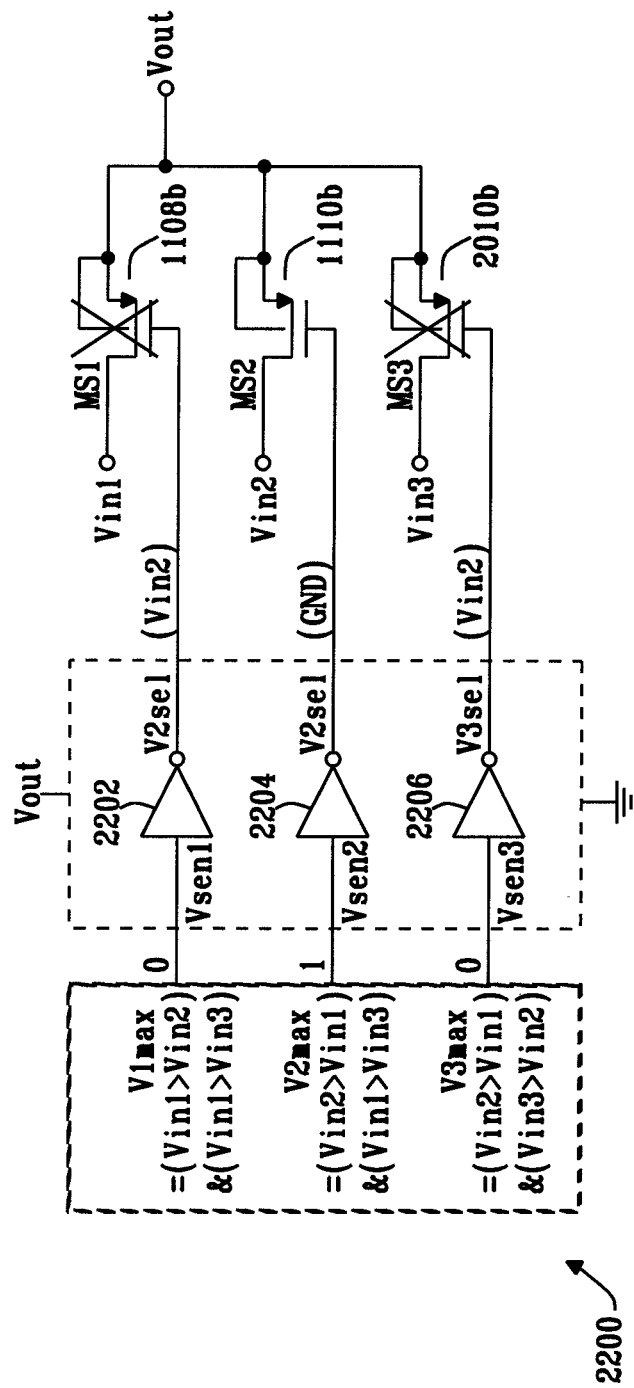
FIG. 27 is a further schematic of the power switch array as shown in FIG. 22.

FIG. 27 is a further schematic of the power switch array 2200 as shown in FIG. 22, and illustrating the operation of the power switch array 2200. In operation, the power switch array 2200 may be viewed as providing a "winner take all approach".

In summary, the operation of the power switch array 2200 may be described as follows:
  Consider the input voltages Vin1, Vin2, Vin3
  Determine which input voltage Vin1, Vin2, Vin3 is the largest
  Close only the switch connecting the largest input voltage Vin1, Vin2, Vin3 to provide the output voltage Vout.

In the example shown in FIG. 27, Vin2 is the largest voltage so only the power FET MS2 conducts.

In the embodiments discussed previously, The current sensor 1006 functions to determine which of Vin1, Vin2, Vin3 is greatest, as discussed previously, and converts this information to gate drive voltages suitable for controlling MS1, MS2, MS3.

Figure 28:
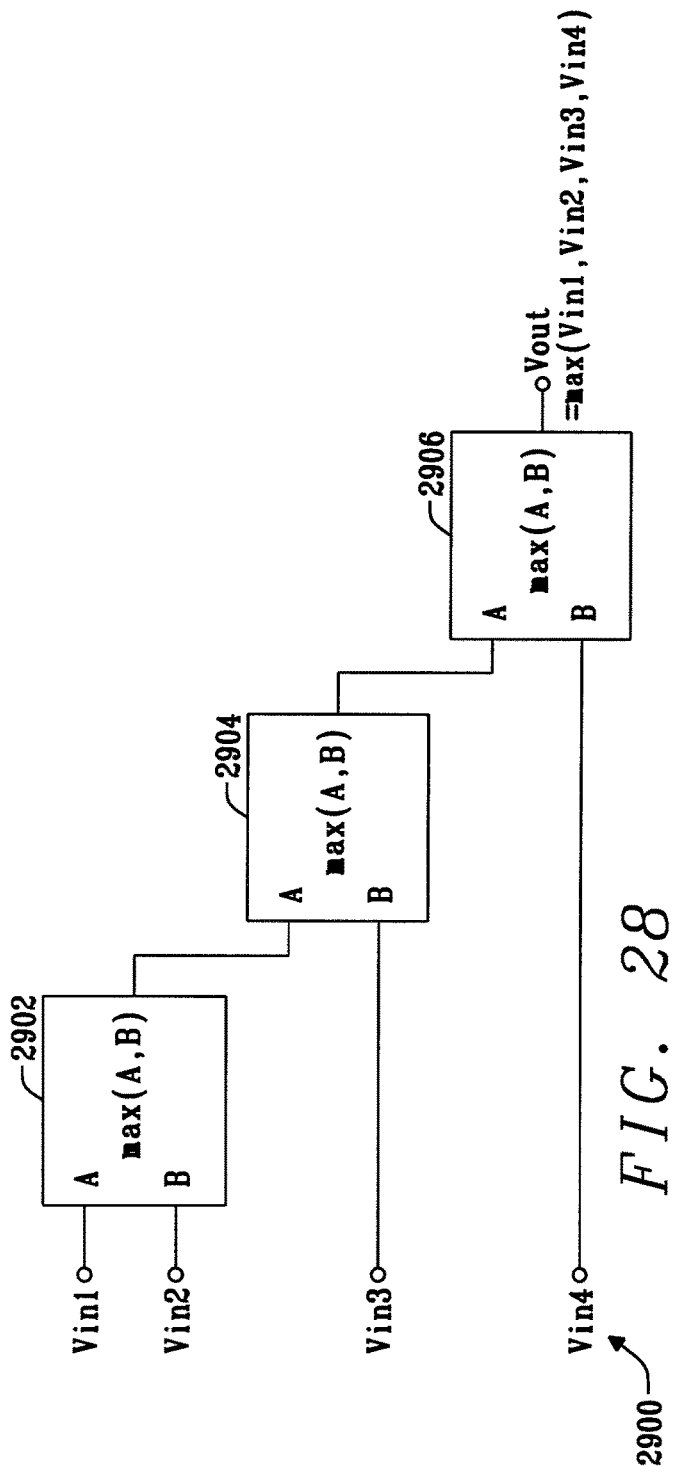
FIG. 28 is a schematic of an additional cascaded maximum voltage selector circuit.

FIG. 28 is a schematic of a cascaded maximum voltage selector circuit 2900 for outputting the highest voltage of 4 input voltages, and comprising two 3 maximum input voltage selector circuits 2902, 2904, 2906, and in accordance with an embodiment of the disclosure.

Figure 29:
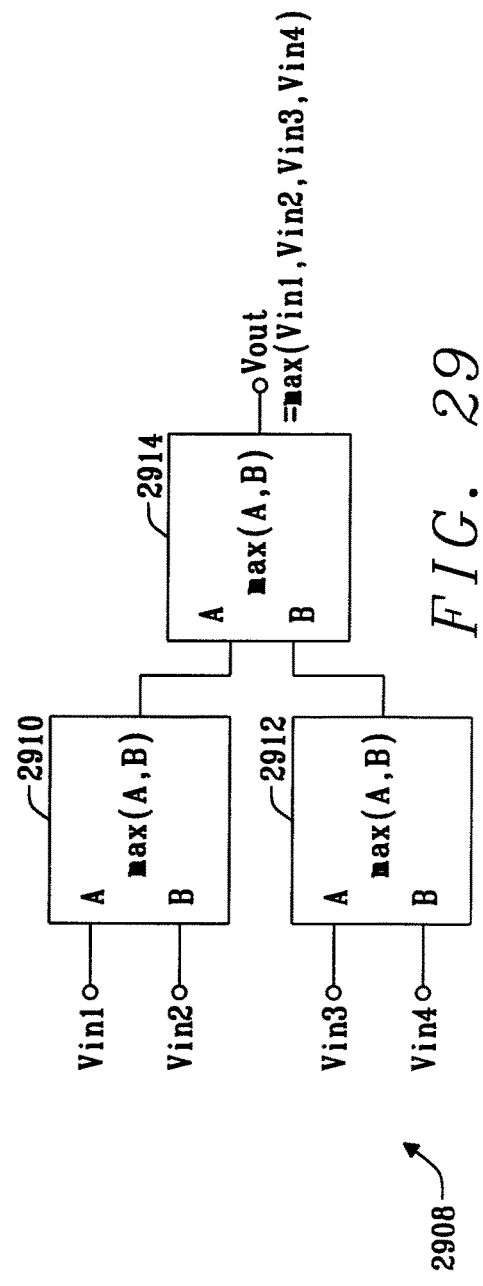
FIG. 29 is a schematic of a further cascaded maximum voltage selector circuit.

FIG. 29 is a schematic of a cascaded maximum voltage selector circuit 2908 for outputting the highest voltage of 4 input voltages, and comprising two 3 maximum input voltage selector circuits 2910, 2912, 2914, and in accordance with an embodiment of the disclosure.

Figure 30:
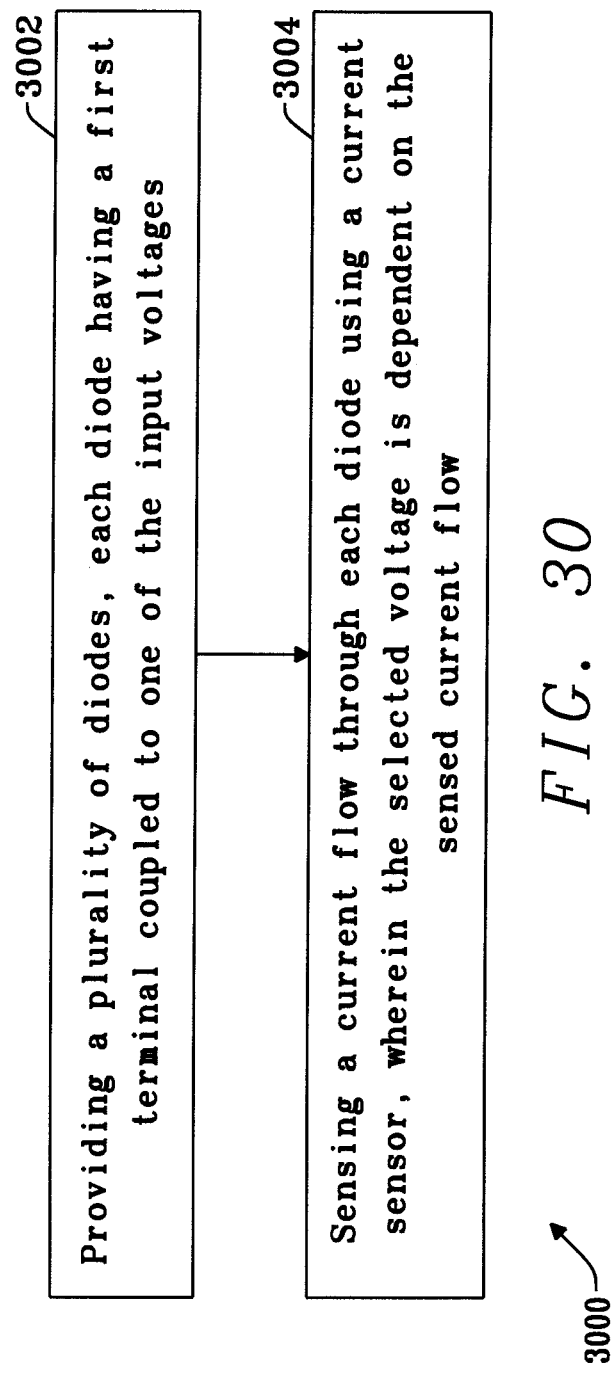
FIG. 30 is a flow chart of a method of selecting a voltage from a plurality of input voltages in accordance with a twenty fourth embodiment of the present disclosure.

FIG. 30 is a flow chart of a method 3000 of selecting a voltage from a plurality of input voltages in accordance with a twenty fourth embodiment of the present disclosure. The method 3000 comprising providing a plurality of diodes, each diode having a first terminal coupled to one of the input voltages at a step 3002, and sensing a current flow through each diode using a current sensor, wherein the selected voltage is dependent on the sensed current flow at a step 3004.

The circuits disclosed herein can provide more accurate output voltage switching/tracking to follow an input voltage, such as the maximum input voltage, when compared to known systems.

Common features between figures share common reference numerals and variables.

Various improvements and modifications may be made to the above without departing from the scope of the disclosure.

What is claimed is:

1. A voltage selection circuit for selecting a voltage from a plurality of input voltages comprising:
    a plurality of diodes, each diode having a first terminal coupled to one of the input voltages and each diode having a second terminal;
    a current sensor configured to sense a current flow through each diode, wherein the selected voltage is dependent on the sensed current flow; and
    a resistive element, wherein the second terminals of the plurality of diodes are coupled to a first node that is coupled to the resistive element.

2. The voltage selection circuit of claim 1, wherein each diode comprises a transistor.

3. The voltage selection circuit of claim 1 configured to select a maximum voltage or a minimum voltage from the plurality of input voltages.

4. The voltage selection circuit of claim 1, wherein:
    the first terminal of each of the diodes is a cathode terminal and the second terminal of each of the diodes is an anode terminal; or
    the first terminal of each of the diodes is an anode terminal and the second terminal of each of the diodes is a cathode terminal.

5. The voltage selection circuit of claim 1 comprising a plurality of power switches, wherein:
    each power switch is configured to selectively couple one of the input voltages to an output terminal based on the selected voltage.

6. The voltage selection circuit of claim 5, wherein each power switch comprises a power switch transistor.

7. The voltage selection circuit of claim 5, wherein the selected voltage is the input voltage that is to be selectively coupled to the output terminal using one of the power switches.

8. The voltage selection circuit of claim 1, wherein the current sensor is configured to sense the current flow through each of the diodes by mirroring the current flow through each of the diodes.

9. The voltage selection circuit of claim 8, wherein the current sensor comprises a plurality of current mirrors, wherein each current mirror is:
    i) associated with one of the diodes; and
    ii) configured to mirror the current flowing through its associated diode.

10. The voltage selection circuit of claim 9, wherein each of the current mirrors comprises a current mirror transistor.

11. The voltage selection circuit of claim 10, wherein the current sensor comprises a plurality of resistive elements, wherein each resistive element is:
    i) coupled to one of the current mirror transistors; and
    ii) configured to provide a sensed voltage that is dependent on the mirrored current provided to the resistive element.

12. The voltage selection circuit of claim 11 comprising a plurality of power switches, wherein:
    each power switch is configured to selectively couple one of the input voltages to an output terminal based on the selected voltage; and
    each of the power switches is configured to receive one or more of the sensed voltages, the selective coupling of each power switch being controlled by the one or more sensed voltages received by said power switch.

13. The voltage selection circuit of claim 12, wherein:
    each of the power switches is configured to receive one of the sensed voltages, the selective coupling of each power switch being controlled by the sensed voltage received by said power switch;
    each power switch comprises a transistor that comprises a gate; and
    the transistor has its gate coupled to the sensed voltage received by said power switch.

14. The voltage selection circuit of claim 13, wherein each power switch comprises a logic circuit and the transistor has its gate coupled to the sensed voltage received by said power switch via the logic circuit.

15. The voltage selection circuit of claim 14, wherein at least one of the logic circuits comprises an inverter.

16. The voltage selection circuit of claim 12, wherein:
    each of the power switches is configured to receive two or more of the sensed voltages, the selective coupling of each power switch being controlled by the two or more sensed voltages received by said power switch;
    each power switch comprises two or more transistors that each comprise a gate; and
    each transistor has its gate coupled to one of the two or more sensed voltages received by said power switch.

17. A method of selecting a voltage from a plurality of input voltages comprising:
    providing a plurality of diodes, each diode having a first terminal coupled to one of the input voltages and each diode having a second terminal;
    providing a resistive element, wherein the second terminals of the plurality of diodes are coupled to a first node that is coupled to the resistive element; and
    sensing a current flow through each diode using a current sensor, wherein the selected voltage is dependent on the sensed current flow.

* * * * *